United States Patent
Kim et al.

(10) Patent No.: US 10,490,752 B2
(45) Date of Patent: Nov. 26, 2019

(54) PLURALITY OF HOST MATERIALS AND ORGANIC ELECTROLUMINESCENT DEVICE COMPRISING THE SAME

(71) Applicant: Rohm and Haas Electronic Materials Korea Ltd., Cheonan (KR)

(72) Inventors: Bitnari Kim, Suwon (KR); Hee-Ryong Kang, Yongin (KR); Young-Mook Lim, Yongin (KR); Jin-Ri Hong, Bucheon (KR); Tae-Jin Lee, Seoul (KR); Sang-Hee Cho, Suwon (KR)

(73) Assignee: Rohm and Haas Electronic Materials Korea Ltd., Seoul (KR)

( * ) Notice: Subject to any disclaimer, the term of this patent is extended or adjusted under 35 U.S.C. 154(b) by 161 days.

(21) Appl. No.: 15/735,972

(22) PCT Filed: Apr. 25, 2016

(86) PCT No.: PCT/KR2016/004296
§ 371 (c)(1),
(2) Date: Dec. 13, 2017

(87) PCT Pub. No.: WO2016/204394
PCT Pub. Date: Dec. 22, 2016

(65) Prior Publication Data
US 2018/0182973 A1    Jun. 28, 2018

(30) Foreign Application Priority Data

Jun. 18, 2015  (KR) .................. 10-2015-0086367
Apr. 19, 2016  (KR) .................. 10-2016-0047459

(51) Int. Cl.
*H01L 51/50* (2006.01)
*H01L 51/00* (2006.01)
*C09K 11/06* (2006.01)

(52) U.S. Cl.
CPC .......... *H01L 51/0061* (2013.01); *C09K 11/06* (2013.01); *H01L 51/0052* (2013.01); *H01L 51/0059* (2013.01); *H01L 51/0067* (2013.01); *H01L 51/0071* (2013.01); *H01L 51/0072* (2013.01); *C09K 2211/1007* (2013.01); *C09K 2211/1011* (2013.01); *C09K 2211/1029* (2013.01); *C09K 2211/1033* (2013.01); *C09K 2211/1037* (2013.01); *C09K 2211/1044* (2013.01); *C09K 2211/1059* (2013.01); *C09K 2211/1088* (2013.01); *C09K 2211/1092* (2013.01); *H01L 51/0085* (2013.01); *H01L 51/5016* (2013.01); *H01L 2251/5384* (2013.01)

(58) Field of Classification Search
None
See application file for complete search history.

(56) References Cited

U.S. PATENT DOCUMENTS

| 8,846,215 | B2 | 9/2014 | Chun et al. | |
|---|---|---|---|---|
| 2003/0186077 | A1* | 10/2003 | Chen | C07D 209/80 428/690 |
| 2014/0100367 | A1 | 4/2014 | Yoon et al. | |
| 2014/0374722 | A1* | 12/2014 | Kim | C07D 209/08 257/40 |
| 2017/0162813 | A1 | 6/2017 | Lee et al. | |
| 2017/0207396 | A1 | 7/2017 | Park et al. | |

FOREIGN PATENT DOCUMENTS

| KR | 10-2015-0004099 | 1/2015 |
|---|---|---|
| WO | 2014196805 A1 | 12/2014 |

OTHER PUBLICATIONS

Supplementary European Search Report for application No. 16811807.3; dated Apr. 25, 2016.

* cited by examiner

*Primary Examiner* — Gregory D Clark
(74) *Attorney, Agent, or Firm* — S. Matthew Cairns

(57) ABSTRACT

The present invention relates to an organic electroluminescent device comprising at least one light-emitting layer disposed between an anode and a cathode, wherein the light-emitting layer comprises a host and a phosphorescent dopant, wherein the host comprises a plurality of host compounds, wherein at least a first host compound of the plurality of host compounds has an amine-carbazole structure substituted with naphthyl-phenyl and aryl (Formula 1), and a second host compound has a di-C-benzocarbazole structure comprising nitrogen-containing heteroaryl (Formula 2). By using the plurality of host compounds of the present disclosure, the organic electroluminescent device may have long lifespan while maintaining high efficiency at high luminance compared to the conventional organic electroluminescent device using a sole host compound.

7 Claims, No Drawings

PLURALITY OF HOST MATERIALS AND ORGANIC ELECTROLUMINESCENT DEVICE COMPRISING THE SAME

TECHNICAL FIELD

The present disclosure relates to a plurality of host materials and organic electroluminescent device comprising the same.

BACKGROUND ART

An electroluminescent (EL) device is a self-light-emitting device which has advantages in that it provides a wider viewing angle, a greater contrast ratio, and a faster response time. An organic EL device was first developed by Eastman Kodak, by using small aromatic diamine molecules and aluminum complexes as materials to form a light-emitting layer [Appl. Phys. Lett. 51, 913, 1987].

In an organic electroluminescent device (OLED), electricity is applied to an organic light-emitting material which converts electric energy to light. Generally, OLED has a structure comprising an anode, a cathode, and an organic layer disposed between the two electrodes. The organic layer of OLED may comprise a hole injection layer, a hole transport layer, an electron blocking layer, a light-emitting layer (comprising a host and dopant materials), an electron buffering layer, a hole blocking layer, an electron transport layer, an electron injection layer, etc. A material for preparing the organic layer can be classified according to its function, as a hole injection material, a hole transport material, an electron blocking material, a light-emitting material, an electron buffering material, a hole blocking material, an electron transport material, an electron injection material, etc. Holes and electrons are injected from an anode and a cathode, respectively, to the light-emitting layer by applying electricity to OLED; excitons having high energy are formed by recombinations of the holes and the electrons, which make organic light-emitting compounds be in an excited state, and the excited state of the light-emitting compound return to a ground state, which converts energy into light, and results in light-emission.

The most important factor determining luminous efficiency in OLED is a light-emitting material. The light-emitting material needs to have high quantum efficiency, high electron mobility, and high hole mobility. Furthermore, the light-emitting layer formed by the light-emitting material needs to be uniform and stable. According to colors visualized by light-emission, the light-emitting material can be classified as a blue-, green-, or red-emitting material, and a yellow- or orange-emitting material can be additionally included therein. Furthermore, the light-emitting material can be classified according to its function, as a host material and a dopant material. Recently, the development of OLED providing high efficiency and long lifespan is urgent. In particular, considering EL requirements for middle or large-sized OLED panels, materials showing better performances than conventional ones must be urgently developed. In order to achieve the development, a host material, which plays a role as a solvent in a solid state and an energy carrier, should have high purity, and an appropriate molecular weight for being deposited in vacuum. In addition, a host material should have high glass transition temperature and high thermal decomposition temperature to ensure thermal stability; high electrochemical stability to have long lifespan; ease of preparation for amorphous thin film; and good adhesion to materials of adjacent layers. Furthermore, a host material should not move to an adjacent layer.

The light-emitting material can be prepared by combining a host with a dopant to improve color purity, luminous efficiency, and stability. Generally, a device showing good EL performances comprises a light-emitting layer prepared by doping a dopant to a host. The host material greatly influences the efficiency and lifespan of the EL device when using a host/dopant system, and thus its selection is important.

Meanwhile, Korean Patent No. 10-1405725 discloses an organic light-emitting device comprising an amine derivative substituted with an aryl group or a heteroaryl group as a host of a light-emitting layer, and further discloses some hosts capable of optionally being used as a host besides the amine derivative. However, the above publication does not suggest improving a luminous efficiency by combining hosts having specific structures compared to using a sole host compound.

In this regard, the present inventors have found that an improved efficiency could be achieved by using a plurality of host materials comprising an amine-carbazole derivative substituted with naphthyl-phenyl and aryl, and a di-C-benzocarbazole derivative as a host, compared to using a conventional sole host material.

DISCLOSURE OF THE INVENTION

Problems to be Solved

The objective of the present disclosure is to provide an organic electroluminescent device having high luminous efficiency and long lifespan.

Solution to Problems

The present inventors found that the above objective can be achieved by an organic electroluminescent device comprising at least one light-emitting layer disposed between an anode and a cathode, wherein the light-emitting layer comprises a host and a phosphorescent dopant, wherein the host comprises a plurality of host compounds, wherein at least a first host compound of the plurality of host compounds is represented by the following formula 1:

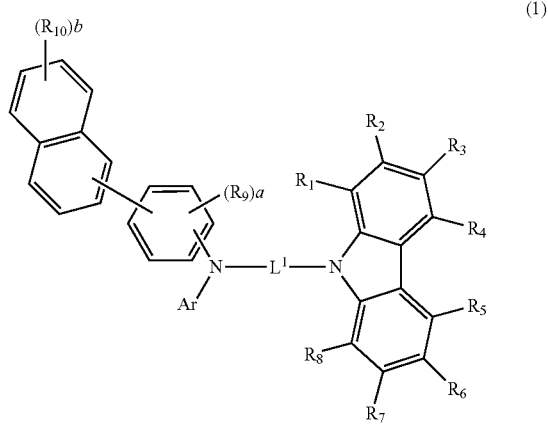

wherein $L_1$ represents a substituted or unsubstituted (C6-C30) arylene;

Ar represents a substituted or unsubstituted (C6-C60)aryl;

$R_1$ to $R_{10}$, each independently, represent hydrogen, deuterium, a halogen, a cyano, a substituted or unsubstituted (C1-C30)alkyl, a substituted or unsubstituted (C2-C30)alkenyl, a substituted or unsubstituted (C2-C30)alkynyl, a substituted or unsubstituted (C3-C30)cycloalkyl, a substituted or unsubstituted (C6-C60)aryl, a substituted or unsubstituted (3- to 30-membered)heteroaryl, a substituted or unsubstituted tri(C1-C30)alkylsilyl, a substituted or unsubstituted tri(C6-C30)arylsilyl, a substituted or unsubstituted di(C1-C30)alkyl(C6-C30)arylsilyl, or a substituted or unsubstituted mono- or di-(C6-C30)arylamino; or may be linked to an adjacent substituent(s) to form a substituted or unsubstituted mono- or polycyclic (C3-C30), alicyclic or aromatic ring, whose carbon atom(s) may be replaced with at least one heteroatom selected from nitrogen, oxygen, and sulfur;

the (hetero)aromatic ring formed by linking to an adjacent substituent(s) is selected from the group consisting of benzene, cyclopentadiene, indole, indene, benzofuran, and benzothiophene, and may be substituted with a (C1-C10)alkyl or a (C6-C15)aryl;

the heteroaryl contains at least one heteroatom selected from B, N, O, S, Si, and P;

a represents an integer of 1 to 4; b represents an integer of 1 to 7; where a and b, each independently, represent an integer of 2 or more, each of $R_9$ and $R_{10}$ may be the same or different;

and at least a second host compound of the plurality of host compounds is represented by the following formula 2:

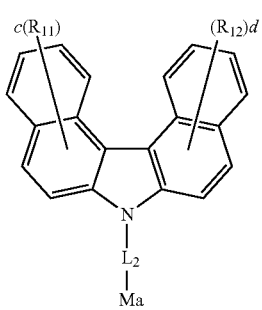

(2)

wherein $L_2$ represents a single bond, a substituted or unsubstituted nitrogen-containing (5- to 18-membered)heteroarylene, or a substituted or unsubstituted (C6-C30)arylene;

Ma represents a substituted or unsubstituted nitrogen-containing (5- to 30-membered)heteroaryl;

$R_{11}$ and $R_{12}$, each independently, represent hydrogen, deuterium, a halogen, a cyano, a carboxyl, a nitro, a hydroxyl, a substituted or unsubstituted (C1-C30)alkyl, a substituted or unsubstituted (C3-C30)cycloalkyl, a substituted or unsubstituted (C3-C30)cycloalkenyl, a substituted or unsubstituted (3- to 7-membered)heterocycloalkyl, a substituted or unsubstituted (C6-C30)aryl, a substituted or unsubstituted (3- to 30-membered)heteroaryl, $-NR_{13}R_{14}$, or $-SiR_{15}R_{16}R_{17}$;

$R_{13}$ to $R_{17}$, each independently, represent a substituted or unsubstituted (C6-C30)aryl, or a substituted or unsubstituted (3- to 30-membered)heteroaryl;

the heteroaryl(ene) and the heterocycloalkyl contain at least one heteroatom selected from B, N, O, S, Si, and P; and c and d represents an integer of 1 to 6; where c and d, each independently, represent an integer of 2 or more, each of $R_{11}$ and $R_{12}$ may be the same or different.

Effects of the Invention

According to the present disclosure, an organic electroluminescent device having high efficiency and long lifespan is provided. In addition, the organic electroluminescent device of the present disclosure can be used for the manufacture of a display device or a lighting device.

EMBODIMENTS OF THE INVENTION

Hereinafter, the present disclosure will be described in detail. However, the following description is intended to explain the present disclosure, and is not meant in any way to restrict the scope of the present disclosure.

The present inventors have found that an improved effect is provided when using a combination of a first host of an amine-carbazole derivative substituted with naphthyl-phenyl and aryl, and a second host of a di-C-benzocarbazole derivative as a host, compared to using a conventional host material in a light-emitting layer.

Specifically, the second host alone shows reduced efficiency as luminance gets higher (hereinafter, called "roll-off" characteristic), and deteriorated lifespan characteristic. However, when combining the second host with a first host of an amine-carbazole derivative substituted with naphthyl-phenyl and aryl, the roll-off characteristic is improved, and the lifespan characteristic is also greatly improved.

The reason to maintain high efficiency at high luminance is to meet the current display industry requiring increasingly high resolution. In the current trend of requiring a smaller pixel, a high resolution can be realized when maintaining high efficiency even at high luminance. Improved lifespan characteristic is achieved by comprising an amine substituted with a "naphthyl-phenyl" as a first host, compared to comprising an amine substituted with a naphthyl without a biphenyl or a phenyl.

In formula 1, Ar represents, preferably, a substituted or unsubstituted (C6-C20)aryl, more preferably, a substituted or unsubstituted phenyl, a substituted or unsubstituted biphenyl, a substituted or unsubstituted naphthylphenyl, or a substituted or unsubstituted fluorenyl, and even more preferably, an unsubstituted phenyl, an unsubstituted biphenyl, an unsubstituted naphthylphenyl, or a fluorenyl substituted with dimethyl.

In formula 1, $L_1$ represents, preferably, a substituted or unsubstituted (C6-C20)arylene; more preferably, a substituted or unsubstituted phenylene, a substituted or unsubstituted biphenylene, a substituted or unsubstituted naphthylene, a substituted or unsubstituted naphthylphenylene, a substituted or unsubstituted phenylnaphthylene, or a substituted or unsubstituted fluorenylene, and even more preferably, an unsubstituted phenylene, an unsubstituted biphenylene, an unsubstituted naphthylene, a fluorenylene substituted with dimethyl, an unsubstituted naphthylphenylene, or an unsubstituted phenylnaphthylene.

In formula 1, $R_1$ to $R_{10}$, preferably, each independently, represent hydrogen or may be linked to an adjacent substituent(s) to form a substituted or unsubstituted mono- or polycyclic (C3-C30) aromatic ring, whose carbon atom(s) may be replaced with at least one heteroatom selected from nitrogen, oxygen, and sulfur; wherein the substituted or unsubstituted mono- or polycyclic (C3-C30) aromatic ring may be an unsubstituted benzene ring, a cyclopentadiene ring substituted with dimethyl, an indene ring substituted with dimethyl, an unsubstituted benzothiophene ring, or an unsubstituted benzofuran ring.

In formula 2, Ma represents, preferably, a substituted or unsubstituted nitrogen-containing (5- to 20-membered)heteroaryl; more preferably, a substituted or unsubstituted triazinyl, a substituted or unsubstituted pyrimidinyl, a substituted or unsubstituted pyridyl, a substituted or unsubstituted quinazolinyl, a substituted or unsubstituted quinoxalinyl, a substituted or unsubstituted dibenzoquinoxalinyl, or a substituted or unsubstituted quinolyl; and even more preferably, a substituted triazinyl, a substituted pyrimidinyl, a substituted pyridyl, a substituted quinazolinyl, a substituted quinoxalinyl, an unsubstituted dibenzoquinoxalinyl, or a substituted quinolyl.

In formula 2, $L_2$ represents, preferably, a single bond, a substituted or unsubstituted nitrogen-containing (5- to 15-membered)heteroarylene, or a substituted or unsubstituted (C6-C18)arylene; more preferably, a single bond, a substituted or unsubstituted phenylene, a substituted or unsubstituted biphenylene, a substituted or unsubstituted naphthylene, a substituted or unsubstituted carbazolylene, or a substituted or unsubstituted pyridylene; and even more preferably, a single bond, a substituted phenylene, an unsubstituted biphenylene, an unsubstituted naphthylene, an unsubstituted carbazolylene, or an unsubstituted pyridylene;

In formula 2, $R_{11}$ and $R_{12}$, preferably, each independently, represent hydrogen or a substituted or unsubstituted (C6-C20)aryl; and more preferably, each independently, represent hydrogen, an unsubstituted phenyl, or an unsubstituted naphthyl.

Herein, "(C1-C30)alkyl" is meant to be a linear or branched alkyl having 1 to 30 carbon atoms constituting the chain, in which the number of carbon atoms is preferably 1 to 20, more preferably 1 to 10, and includes methyl, ethyl, n-propyl, isopropyl, n-butyl, isobutyl, tert-butyl, etc.; "(C2-C30)alkenyl" is meant to be a linear or branched alkenyl having 2 to 30 carbon atoms constituting the chain, in which the number of carbon atoms is preferably 2 to 20, more preferably 2 to 10, and includes vinyl, 1-propenyl, 2-propenyl, 1-butenyl, 2-butenyl, 3-butenyl, 2-methylbut-2-enyl, etc.; "(C2-C30)alkynyl" is meant to be a linear or branched alkynyl having 2 to 30 carbon atoms constituting the chain, in which the number of carbon atoms is preferably 2 to 20, more preferably 2 to 10, and includes ethynyl, 1-propynyl, 2-propynyl, 1-butynyl, 2-butynyl, 3-butynyl, 1-methylpent-2-ynyl, etc.; "(C3-C30)cycloalkyl" is a mono- or polycyclic hydrocarbon having 3 to 30 ring backbone carbon atoms, in which the number of carbon atoms is preferably 3 to 20, more preferably 3 to 7, and includes cyclopropyl, cyclobutyl, cyclopentyl, cyclohexyl, etc.; "(3- to 7-membered) heterocycloalkyl" is a cycloalkyl having 3 to 7, preferably 5 to 7, ring backbone atoms, including at least one heteroatom selected from B, N, O, S, Si, and P, preferably O, S, and N, and includes tetrahydrofuran, pyrrolidine, thiolan, tetrahydropyran, etc.; "(C6-C30)aryl(ene)" is a monocyclic or fused ring derived from an aromatic hydrocarbon having 6 to 30 ring backbone carbon atoms, in which the number of carbon atoms is preferably 6 to 20, more preferably 6 to 15, and includes phenyl, biphenyl, terphenyl, naphthyl, fluorenyl, phenanthrenyl, anthracenyl, indenyl, triphenylenyl, pyrenyl, tetracenyl, perylenyl, chrysenyl, naphthacenyl, fluoranthenyl, etc.; "(3- to 30-membered) heteroaryl(ene)" is an aryl having 3 to 30 ring backbone atoms, preferably 3 to 20 ring backbone atoms, and more preferably 3 to 15 ring backbone atoms, including at least one, preferably 1 to 4 heteroatoms selected from the group consisting of B, N, O, S, Si, and P; may be a monocyclic ring, or a fused ring condensed with at least one benzene ring; may be partially saturated; may be one formed by linking at least one heteroaryl or aryl group to a heteroaryl group via a single bond(s); and includes a monocyclic ring-type heteroaryl including furyl, thiophenyl, pyrrolyl, imidazolyl, pyrazolyl, thiazolyl, thiadiazolyl, isothiazolyl, isoxazolyl, oxazolyl, oxadiazolyl, triazinyl, tetrazinyl, triazolyl, tetrazolyl, furazanyl, pyridyl, pyrazinyl, pyrimidinyl, pyridazinyl, etc., and a fused ring-type heteroaryl including benzofuranyl, benzothiophenyl, isobenzofuranyl, dibenzofuranyl, dibenzothiophenyl, benzimidazolyl, benzothiazolyl, benzoisothiazolyl, benzoisoxazolyl, benzoxazolyl, isoindolyl, indolyl, indazolyl, benzothiadiazolyl, quinolyl, isoquinolyl, cinnolinyl, quinazolinyl, quinoxalinyl, carbazolyl, phenoxazinyl, phenanthridinyl, benzodioxolyl, etc.; "nitrogen-containing (5- to 18-membered) heteroaryl(ene)" indicates an aryl group having 5 to 18 ring backbone atoms, preferably 5 to 17 ring backbone atoms, more preferably 5 to 15 ring backbone atoms, containing at least one, preferably 1 to 4, nitrogen as the heteroatom, may be a monocyclic ring, or a fused ring condensed with at least one benzene ring; may be partially saturated; may be one formed by linking at least one heteroaryl or aryl group to a heteroaryl group via a single bond(s); and includes a monocyclic ring-type heteroaryl such as pyrrolyl, imidazolyl, pyrazolyl, triazinyl, tetrazinyl, triazolyl, tetrazolyl, pyridyl, pyrazinyl, pyrimidinyl, pyridazinyl, etc. and a fused ring-type heteroaryl such as benzimidazolyl, isoindolyl, indolyl, indazolyl, benzothiadiazolyl, quinolyl, isoquinolyl, cinnolinyl, quinazolinyl, quinoxalinyl, carbazolyl, phenanthridinyl, etc. Furthermore, "halogen" includes F, Cl, Br, and I.

Herein, "substituted" in the expression "substituted or unsubstituted" means that a hydrogen atom in a certain functional group is replaced with another atom or group, i.e. a substituent. The substituents of the substituted alkyl, the substituted alkenyl, the substituted alkynyl, the substituted cycloalkyl, the substituted cycloalkenyl, the substituted heterocycloalkyl, the substituted aryl(ene), the substituted heteroaryl(ene), the substituted trialkylsilyl, the substituted triarylsilyl, the substituted dialkylarylsilyl, the substituted mono- or di-arylamino, and the substituted mono- or polycyclic, alicyclic or aromatic ring in formulas 1 and 2, each independently, are at least one selected from the group consisting of deuterium; a halogen; a cyano; a carboxyl; a nitro; a hydroxyl; a (C1-C30)alkyl; a halo(C1-C30)alkyl; a (C2-C30)alkenyl; a (C2-C30)alkynyl; a (C1-C30)alkoxy; a (C1-C30)alkylthio; a (C3-C30)cycloalkyl; a (C3-C30)cycloalkenyl; a (3- to 7-membered)heterocycloalkyl; a (C6-C30)aryloxy; a (C6-C30)arylthio; a (3- to 30-membered) heteroaryl unsubstituted or substituted with a (C6-C30)aryl; a (C6-C30)aryl unsubstituted or substituted with a (3- to 30-membered)heteroaryl; a tri(C1-C30)alkylsilyl; a tri(C6-C30)arylsilyl; a di(C1-C30)alkyl(C6-C30)arylsilyl; a (C1-C30)alkyldi(C6-C30)arylsilyl; an amino; a mono- or di-(C1-C30)alkylamino; a mono- or di-(C6-C30)arylamino; a (C1-C30)alkyl(C6-C30)arylamino; a (C1-C30)alkylcarbonyl; a (C1-C30)alkoxycarbonyl; a (C6-C30)arylcarbonyl; a di(C6-C30)arylboronyl; a di(C1-C30)alkylboronyl; a (C1-C30)alkyl(C6-C30)arylboronyl; a (C6-C30)aryl(C1-C30)alkyl; and a (C1-C30)alkyl(C6-C30)aryl.

The first host compound of formula 1 may be selected from the group consisting of the following compounds, but is not limited thereto:
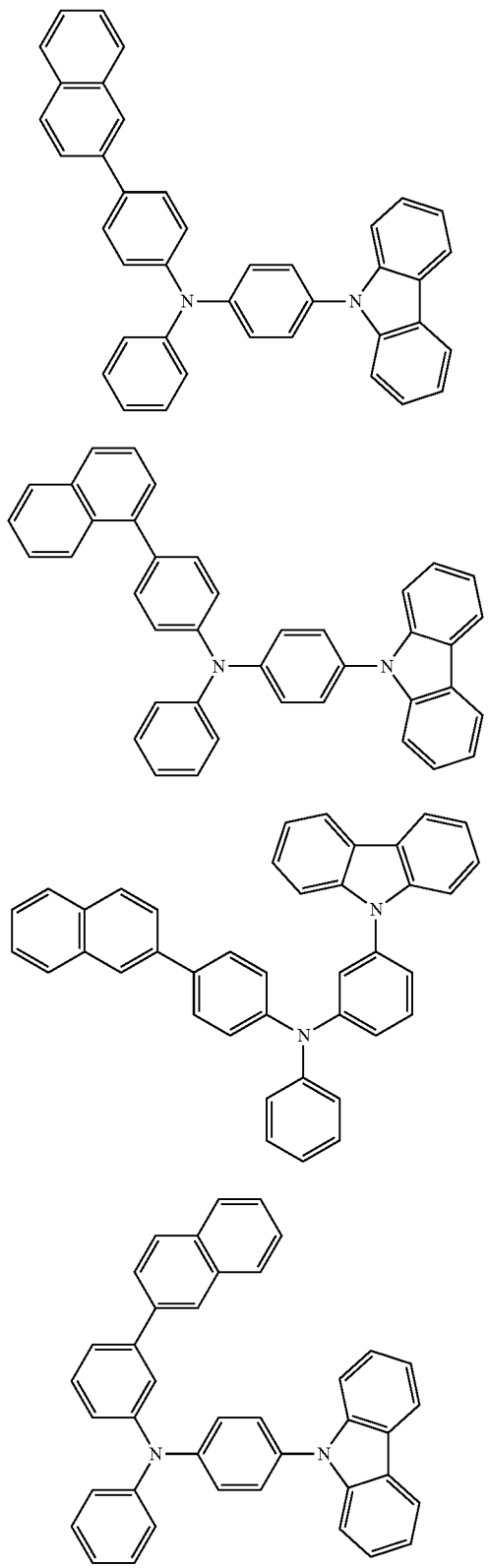
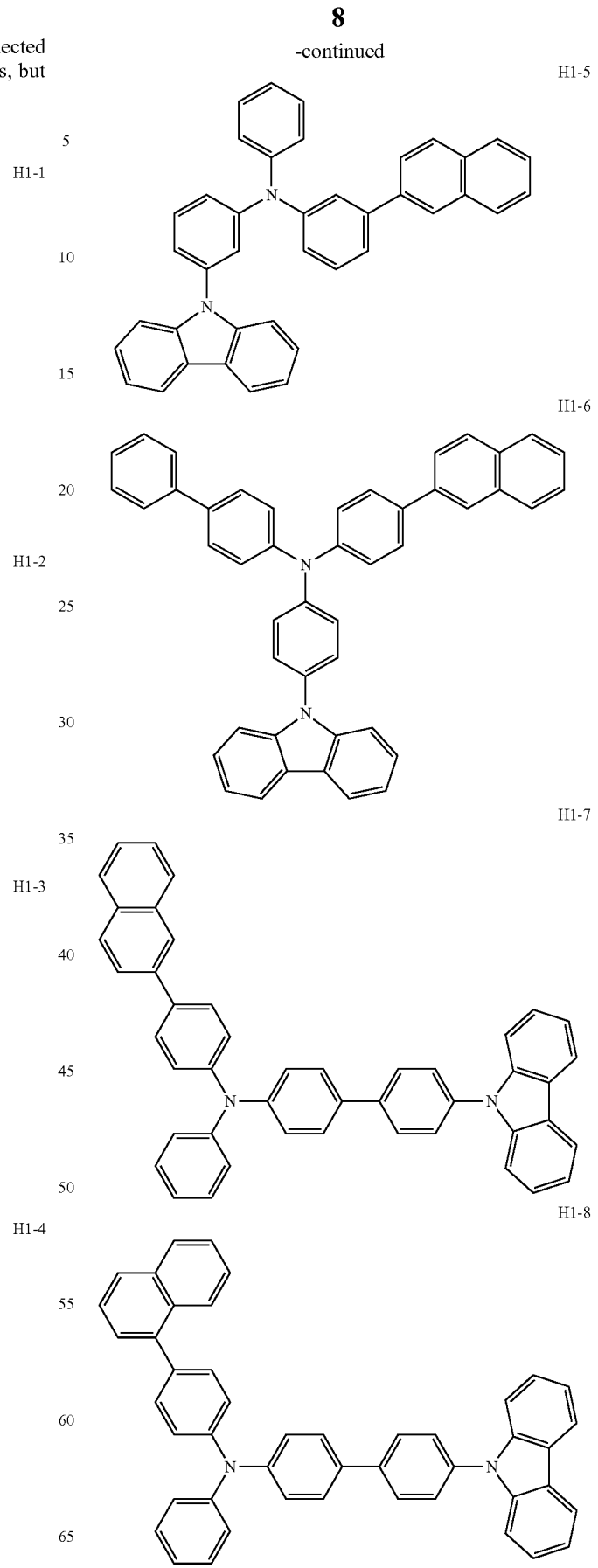

H1-9
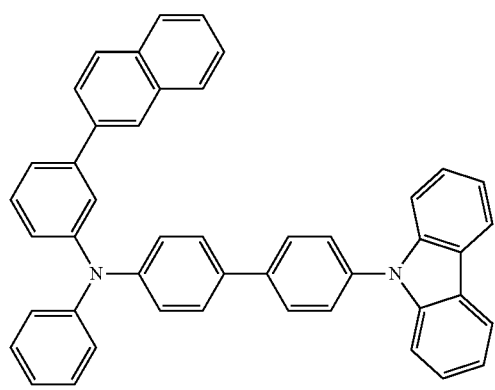
H1-12
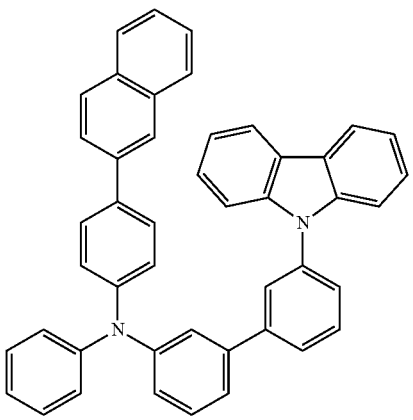
H1-10
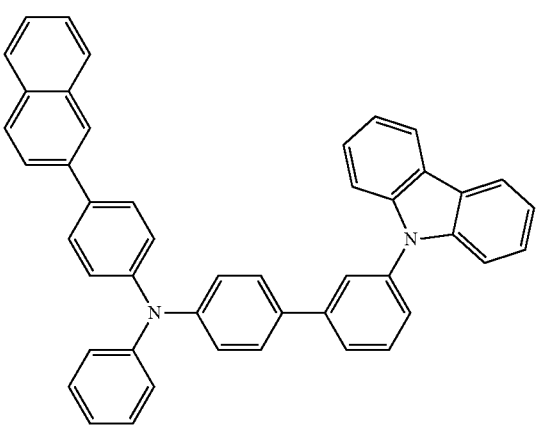
H1-13
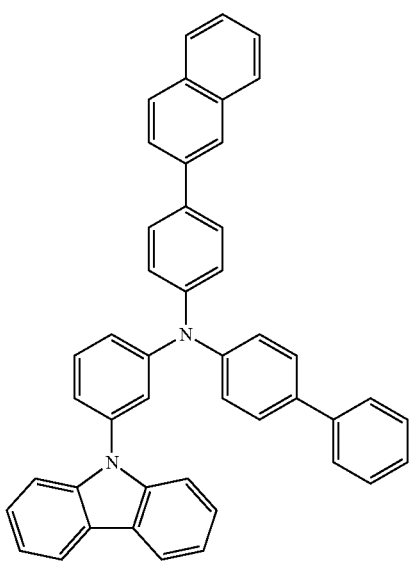
H1-11
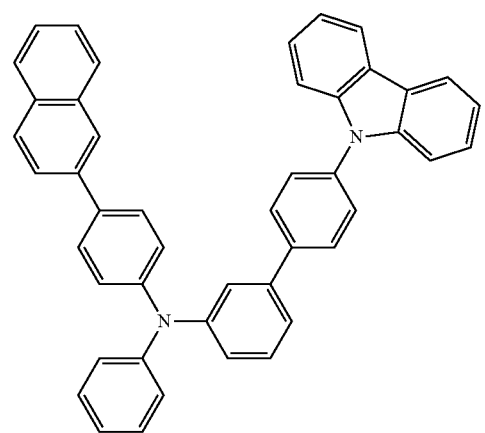
H1-14
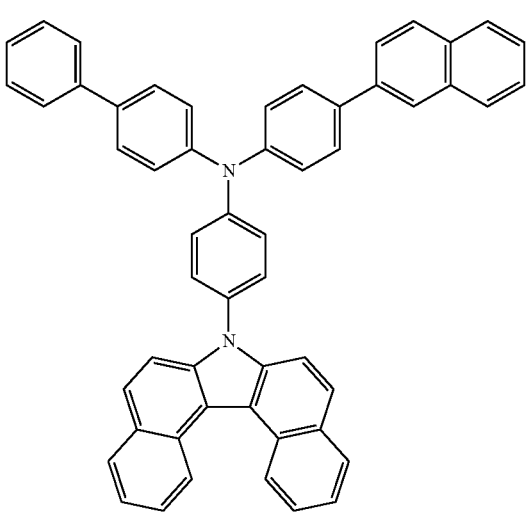

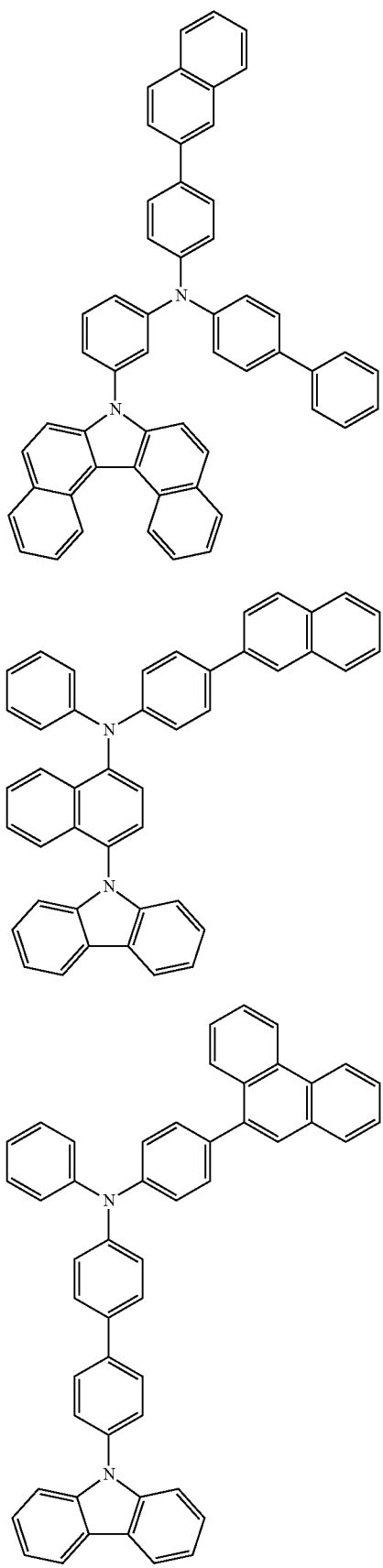
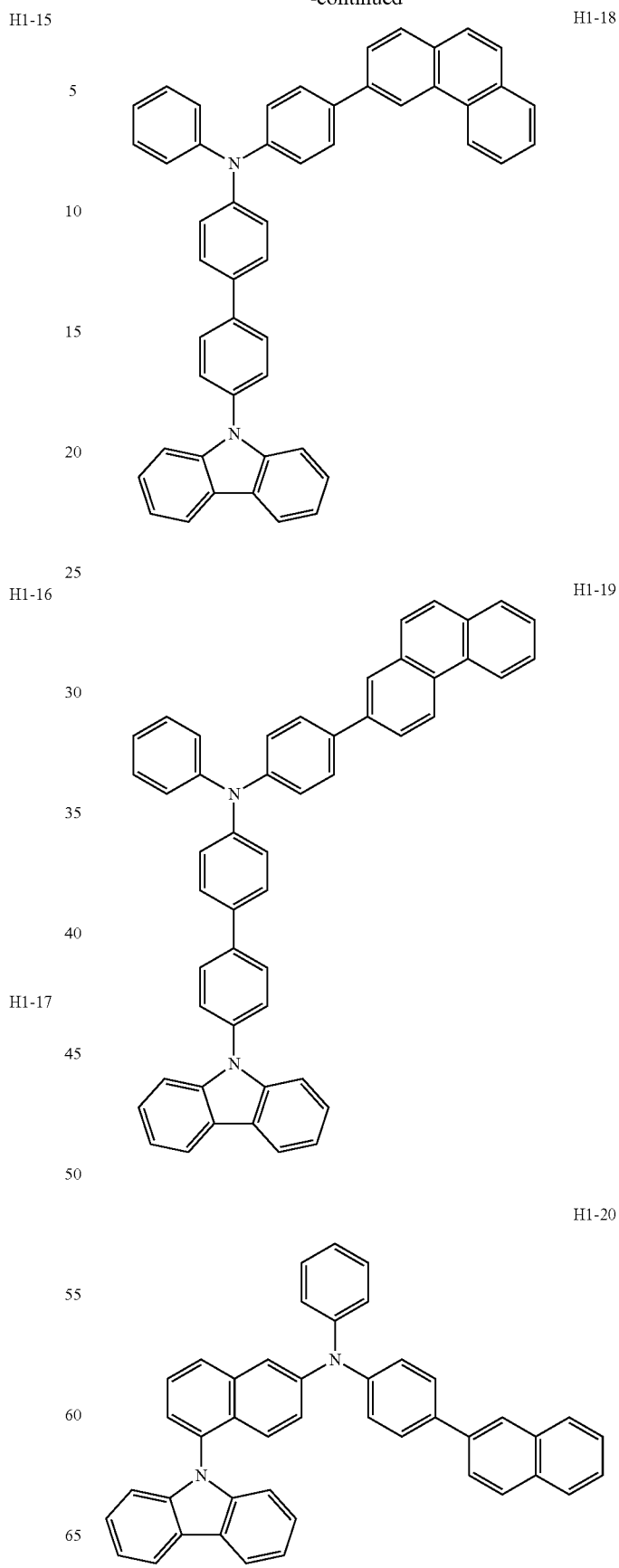

-continued
H1-21
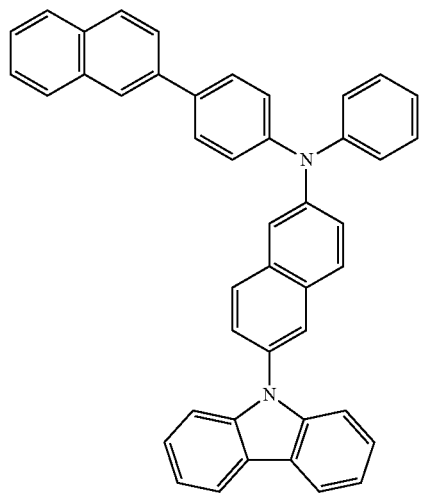
H1-22
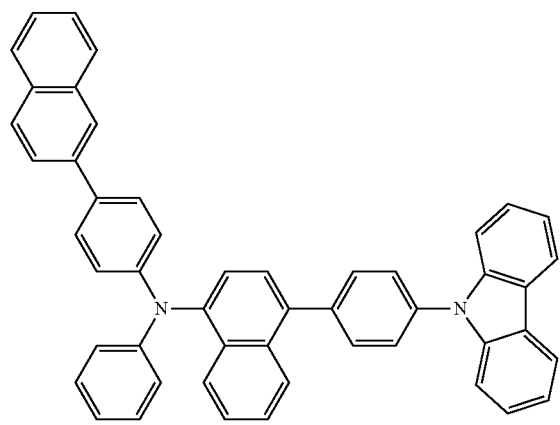
H1-23
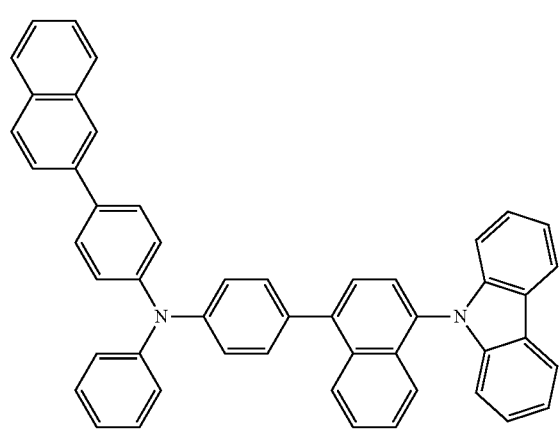
H1-24
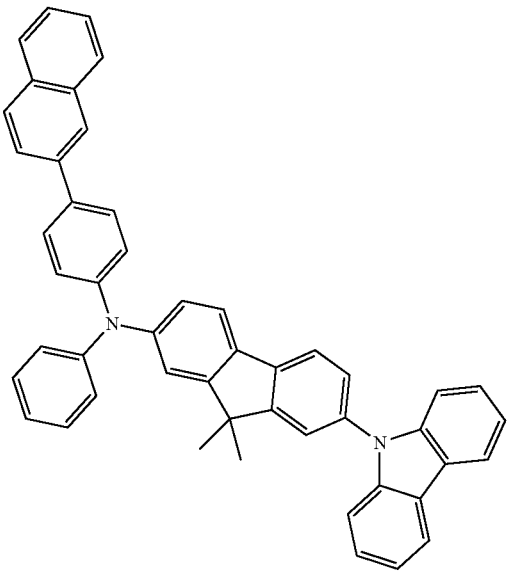
H1-25
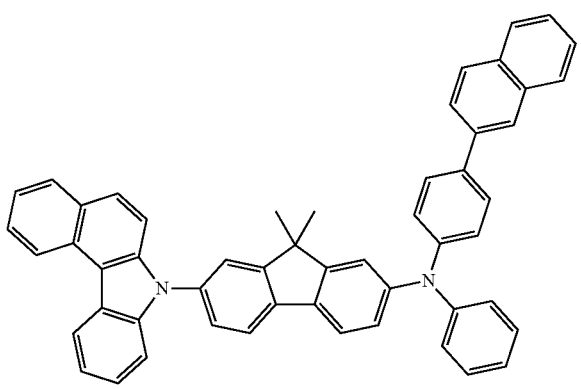
H1-26
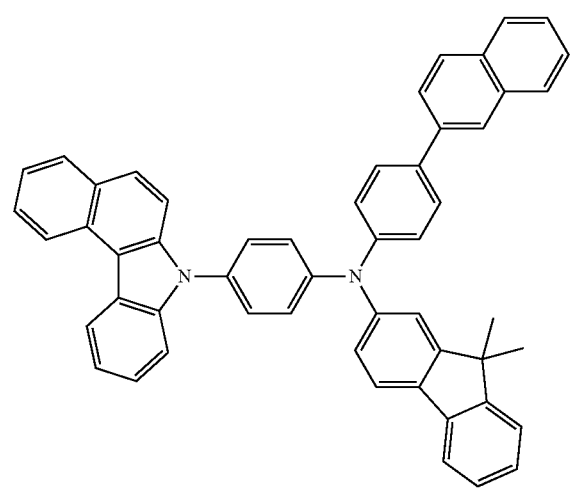

H1-27
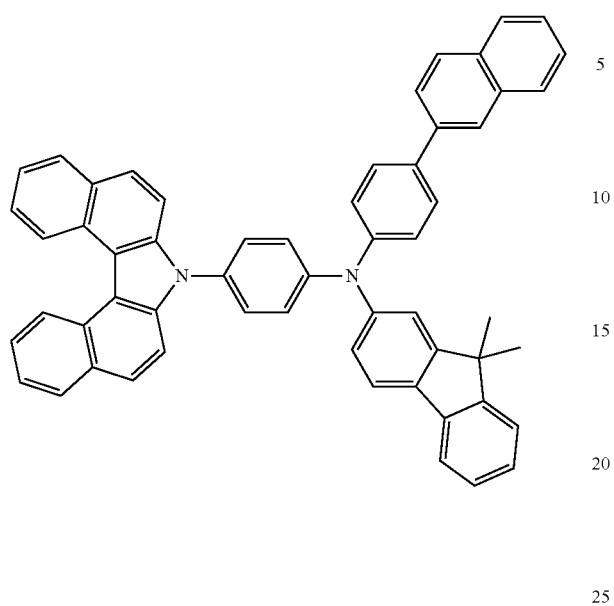
H1-31
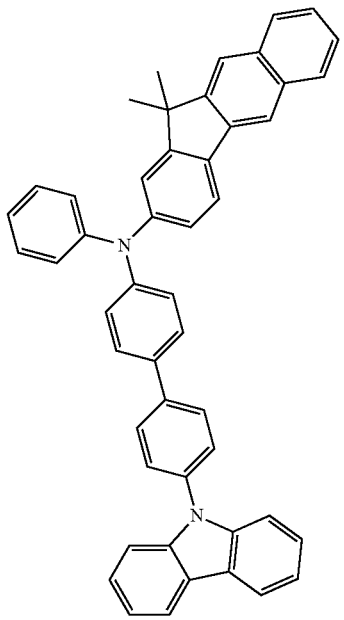
H1-28
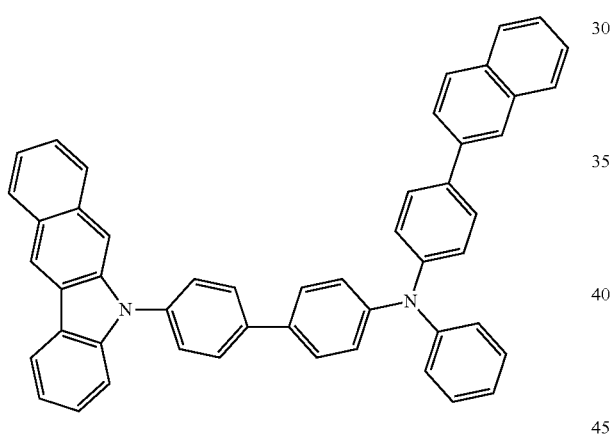
H1-29
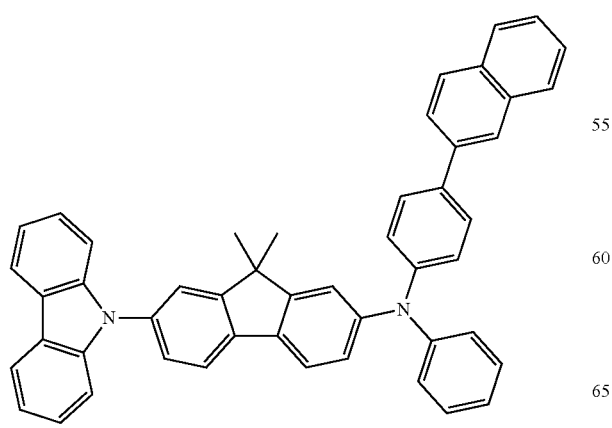
H1-32
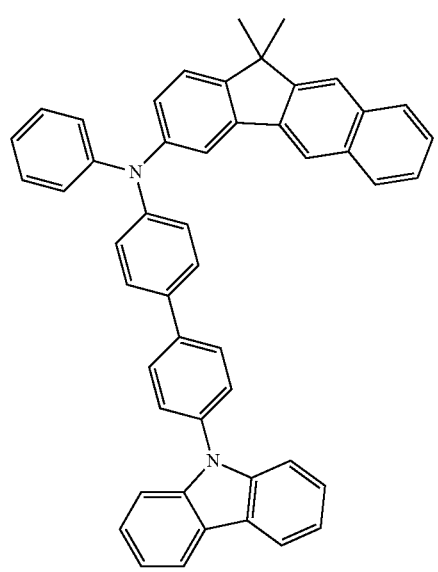

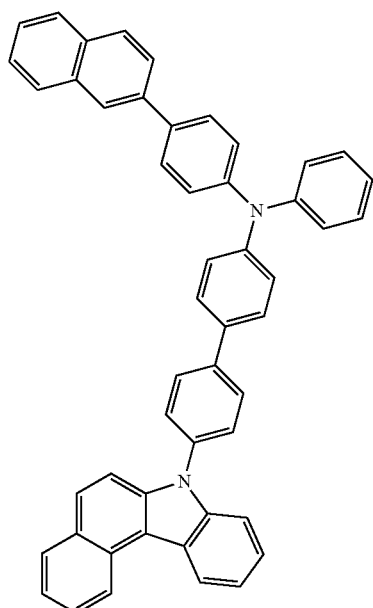
H1-33
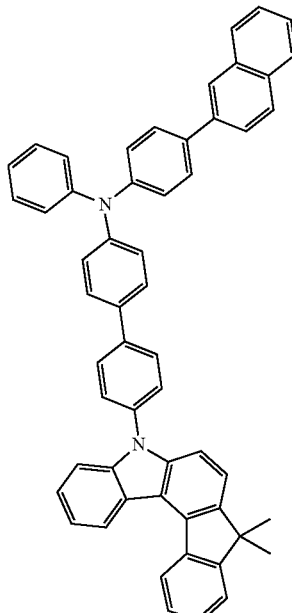
H1-35
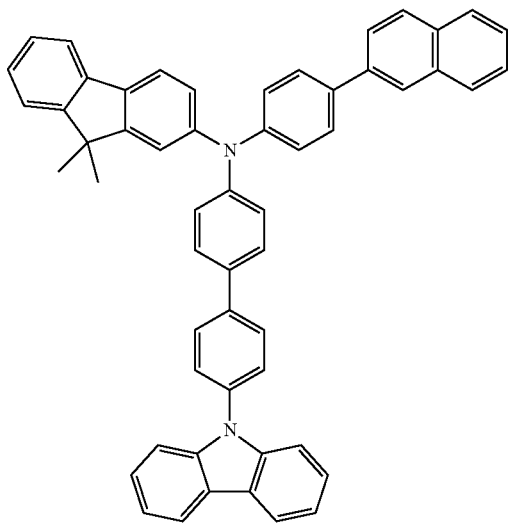
H1-34
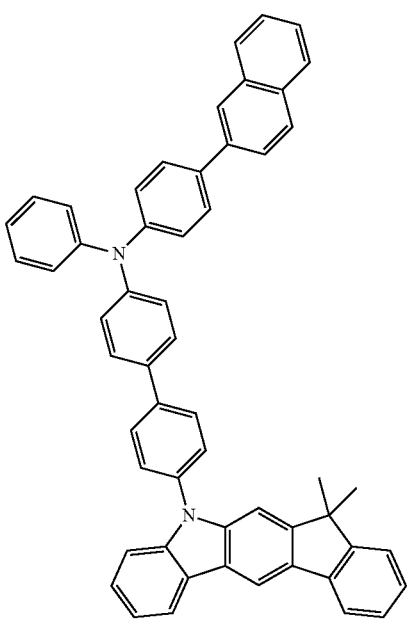
H1-36

H1-37
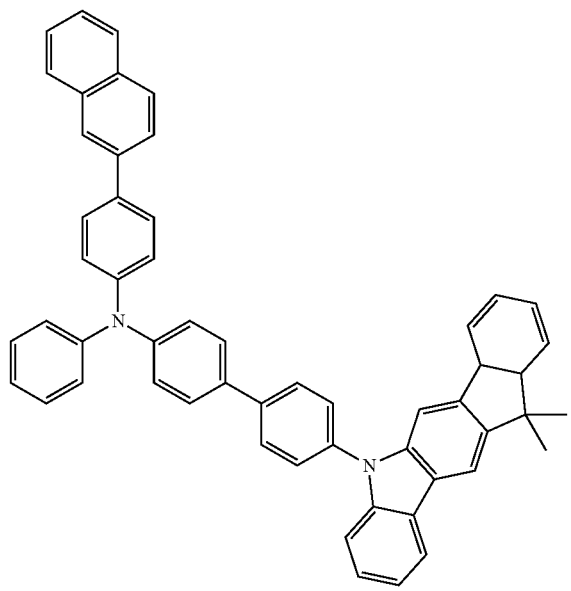
H1-38
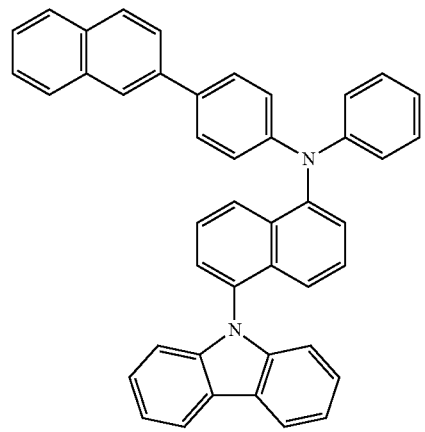
H1-39
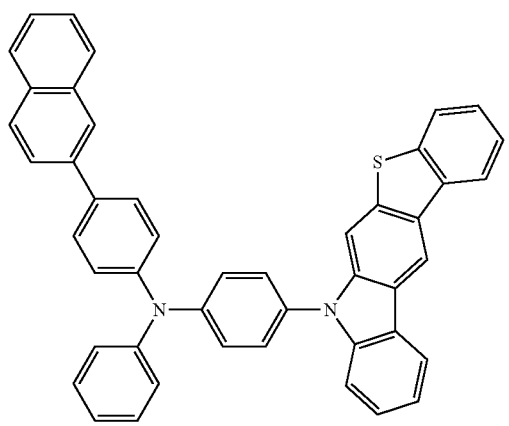
H1-40
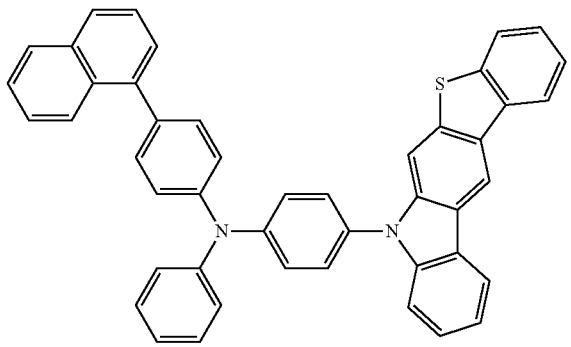
H1-41
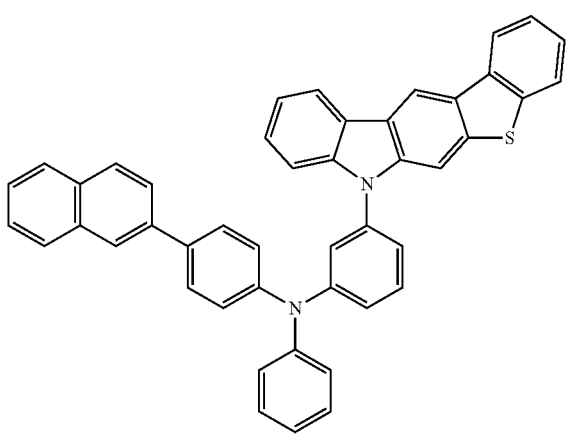
H1-42
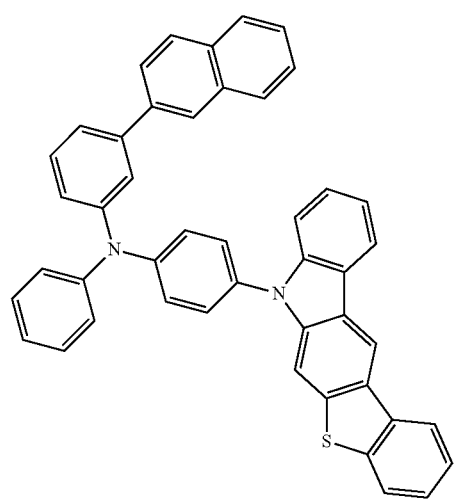

H1-43
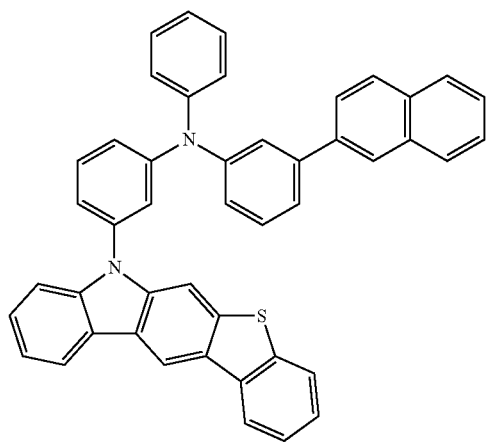
H1-44
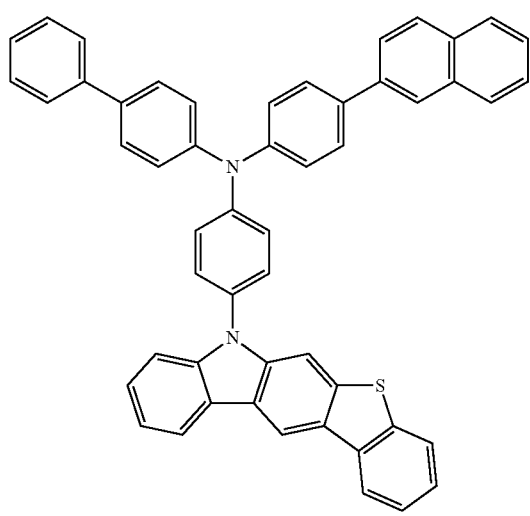
H1-45
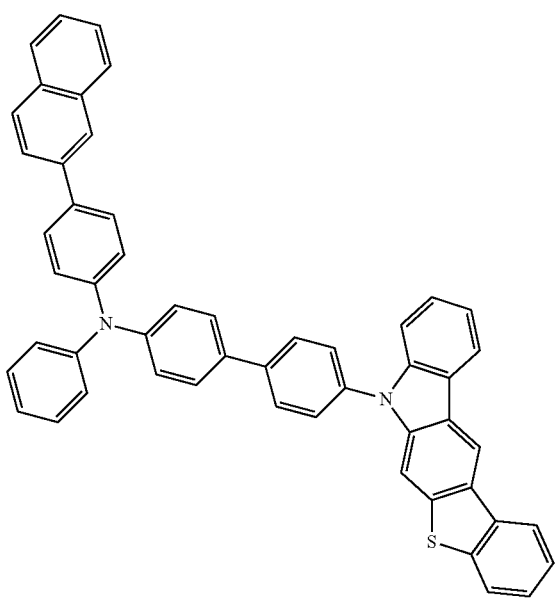
H1-46
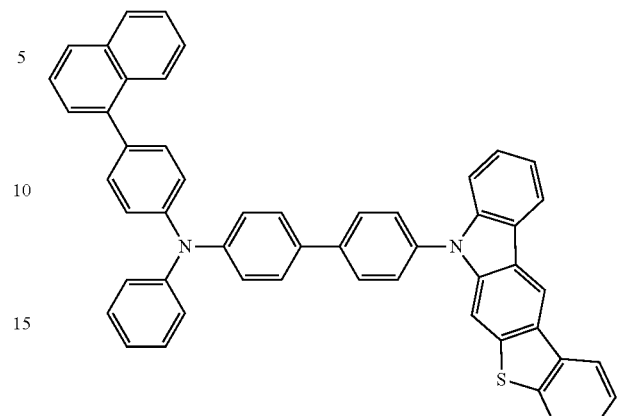
H1-47
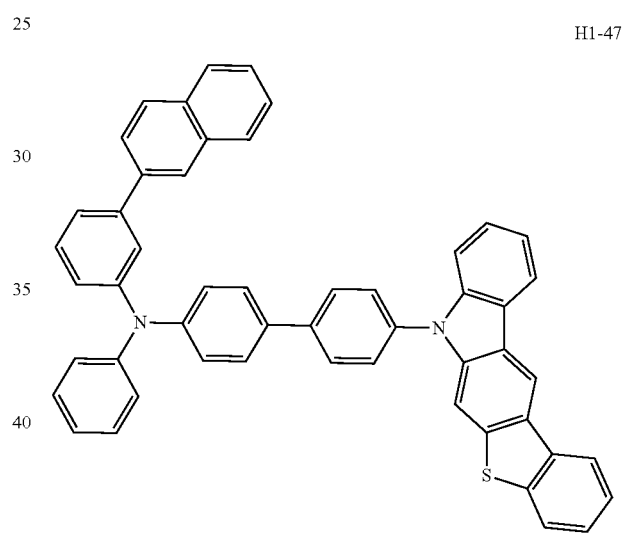
H1-48
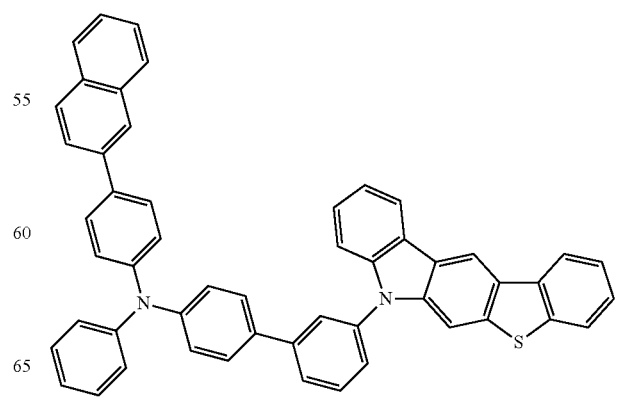

H1-49
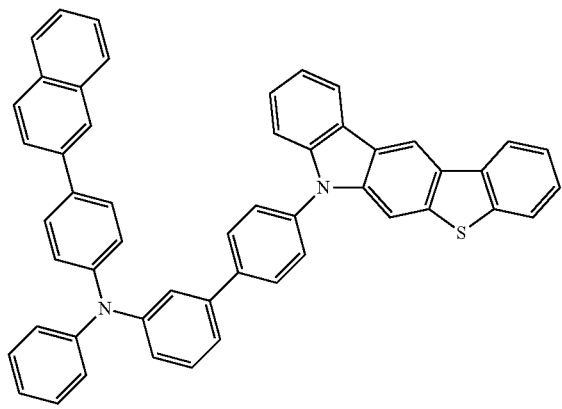
H1-50
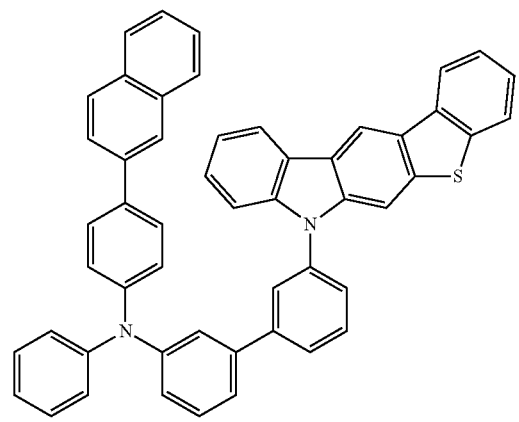
H1-51
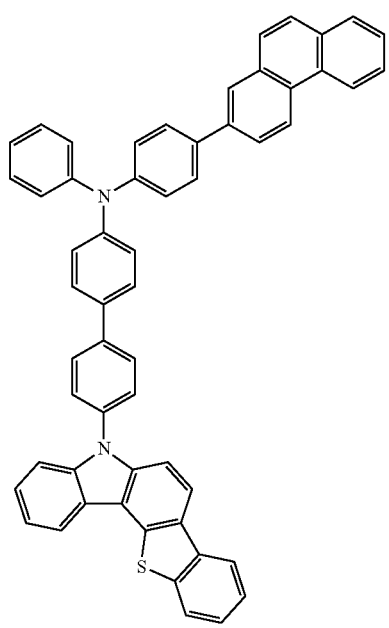
H1-52
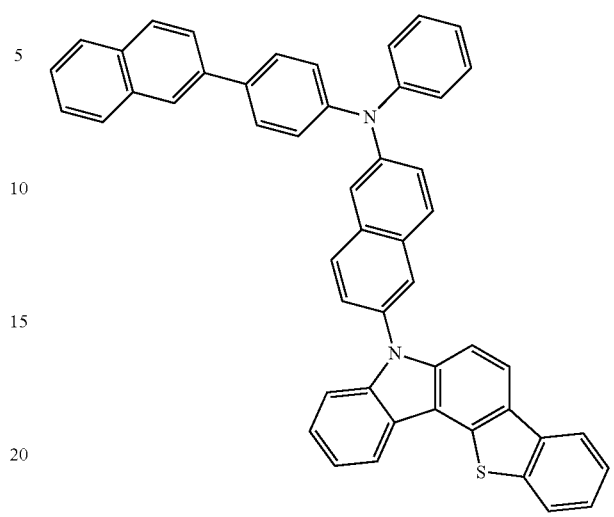
H1-53
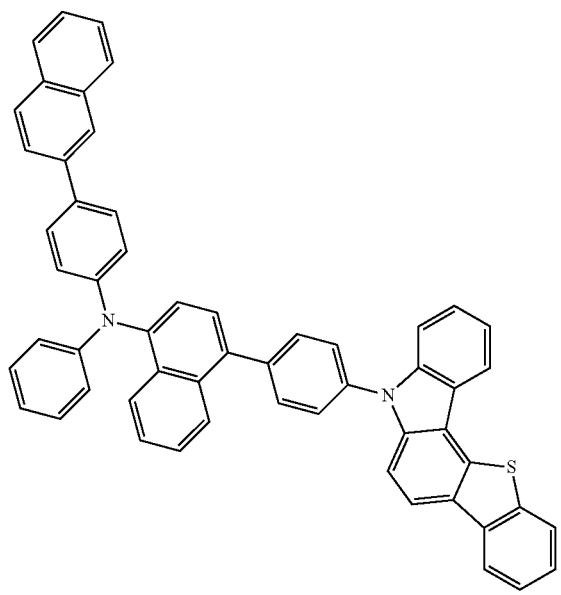

-continued
H1-54
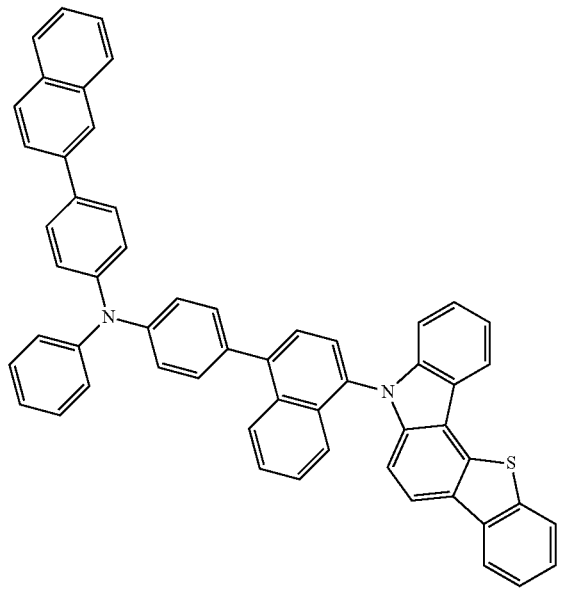
H1-55
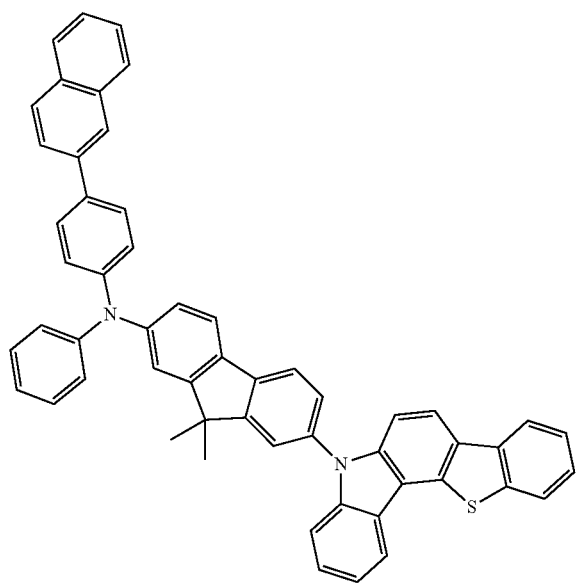
H1-56
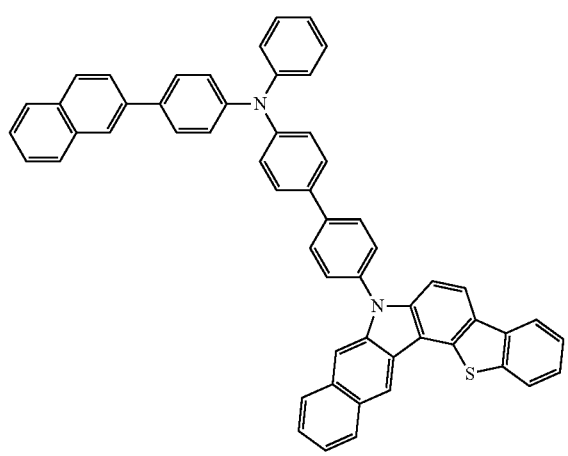
H1-57
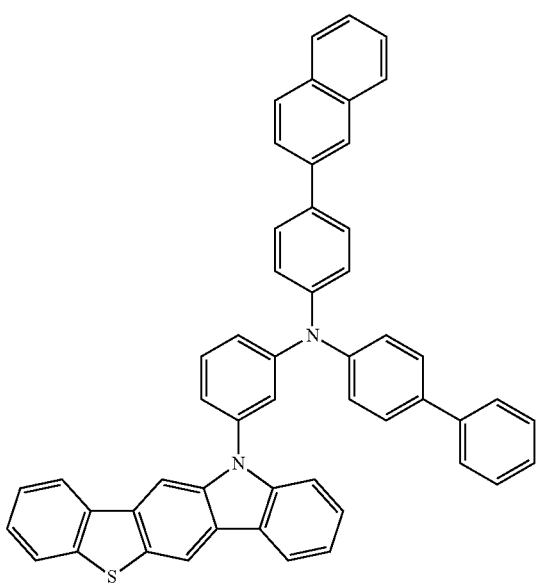

-continued
H1-58
H1-59
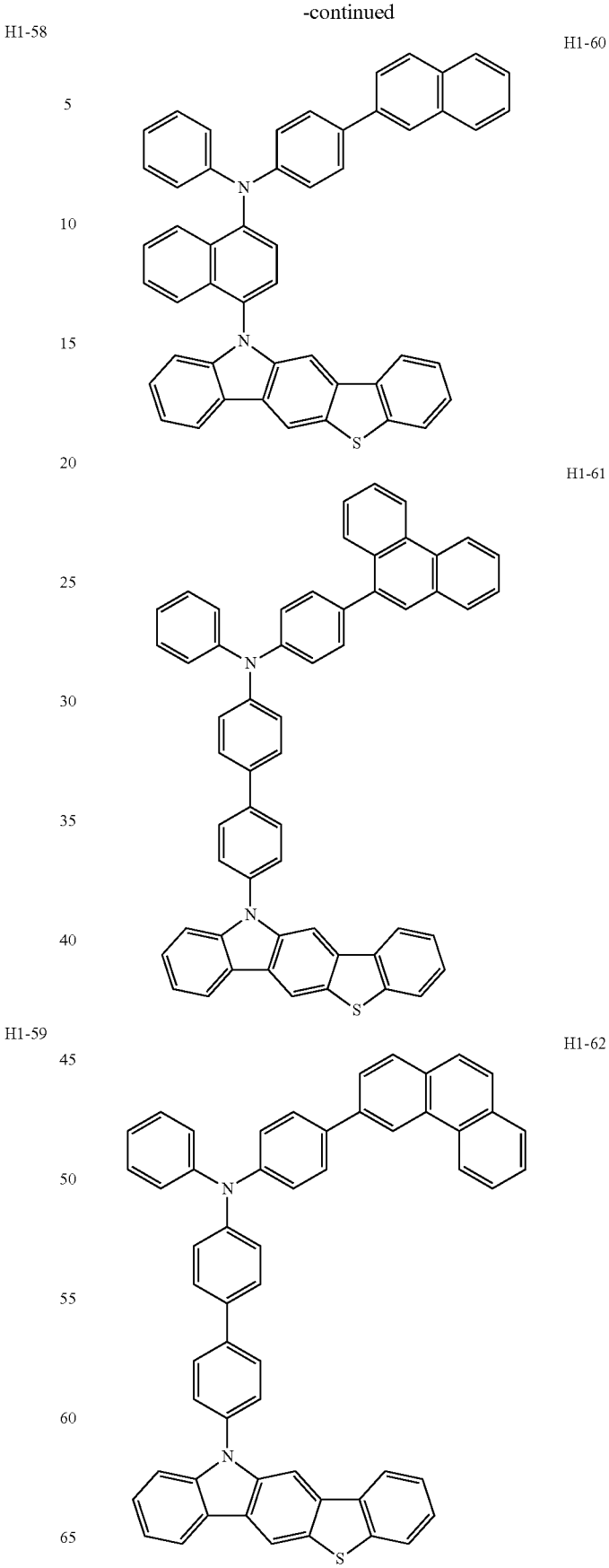
H1-60
H1-61
H1-62

H1-63
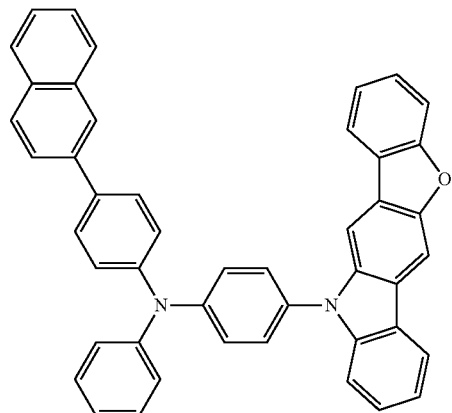
H1-64
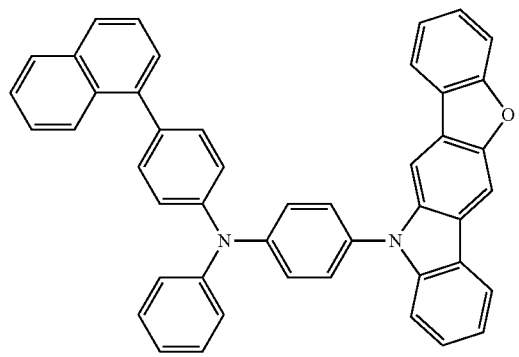
H1-65
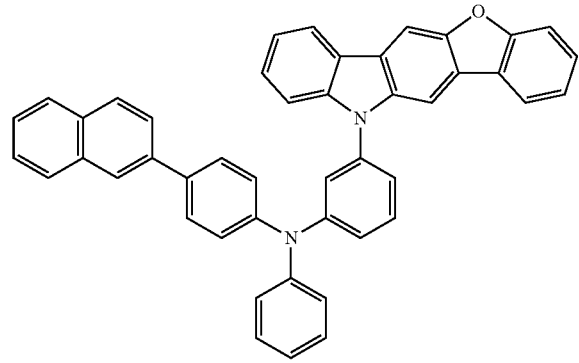
H1-66
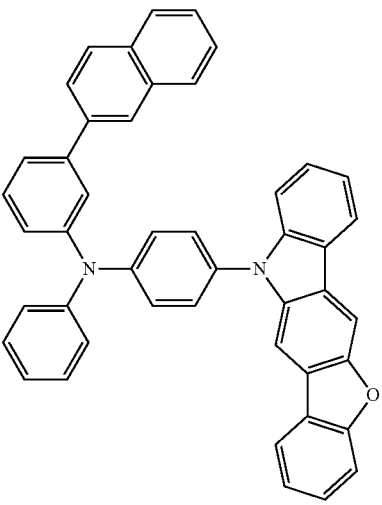
H1-67
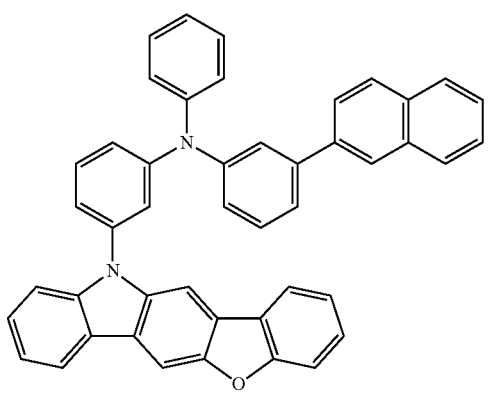
H1-68
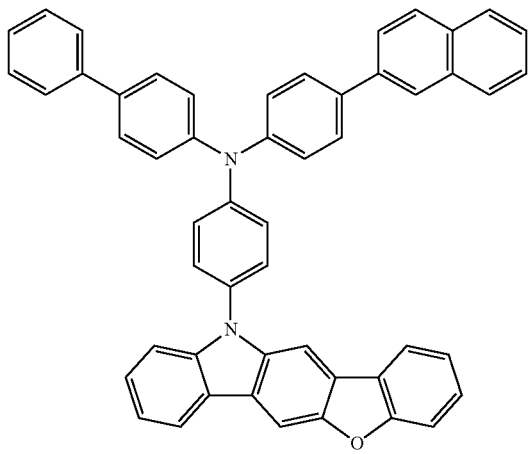

H1-69
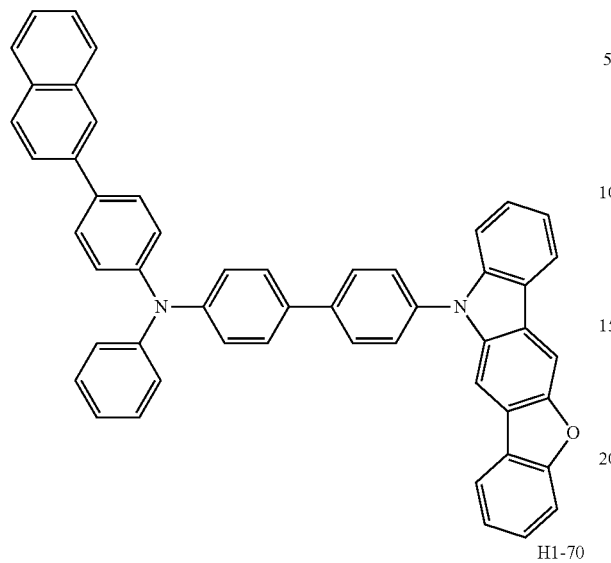
H1-70
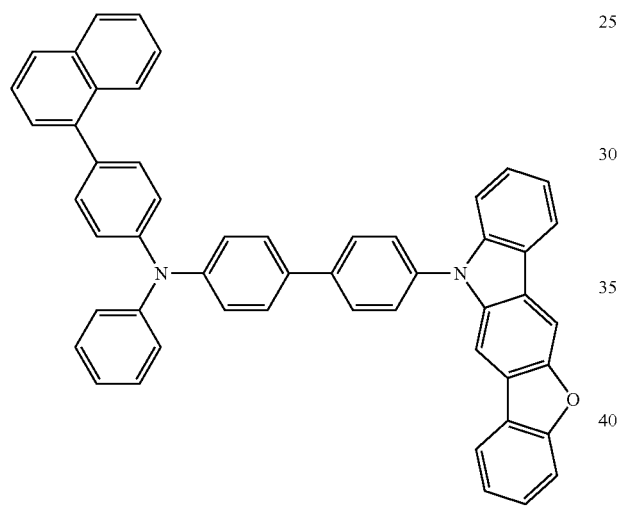
H1-71
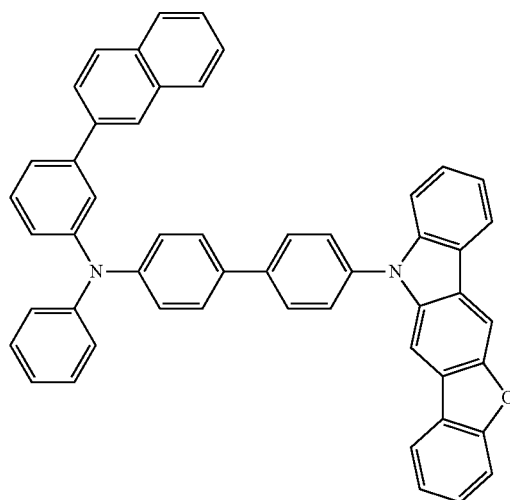
H1-72
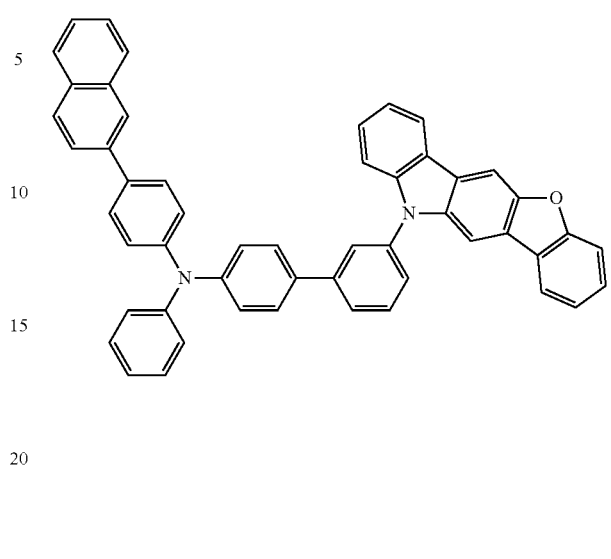
H1-73
H1-74
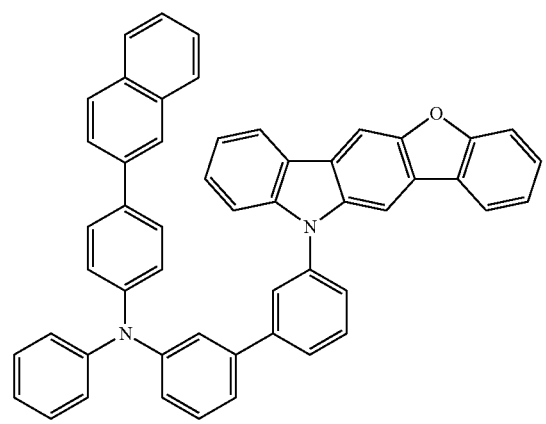

H1-75
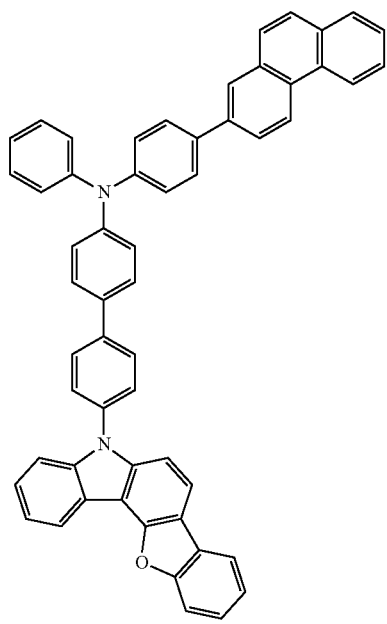
H1-76
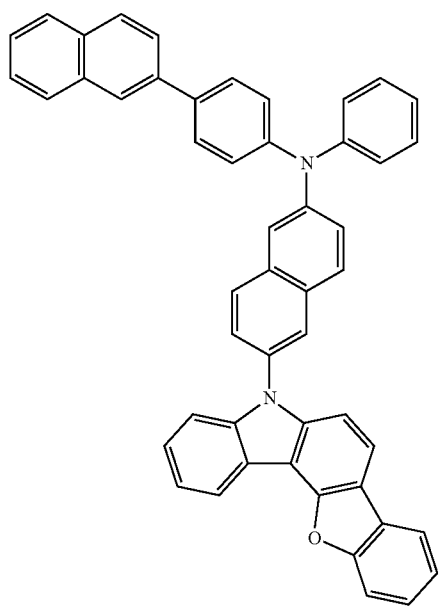
H1-77
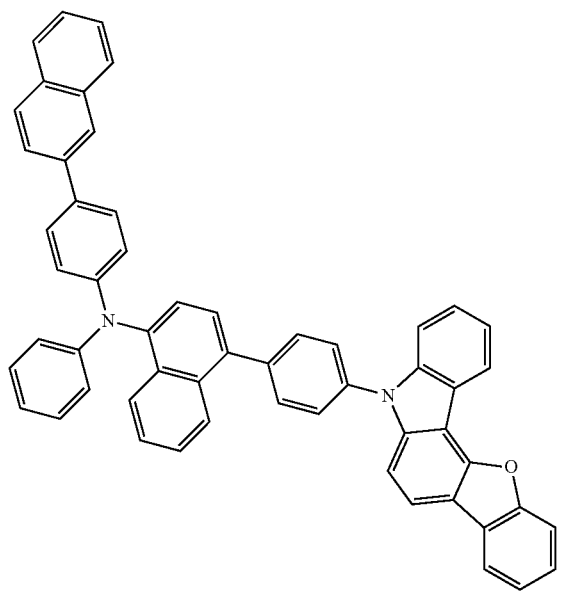
H1-78
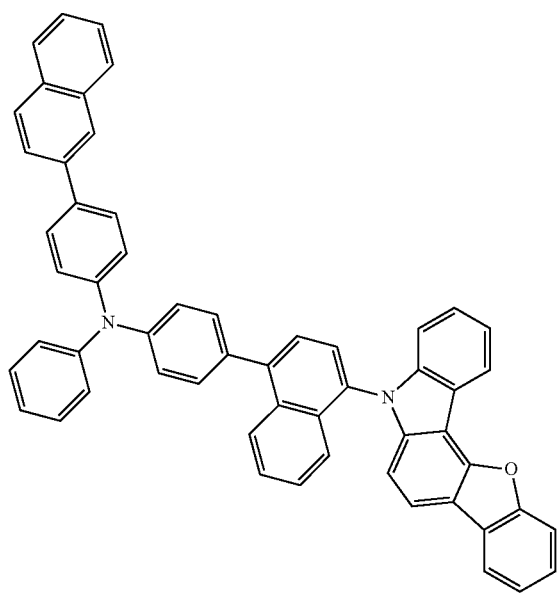

H1-79
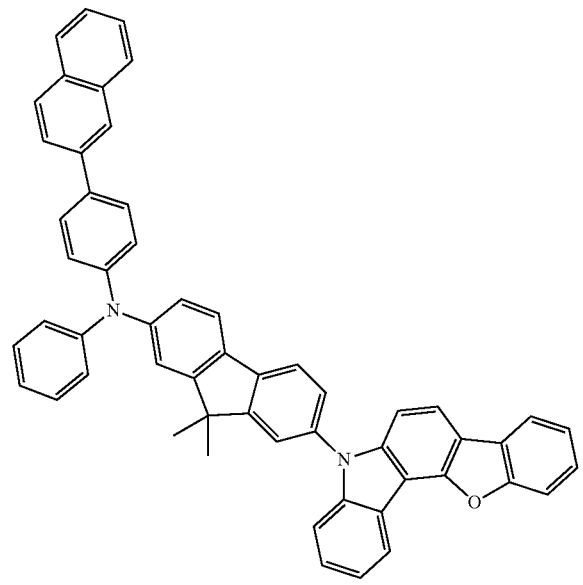
H1-81
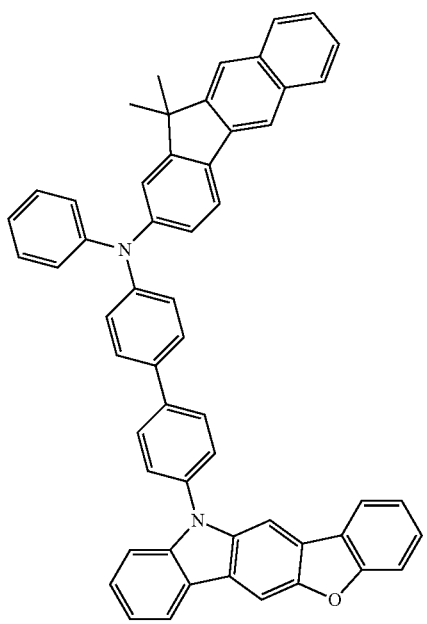
H1-80
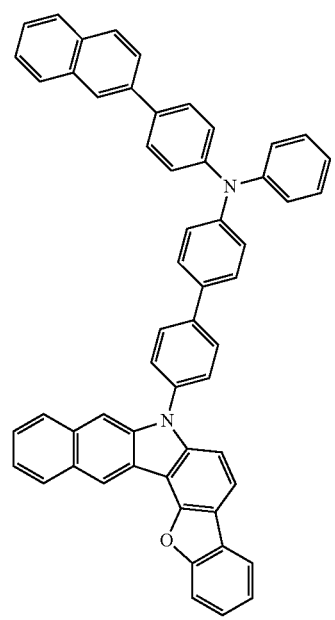
H1-82
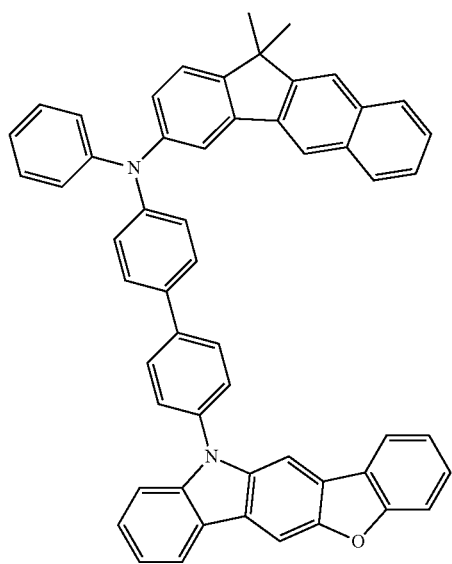

H1-83
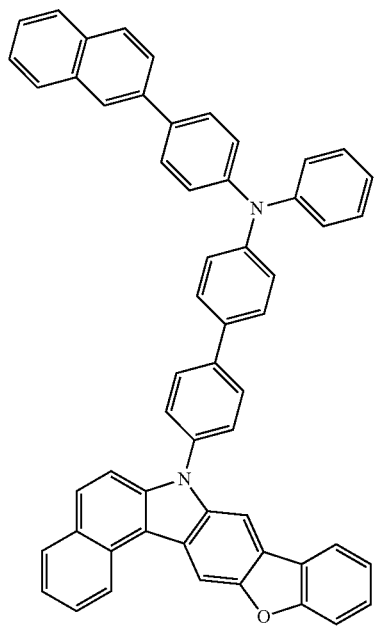
H1-85
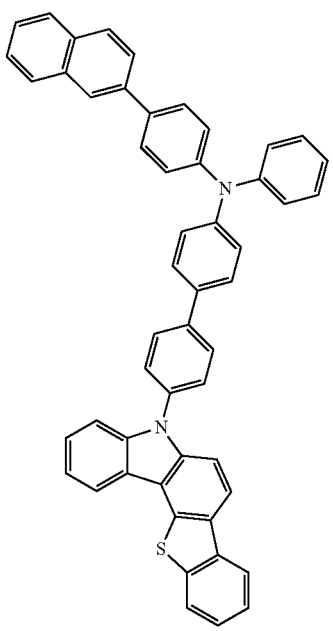
H1-84
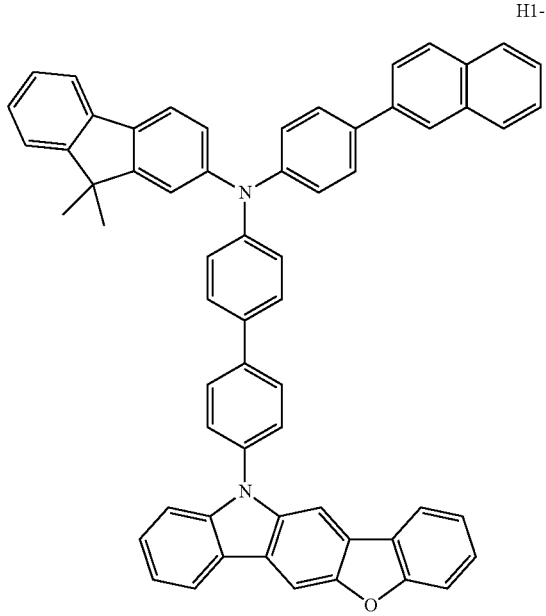
H1-86
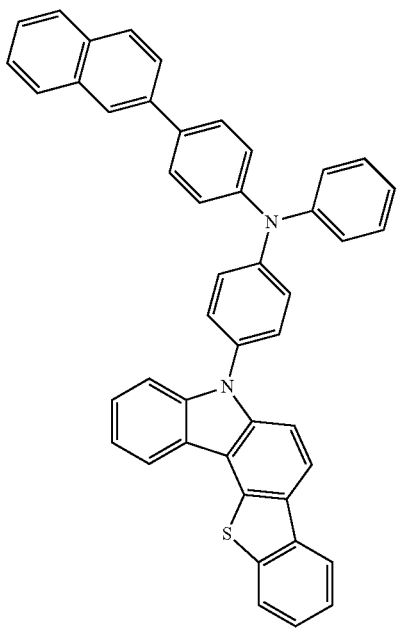

H1-87
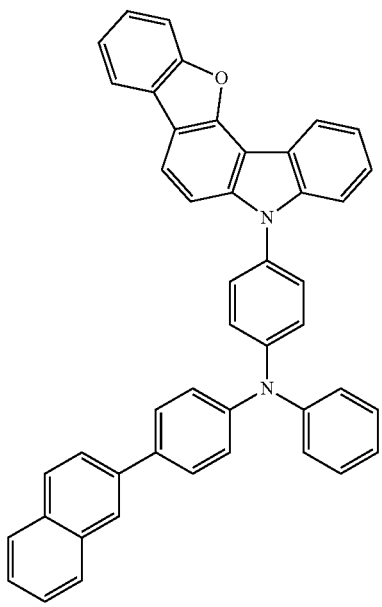
H1-89
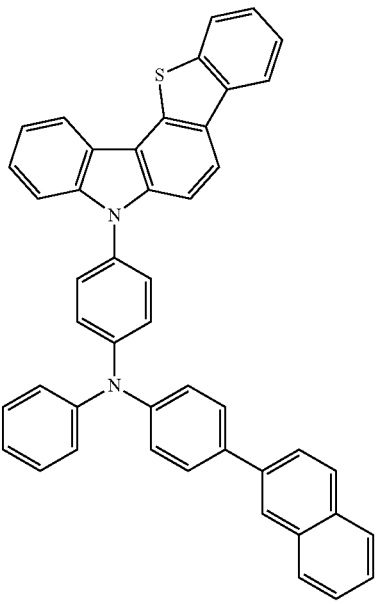
H1-88
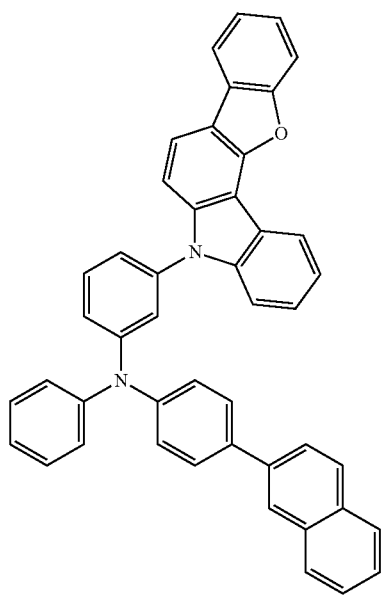
H1-90
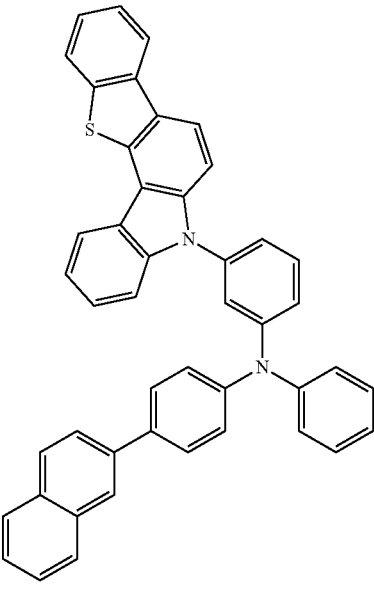

H1-91
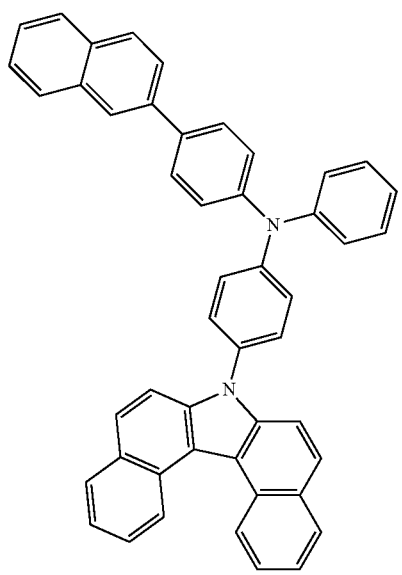
H1-93
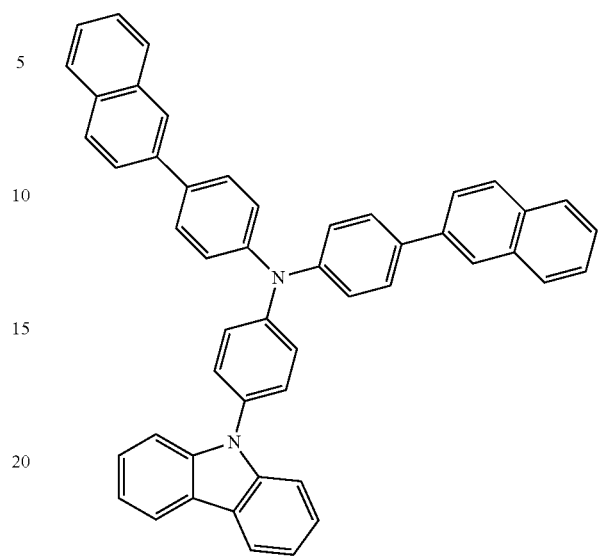
H1-92
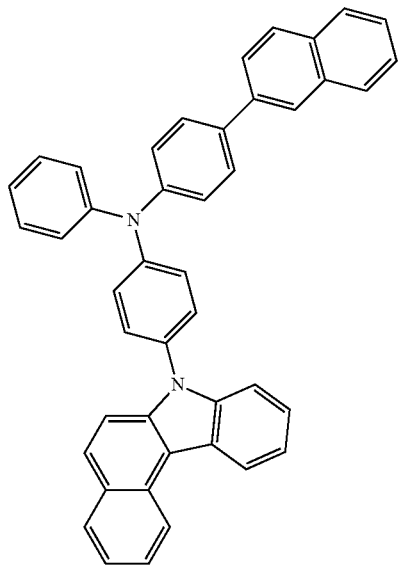
H1-94
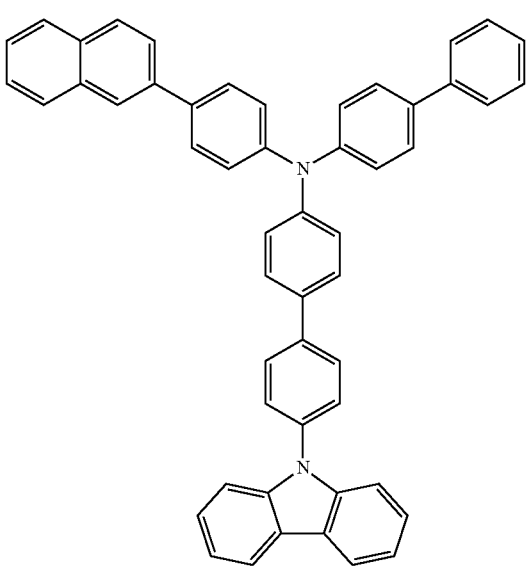
The second host compound of formula 2 may be selected from the group consisting of the following compounds, but is not limited thereto:

C-1
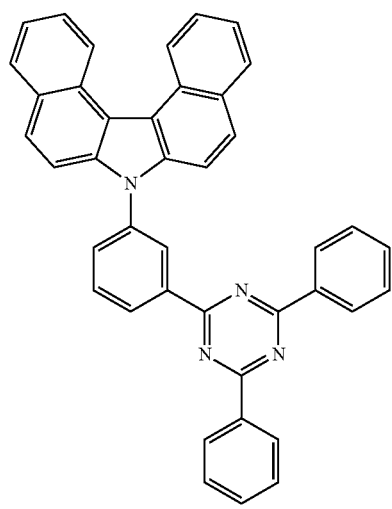
C-2
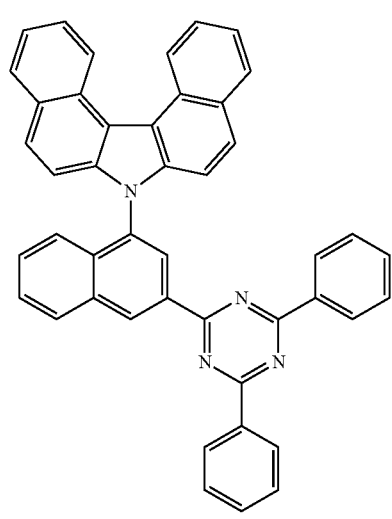
C-3
C-4
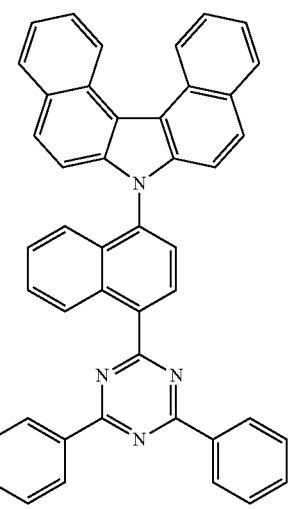
C-5
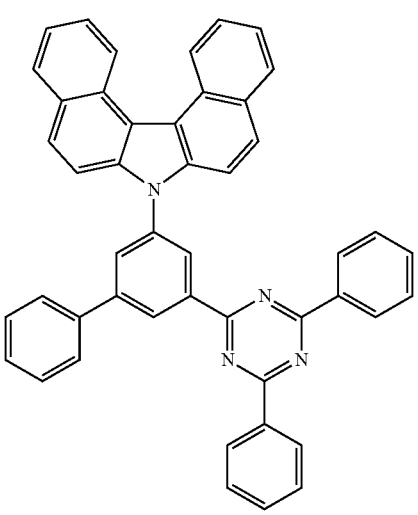
C-6
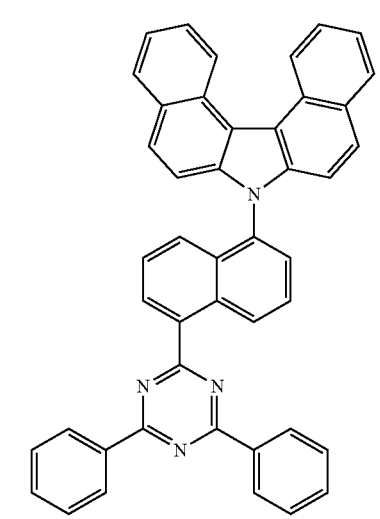

C-7
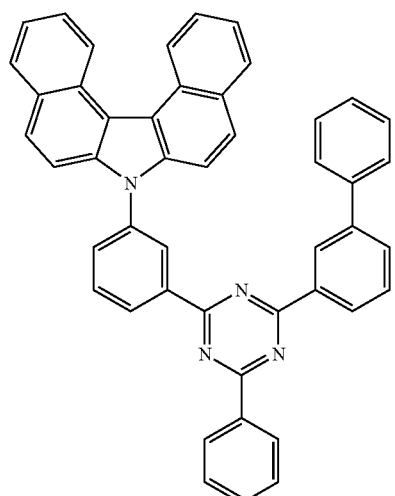
C-8
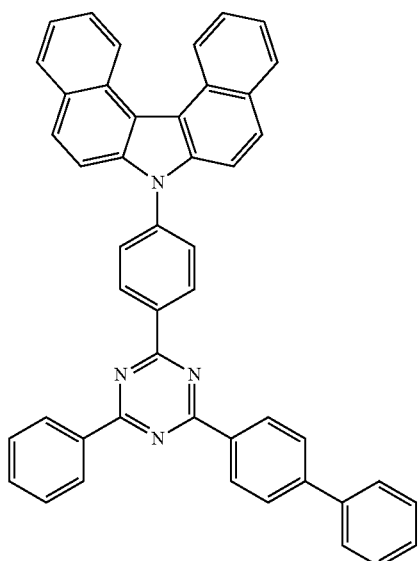
C-9
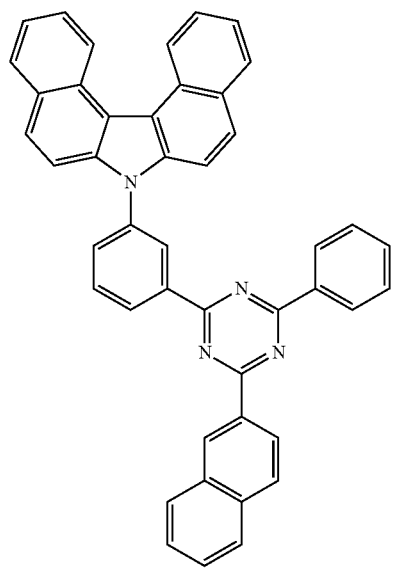
C-10
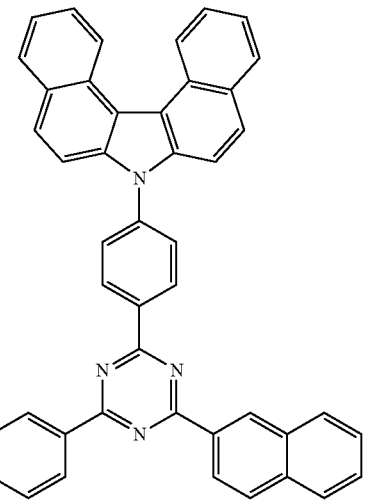
C-11
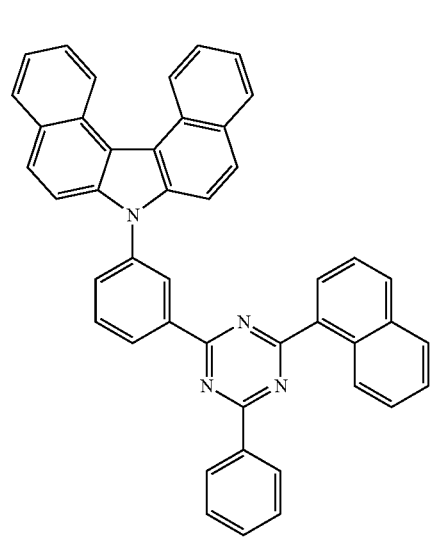
C-12
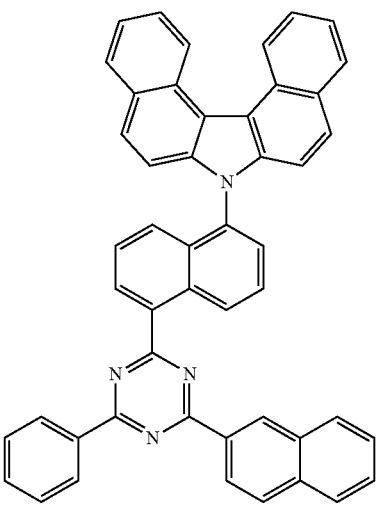

C-13
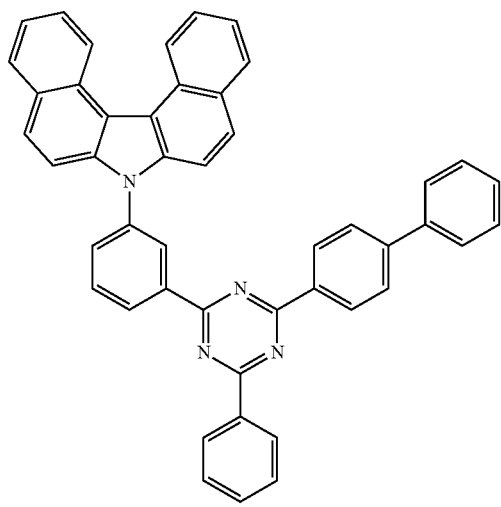
C-14
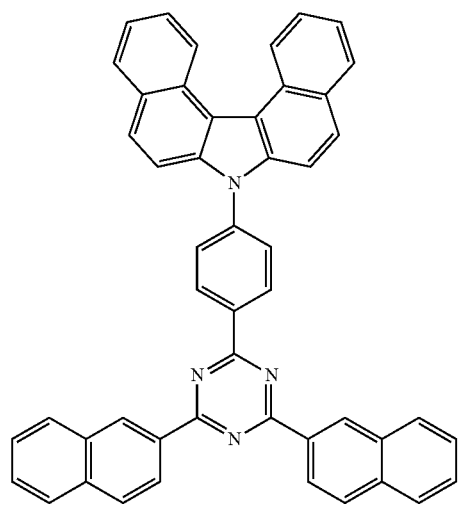
C-15
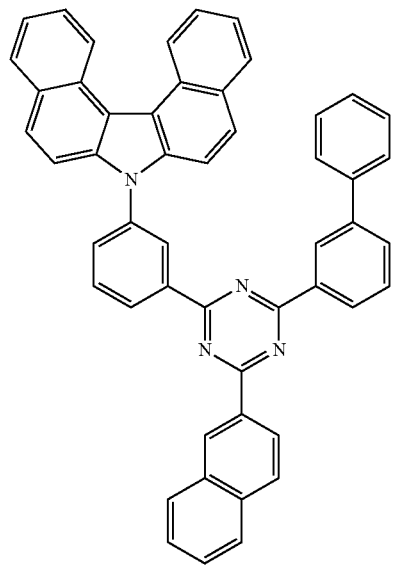
C-16
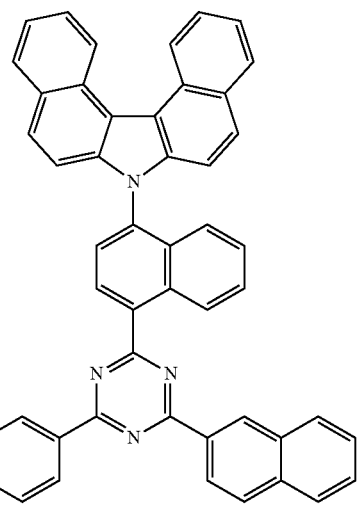
C-17
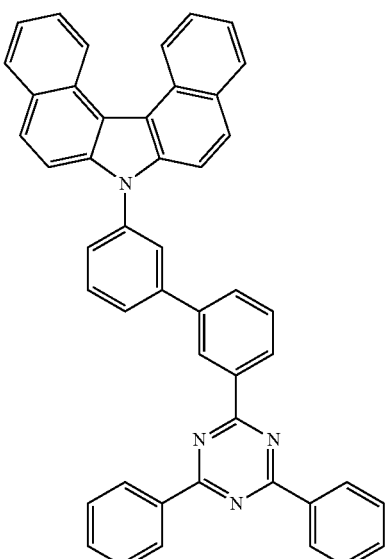
C-18
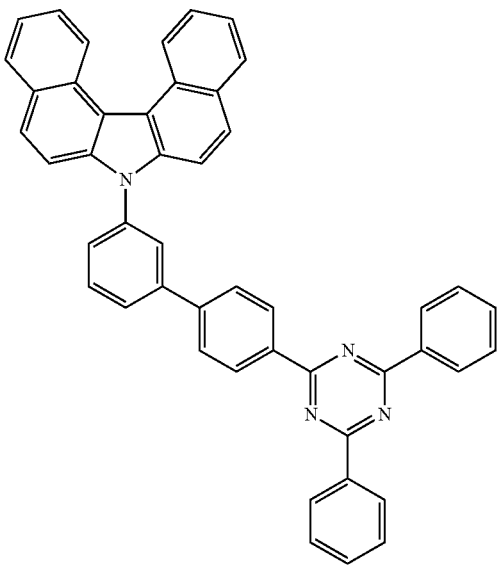

C-19
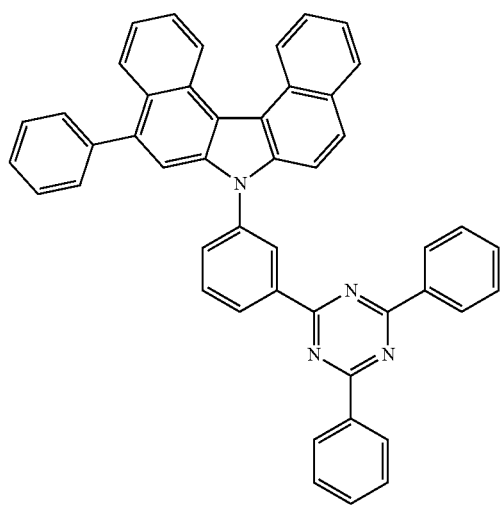
C-20
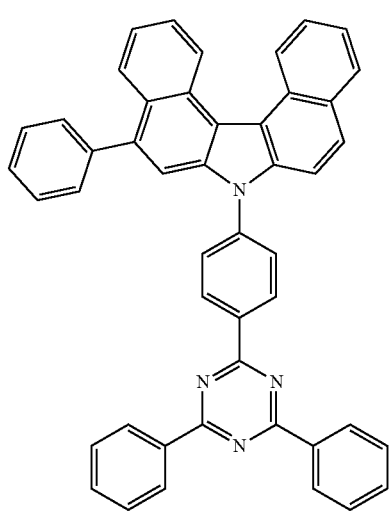
C-21
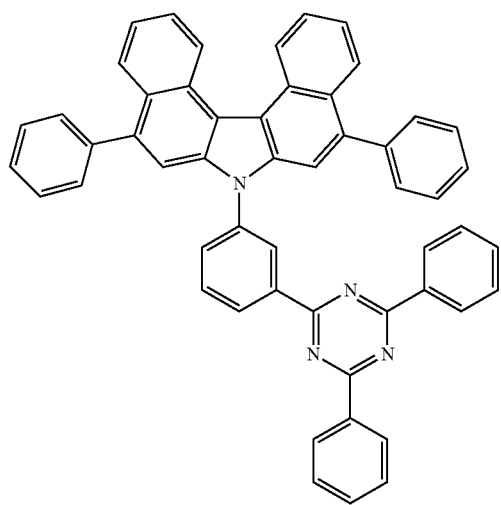
C-22
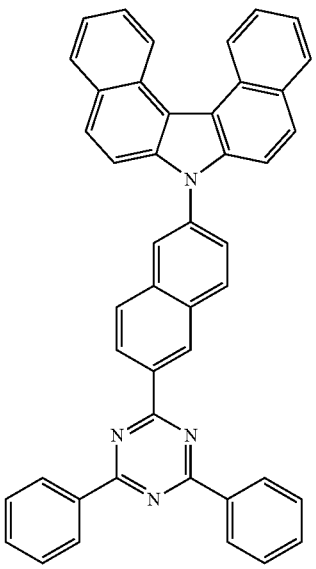
C-23
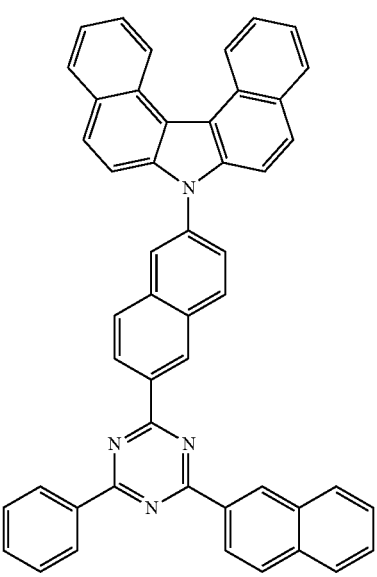
C-24
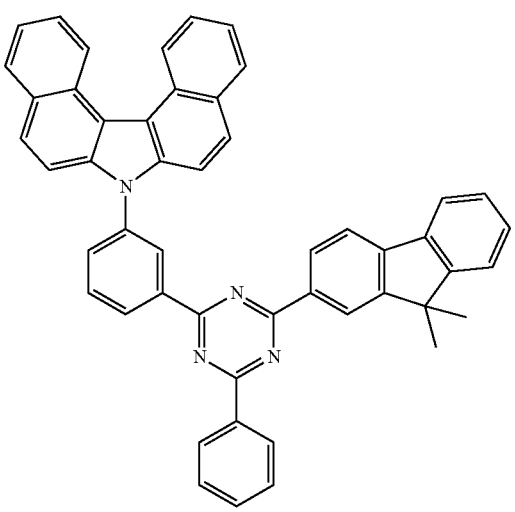

C-25
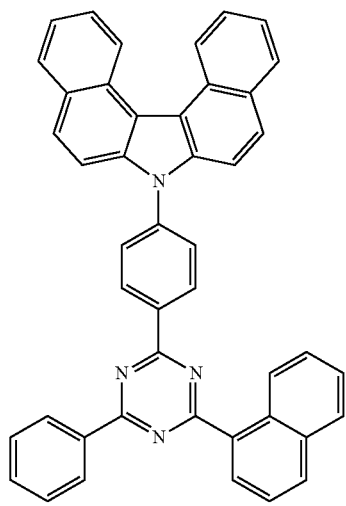
C-28
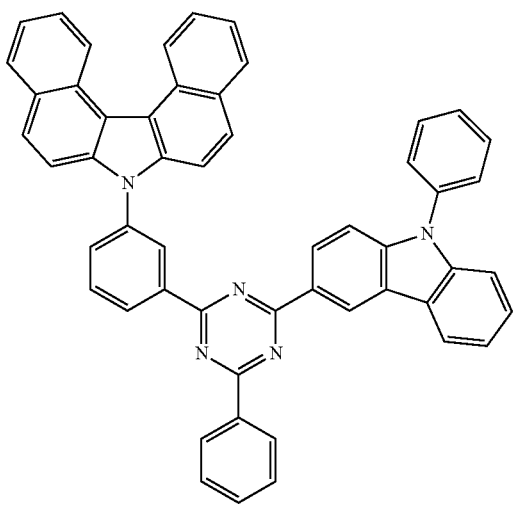
C-26
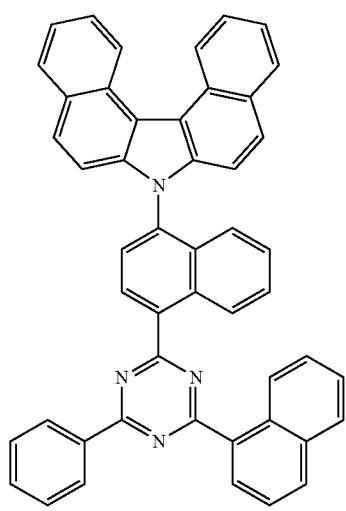
C-29
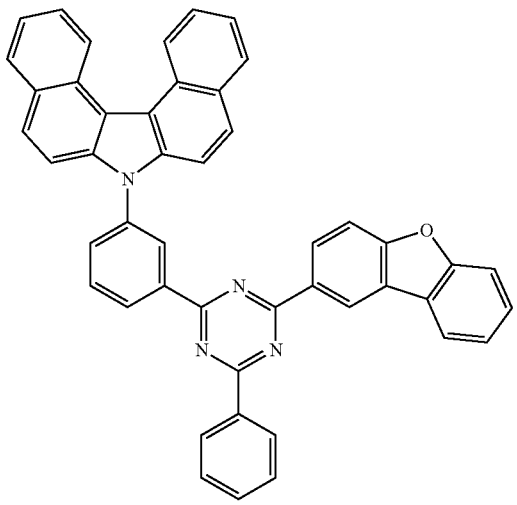
C-27
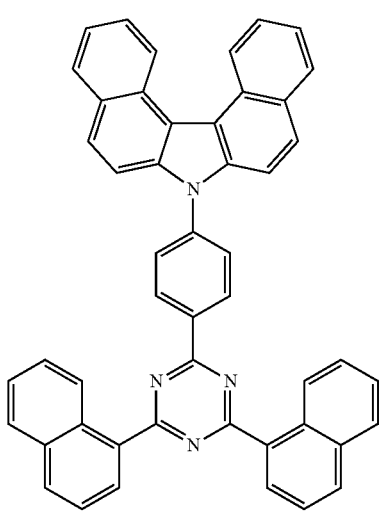
C-30
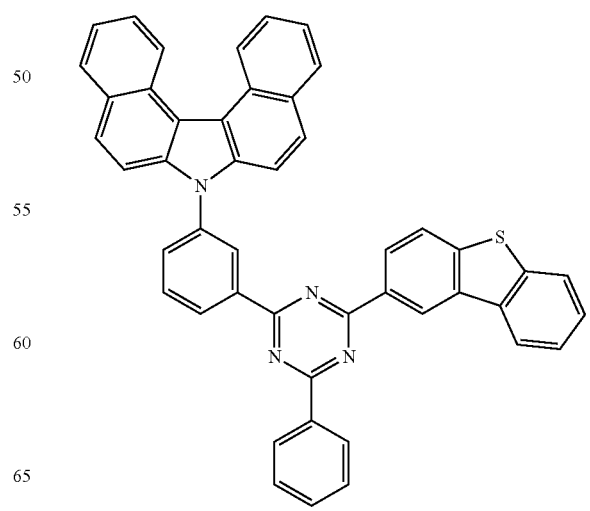

C-31
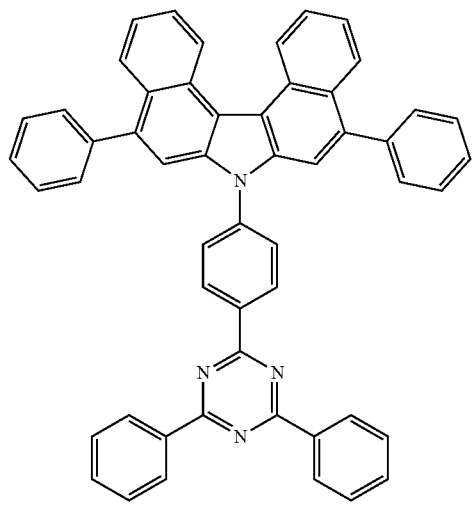
C-32
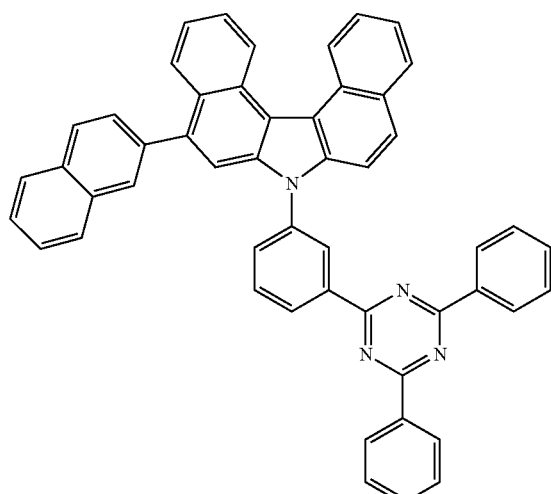
C-33
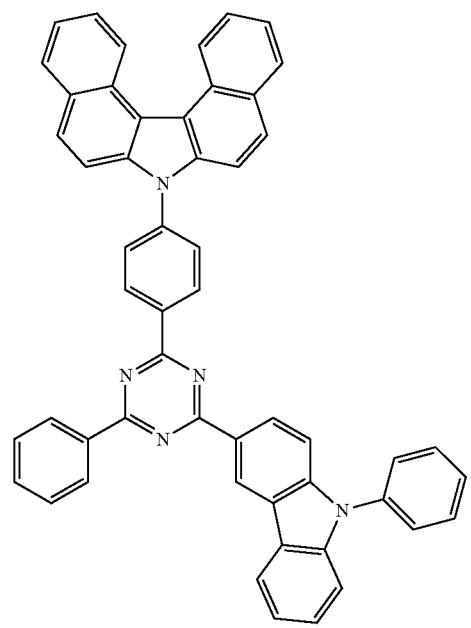
C-34
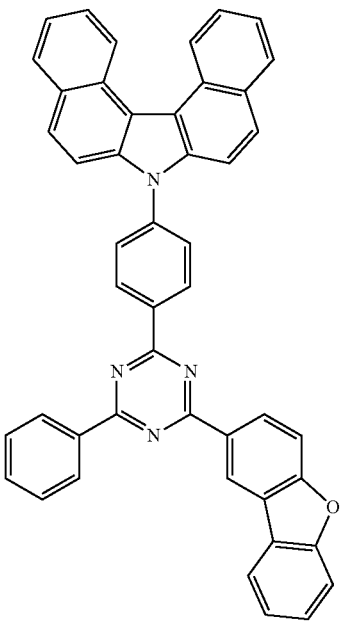
C-35
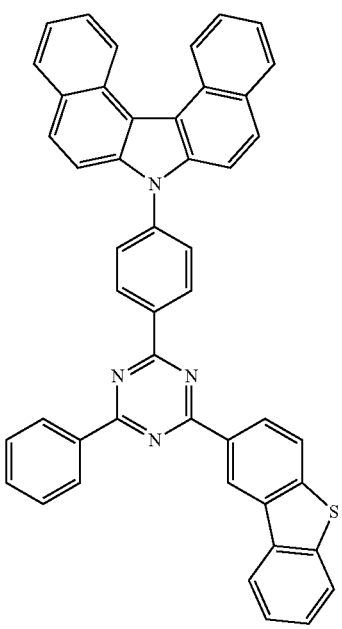

C-36
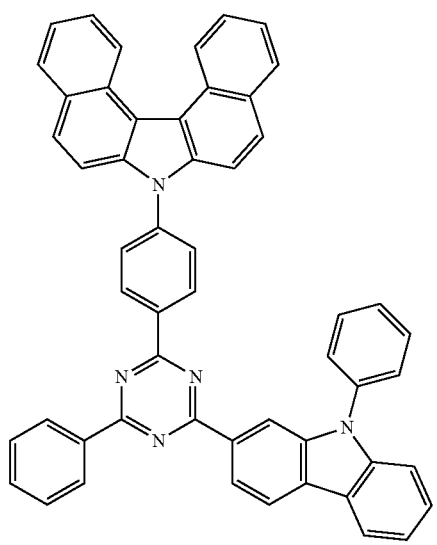
C-37
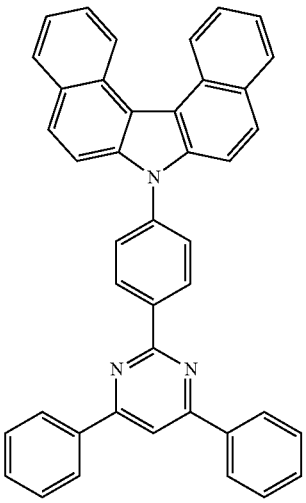
C-38
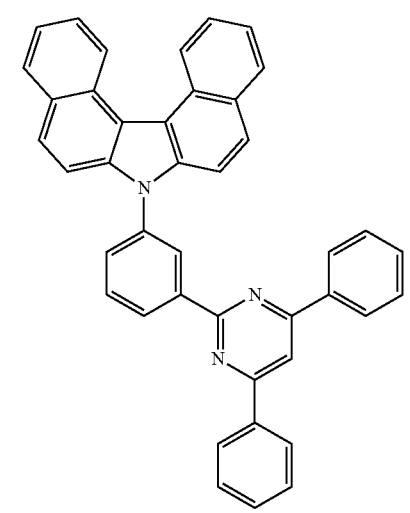
C-39
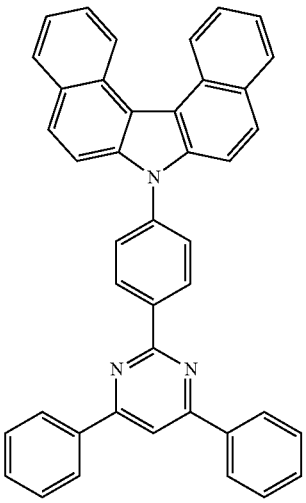
C-40
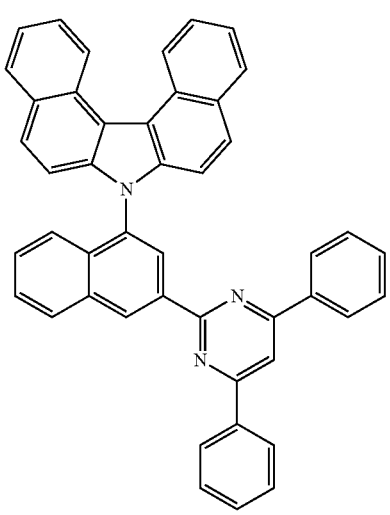
C-41
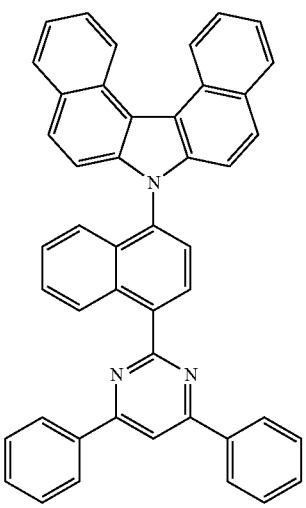

C-42 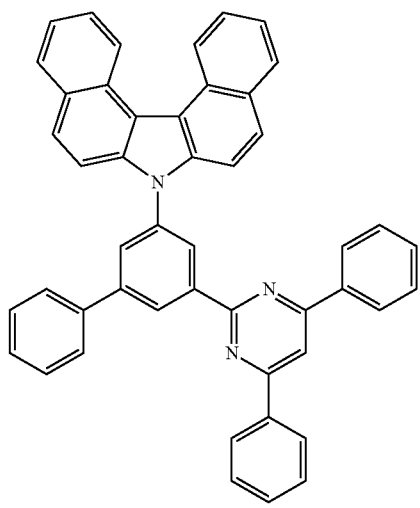
C-43 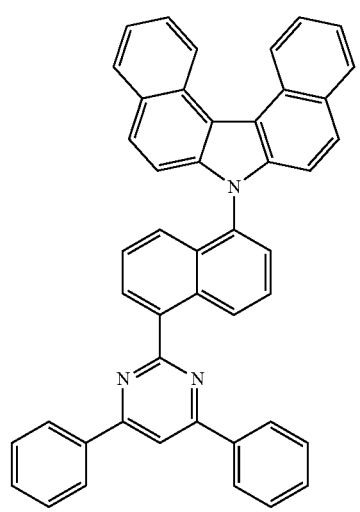
C-44 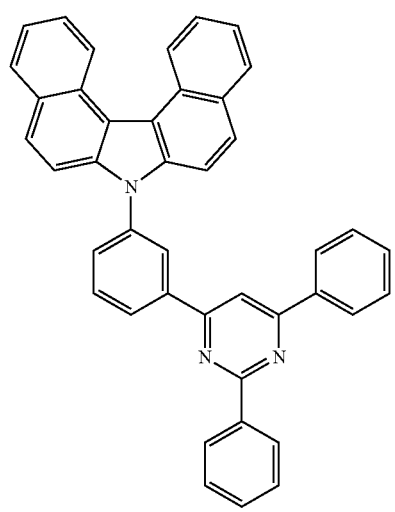
C-45 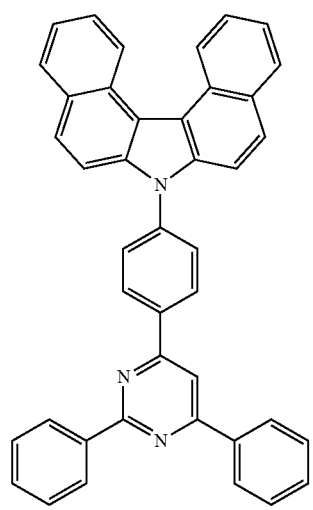
C-46 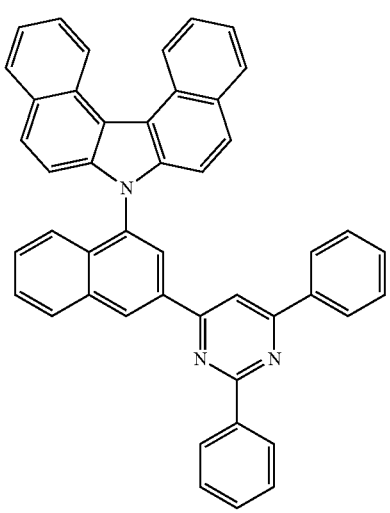
C-47 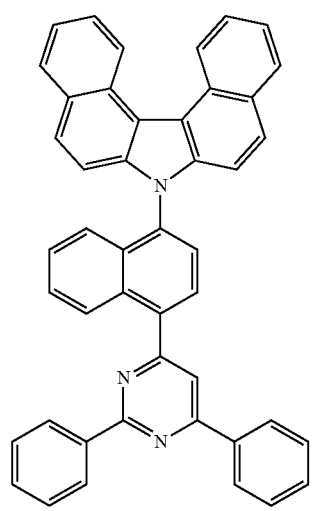

C-48
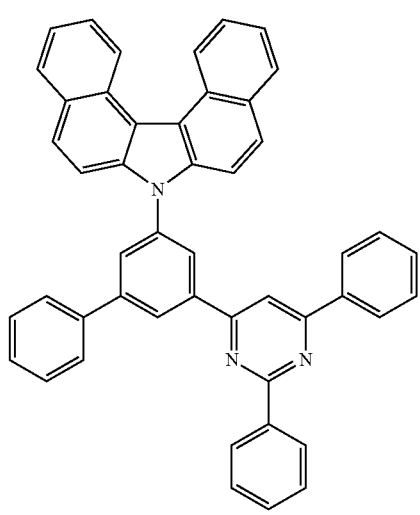
C-49
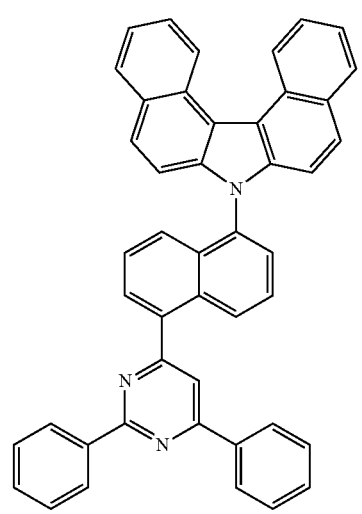
C-50
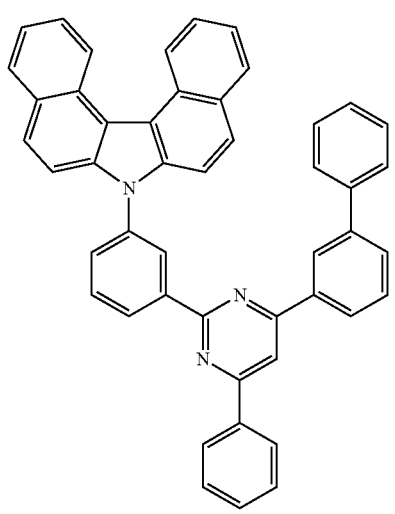
C-51
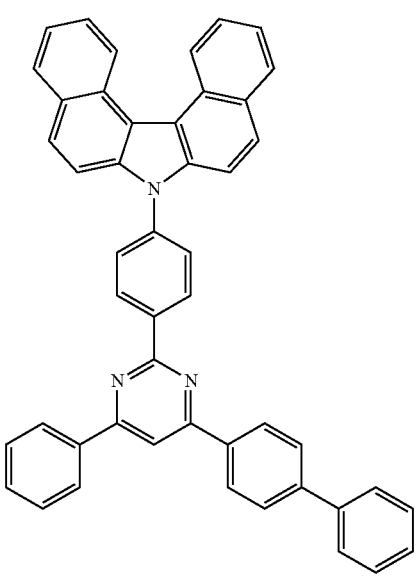
C-52
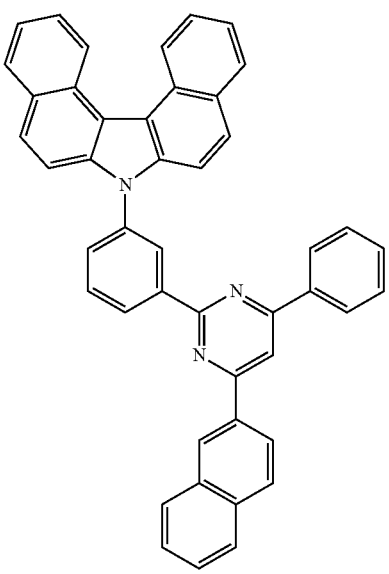
C-53
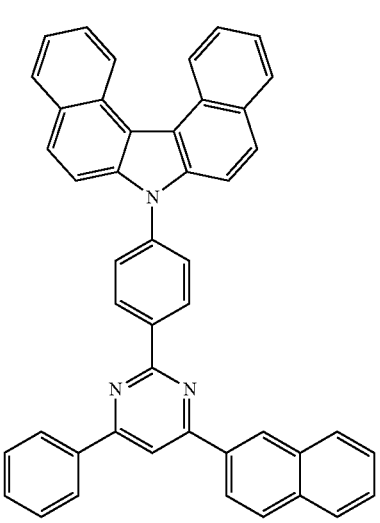

C-54
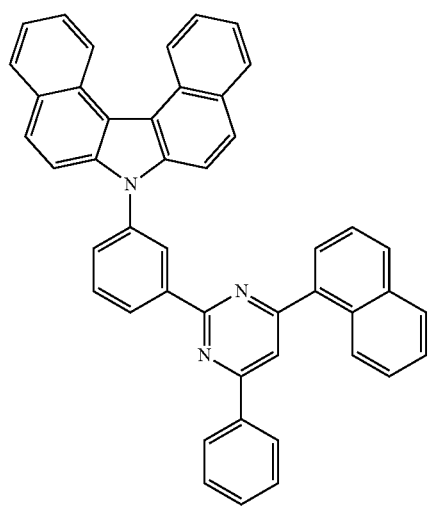
C-55
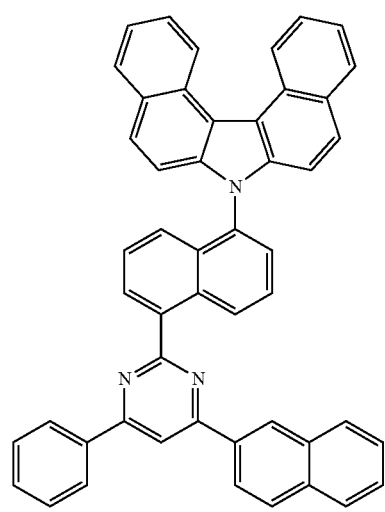
C-56
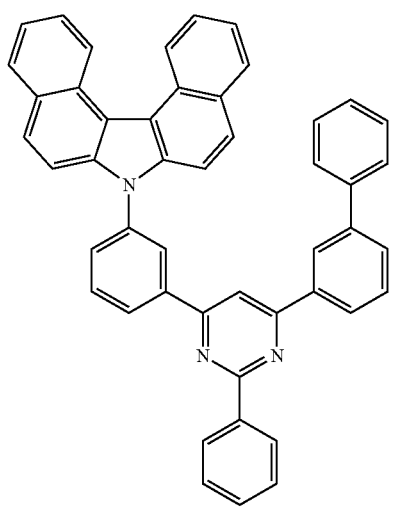
C-57
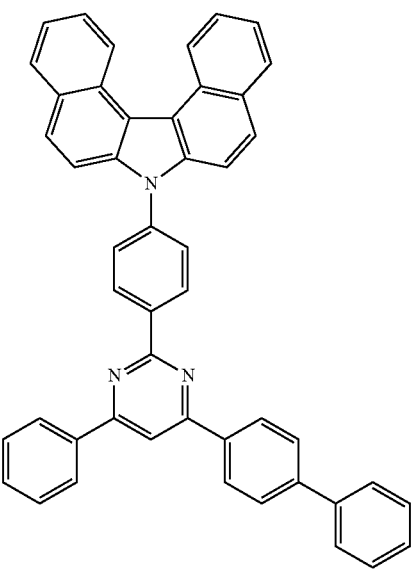
C-58
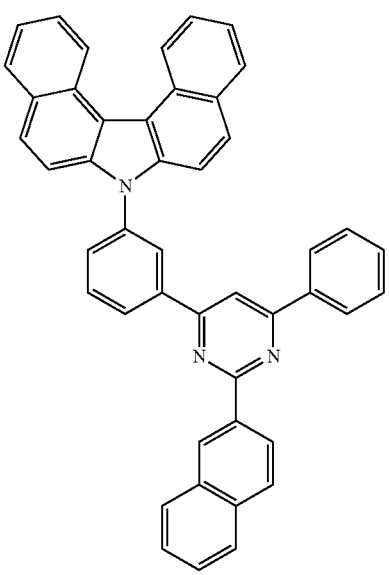
C-59
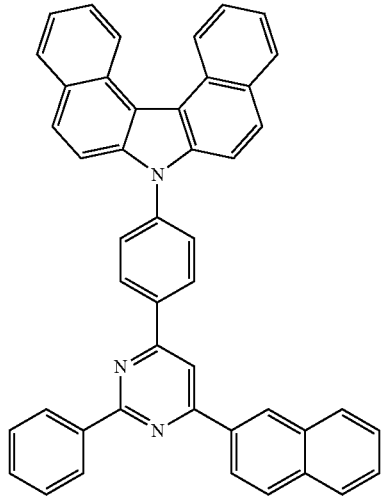

C-60
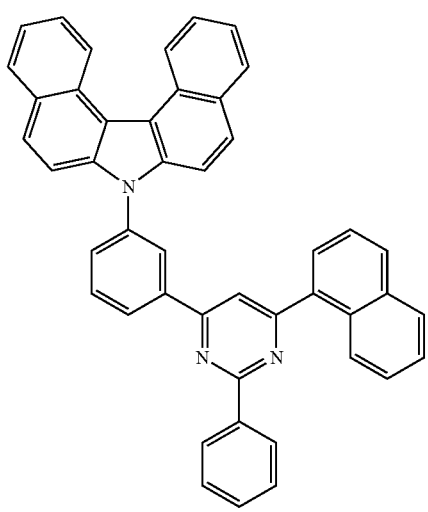
C-63
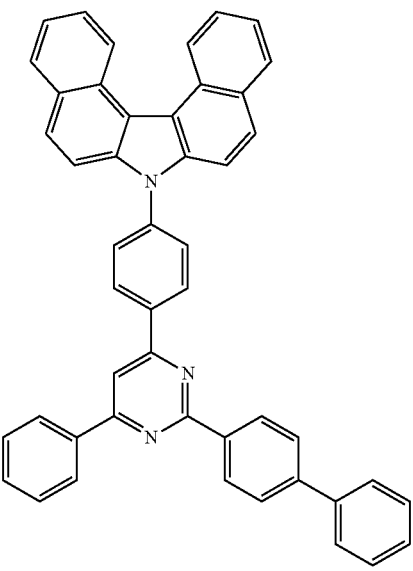
C-61
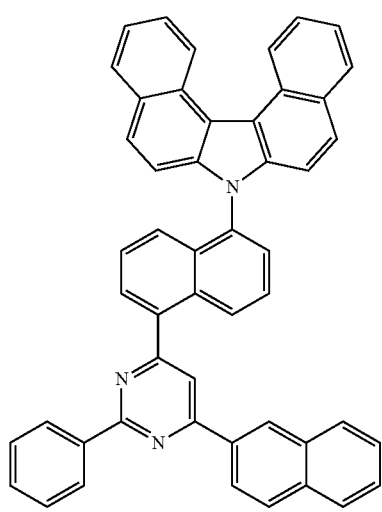
C-64
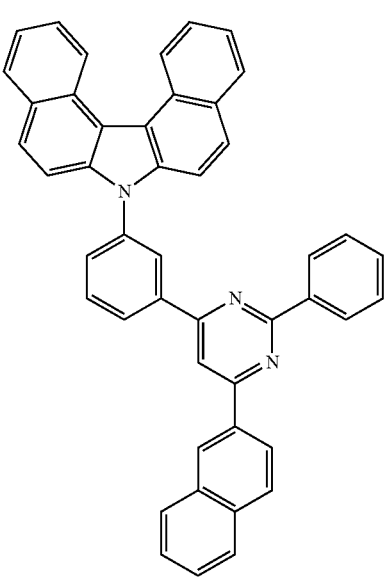
C-62
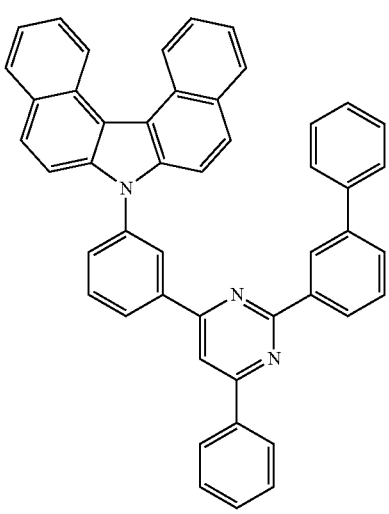
C-65
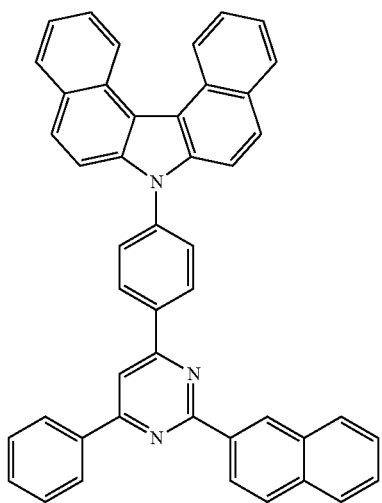

C-66
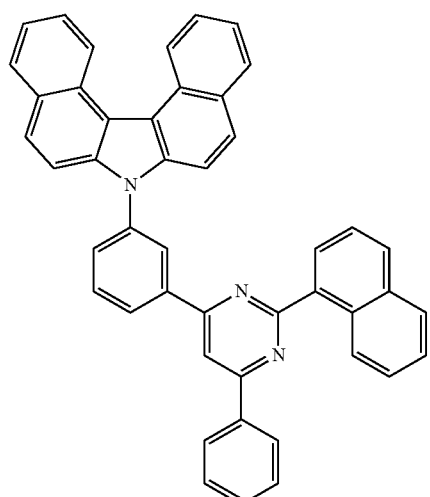
C-67
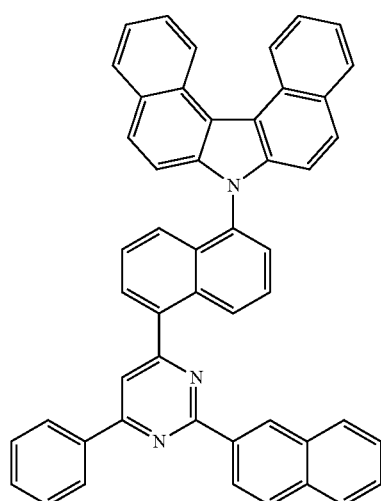
C-68
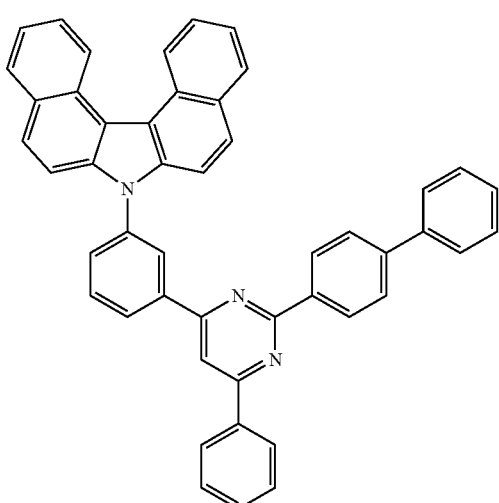
C-69
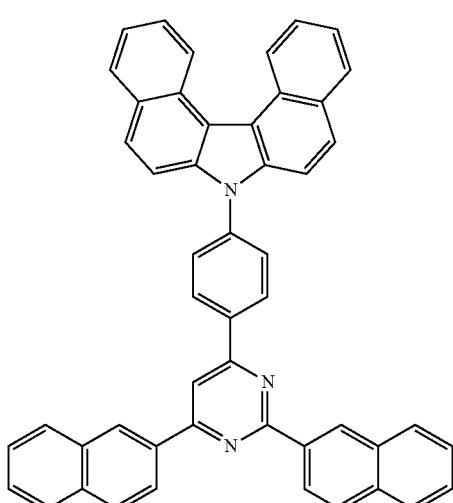
C-70
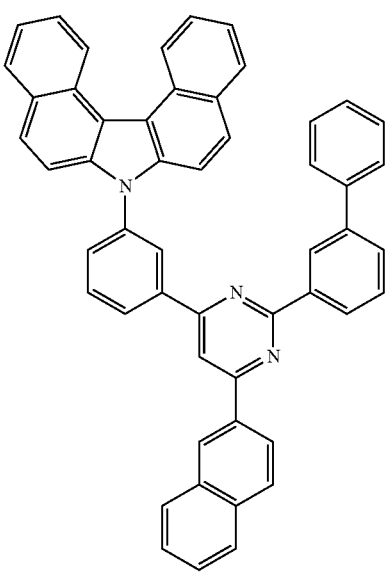
C-71
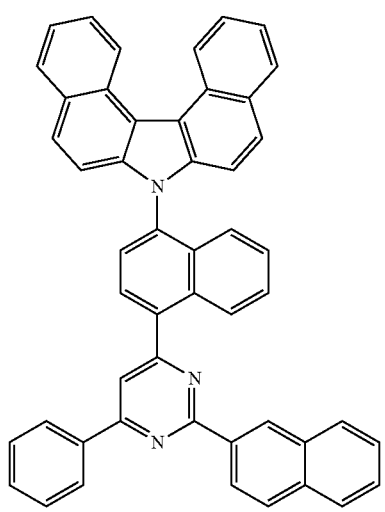

C-72
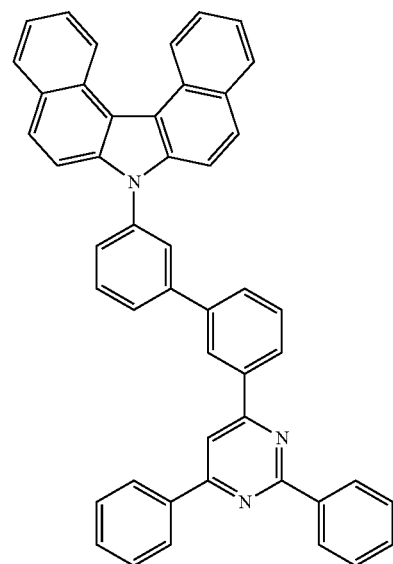
C-75
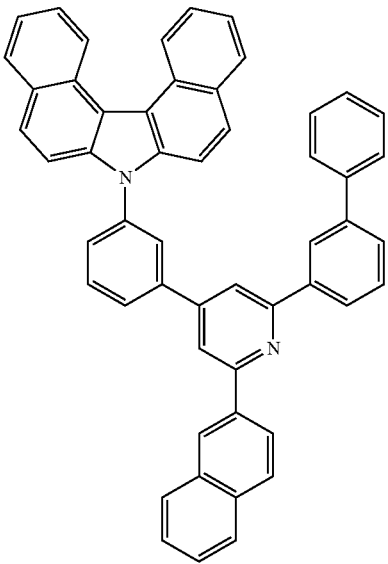
C-73
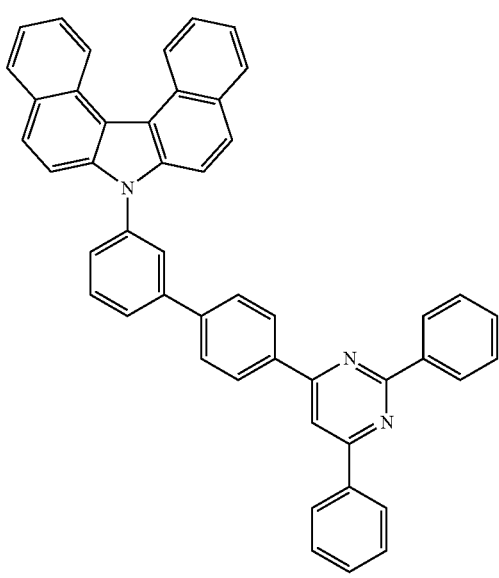
C-76
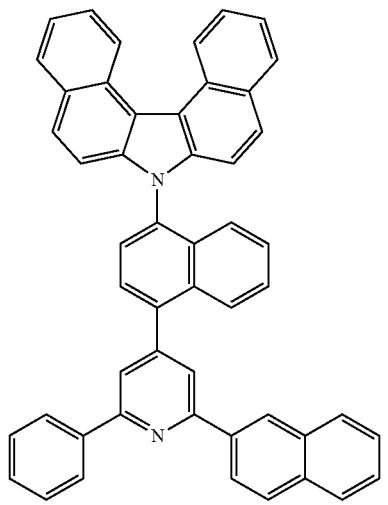
C-74
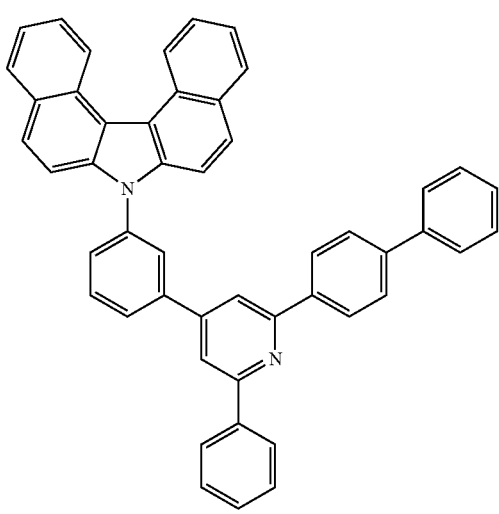
C-77
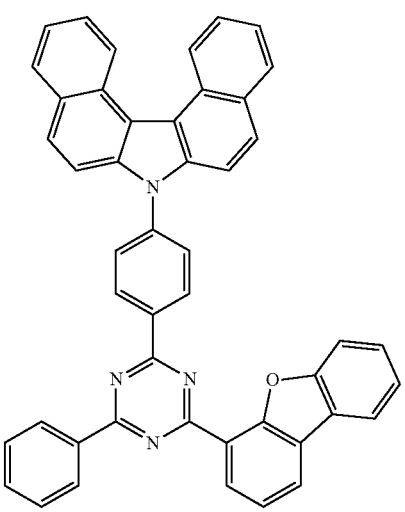

C-78
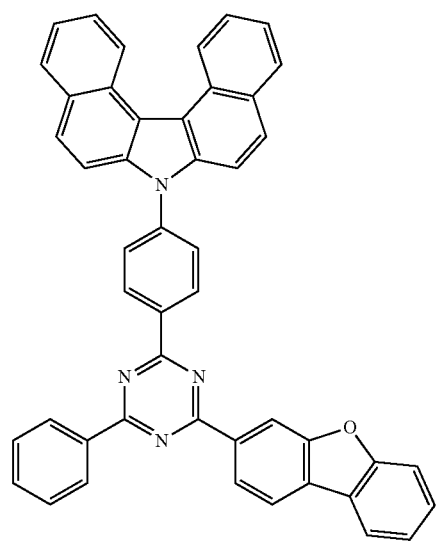
C-79
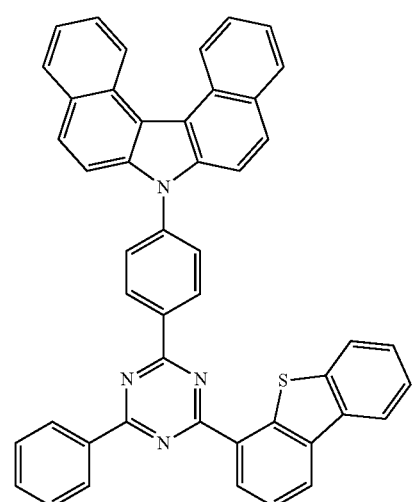
C-80
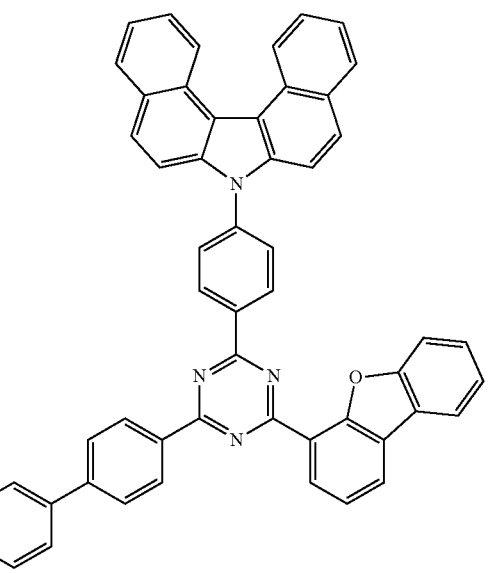
C-81
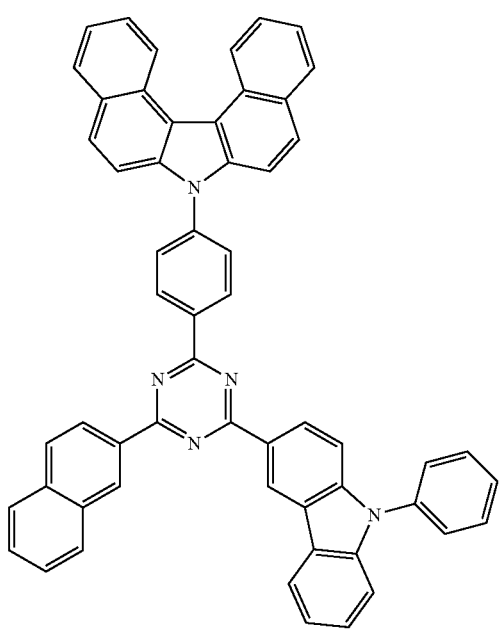
C-82
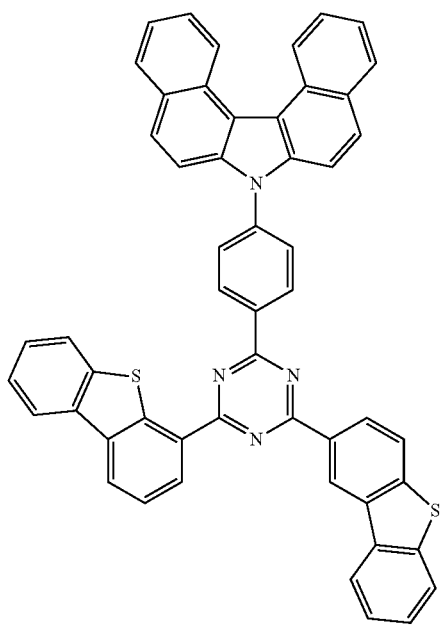

C-83 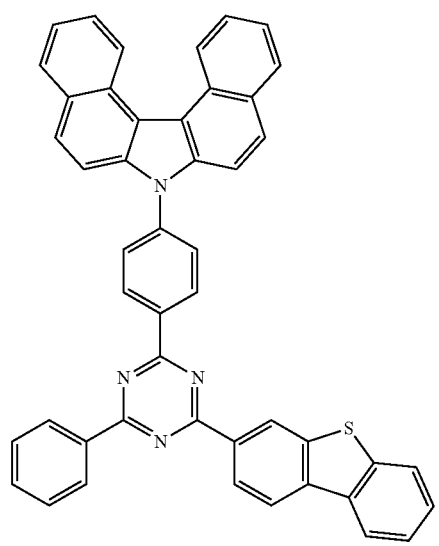
C-84 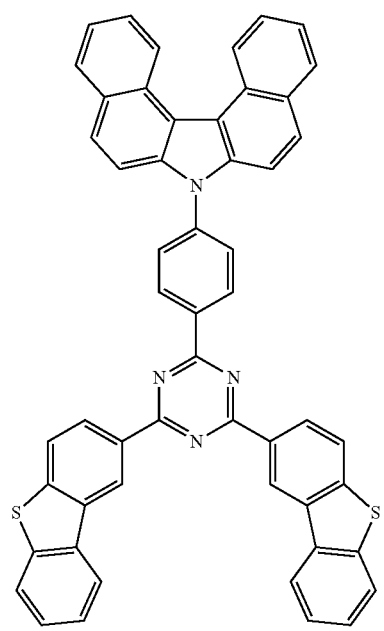
C-85 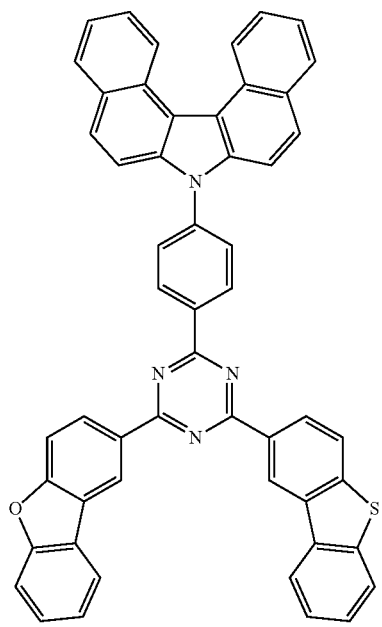
C-86 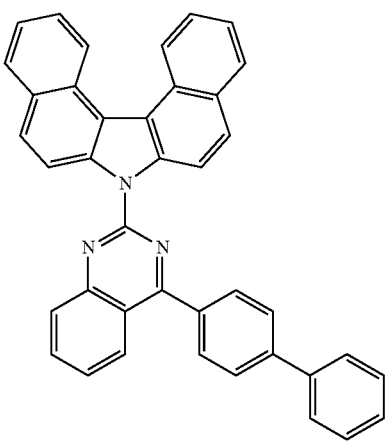
C-87 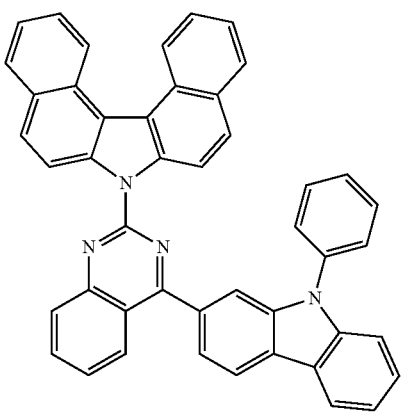

B-88
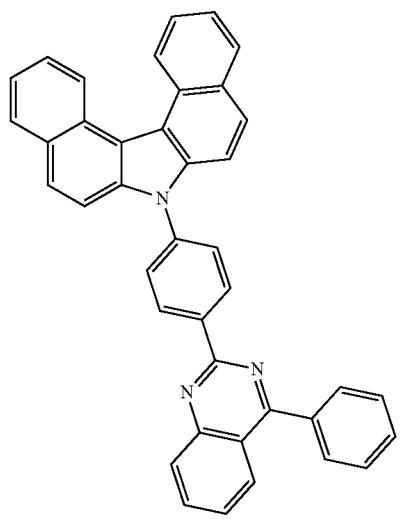
C-89
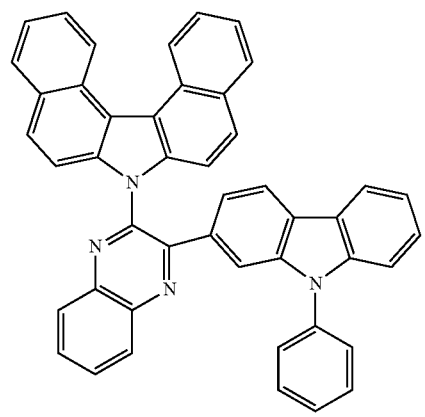
C-90
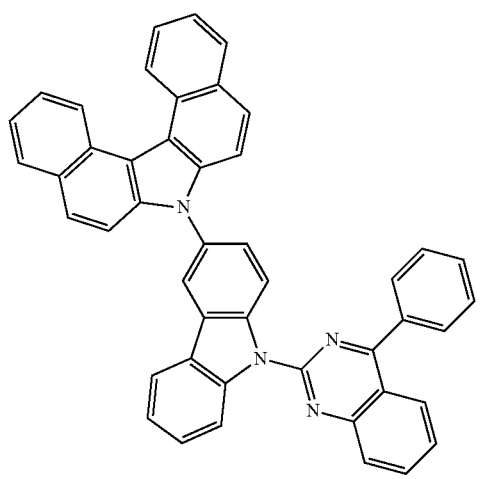
C-91
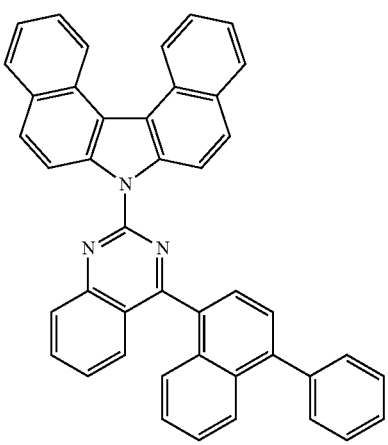
C-92
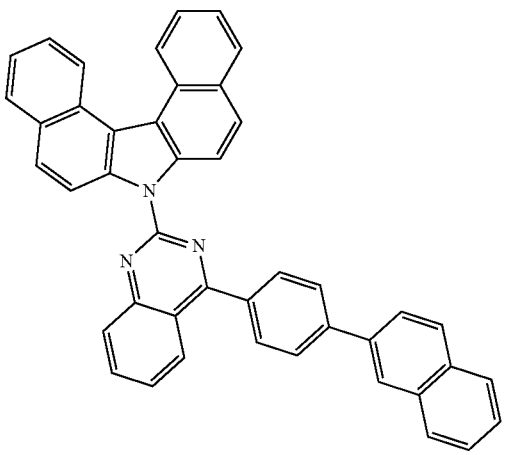
C-93
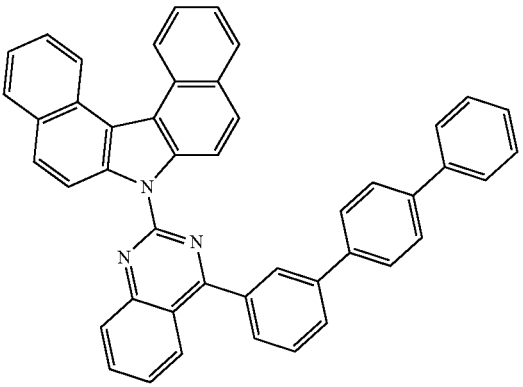

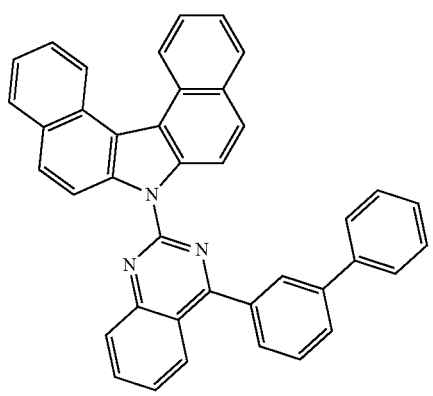
C-94
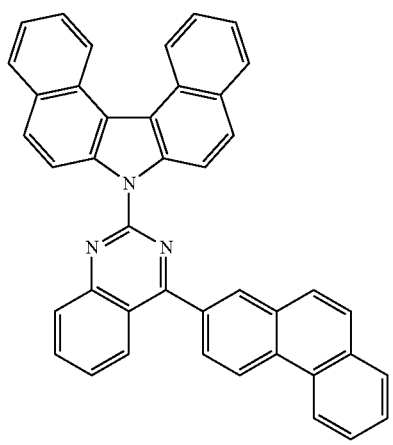
C-95
C-96
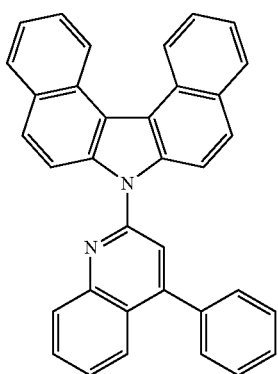
C-97
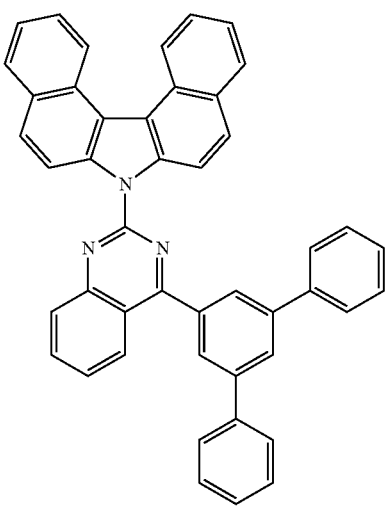
C-98
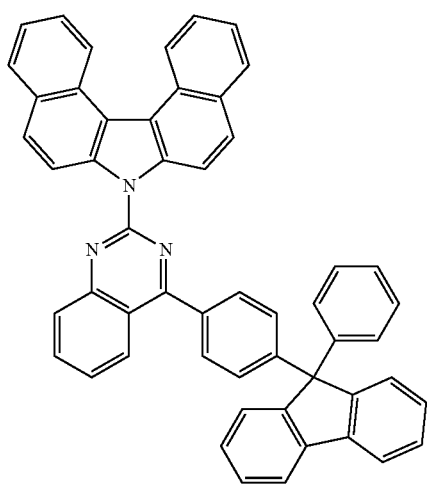
C-99
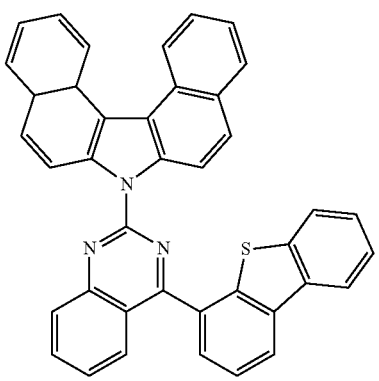
C-100

C-101
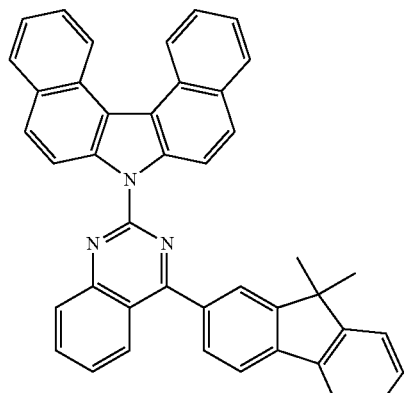
C-104
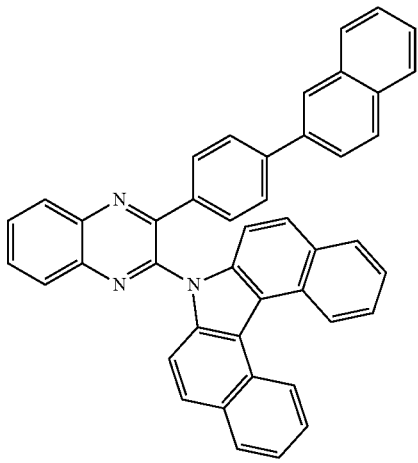
C-102
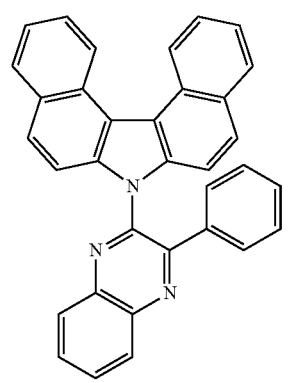
C-105
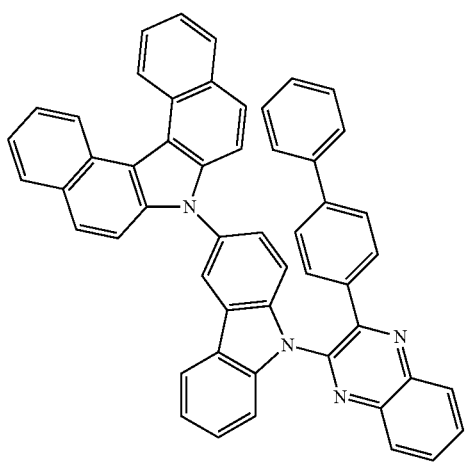
C-103
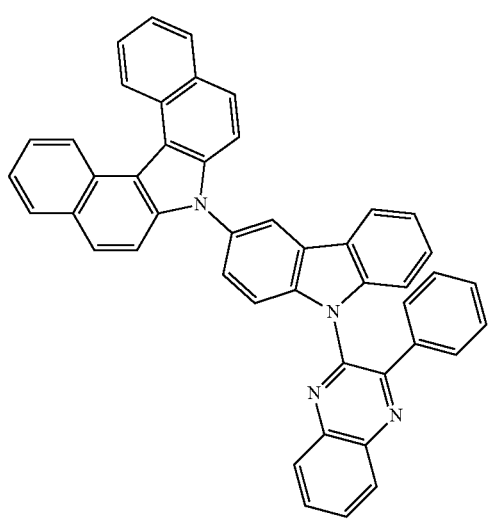
C-106
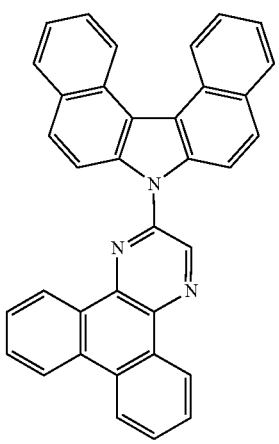

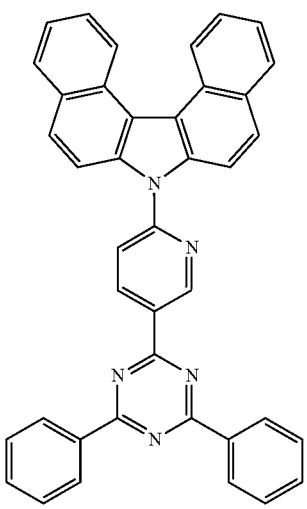
C-107
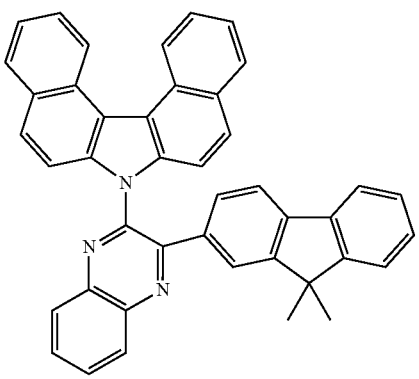
C-110
C-108
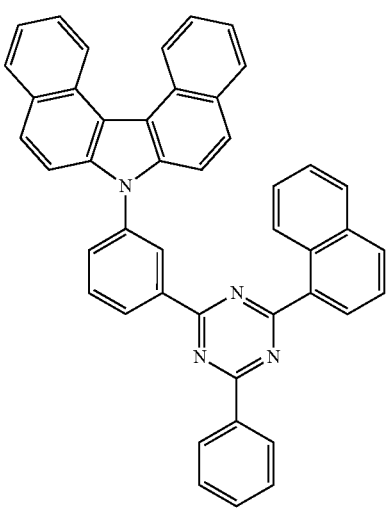
C-112
C-109
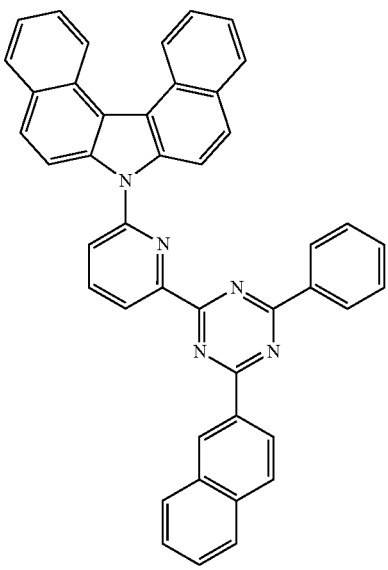
C-113

C-114

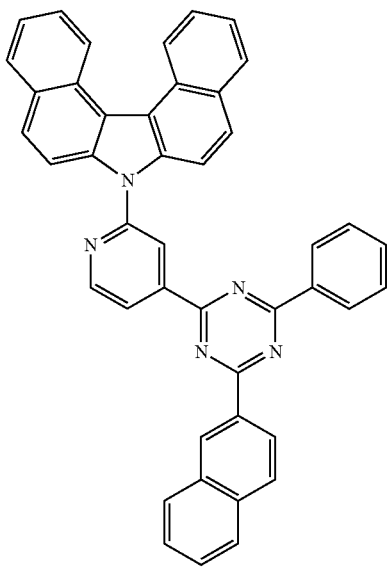

C-116

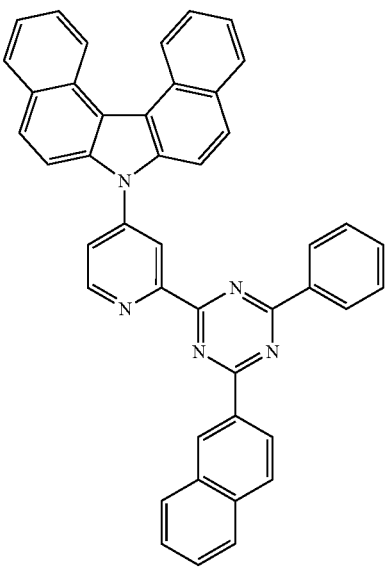

C-117

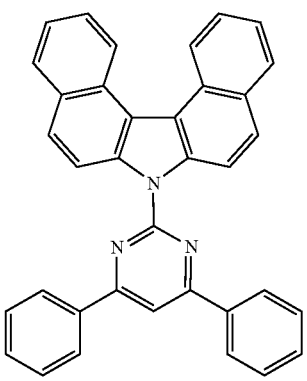

C-115

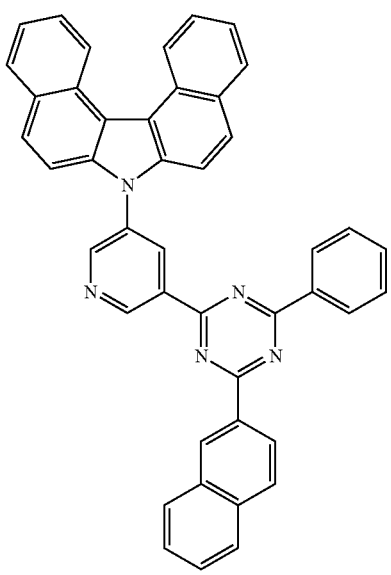

The organic electroluminescent device of the present disclosure comprises an anode; a cathode; and at least one light-emitting layer disposed between the anode and cathode, wherein the light-emitting layer comprises a host and a phosphorescent dopant; the host comprises a plurality of host compounds; and at least a first host compound of the plurality of host compounds is represented by formula 1, which has an amine-carbazole structure substituted with naphthyl-phenyl and aryl, and a second host compound is represented by formula 2, which has a di-C-benzocarbazole structure comprising a nitrogen-containing heteroaryl.

The light-emitting layer indicates a layer from which light is emitted, and may be a single layer or a multiple layer deposited by two or more layers. It is preferable that a doping amount of the dopant compound is less than 20 wt % based on the total amount of the host compound and the dopant compound.

The dopant to be comprised in the organic electroluminescent device of the present disclosure is preferably at least one phosphorescent dopant. The phosphorescent dopant material for the organic electroluminescent device of the present disclosure is not limited, but may be preferably selected from metallated complex compounds of iridium (Ir), osmium (Os), copper (Cu) and platinum (Pt), more preferably selected from ortho-metallated complex compounds of iridium (Ir), osmium (Os), copper (Cu) and platinum (Pt), and even more preferably ortho-metallated iridium complex compounds.

Preferably, the phosphorescent dopant may be selected from the group consisting of compounds represented by the following formulas 101 to 103.

(101)
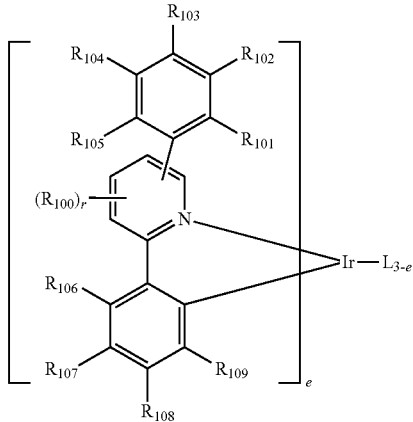

(102)
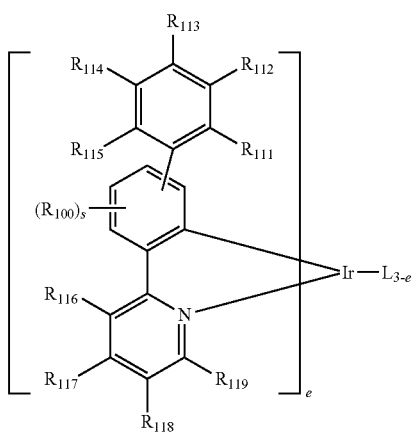

(103)
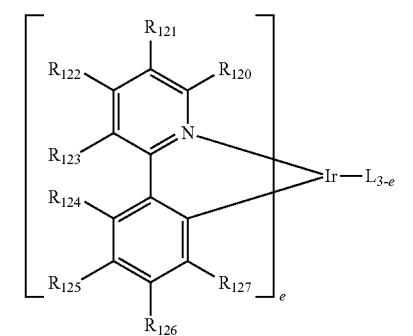

wherein L is selected from the following structures:

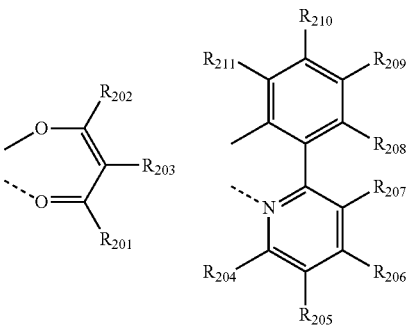

$R_{100}$ represents hydrogen, or a substituted or unsubstituted (C1-C30)alkyl; $R_{101}$ to $R_{109}$, and $R_{111}$ to $R_{123}$, each independently, represent hydrogen, deuterium, a halogen, a (C1-C30)alkyl unsubstituted or substituted with deuterium or a halogen, a cyano, a substituted or unsubstituted (C1-C30)alkoxy, a substituted or unsubstituted (C3-C30)cycloalkyl, or a substituted or unsubstituted (C6-C30)aryl; $R_{106}$ to $R_{109}$ may be linked to an adjacent substituent(s) to form a substituted or unsubstituted mono- or polycyclic (C3-C30), alicyclic or (hetero)aromatic ring, e.g., a dibenzofuran; $R_{120}$ to $R_{123}$ may be linked to an adjacent substituent(s) to form a substituted or unsubstituted mono- or polycyclic (C3-C30), alicyclic or aromatic ring, e.g., a quinoline; $R_{124}$ to $R_{127}$, each independently, represent hydrogen, deuterium, a halogen, a substituted or unsubstituted (C1-C30)alkyl, or a substituted or unsubstituted (C6-C30)aryl; and where $R_{124}$ to 8127 are aryls, adjacent substituents of $R_{124}$ to $R_{127}$ may be linked to each other to form a substituted or unsubstituted mono- or polycyclic (C3-C30), alicyclic or (hetero)aromatic ring, e.g., a fluorene, a dibenzothiophene, or a dibenzofuran; $R_{201}$ to $R_{211}$, each independently, represent hydrogen, deuterium, a halogen, a (C1-C30)alkyl unsubstituted or substituted with deuterium or a halogen, or a (C6-C30)aryl unsubstituted or substituted with deuterium or an alkyl; and $R_{208}$ to $R_{211}$ may be linked to an adjacent substituent(s) to form a substituted or unsubstituted mono- or polycyclic (C3-C30), alicyclic or aromatic or heteroaromatic ring, e.g., a fluorene, a dibenzothiophene, or a dibenzofuran; r and s, each independently, represent an integer of 1 to 3; where r or s is an integer of 2 or more, each of $R_{100}$ may be the same or different; and e represents an integer of 1 to 3.

Specifically, the phosphorescent dopant material includes the following:

D-1
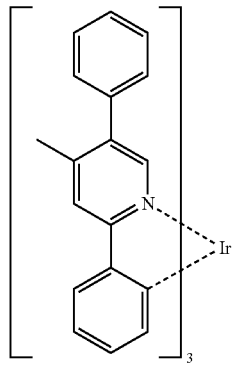

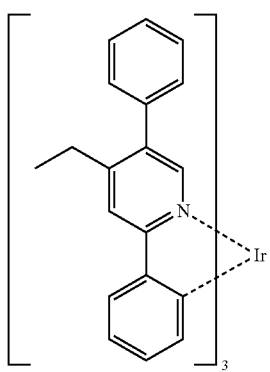
D-2
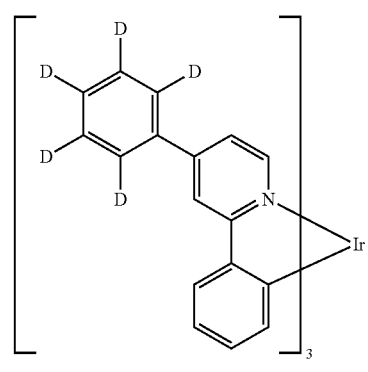
D-6
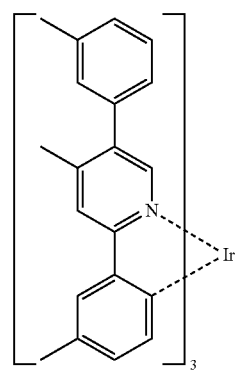
D-3
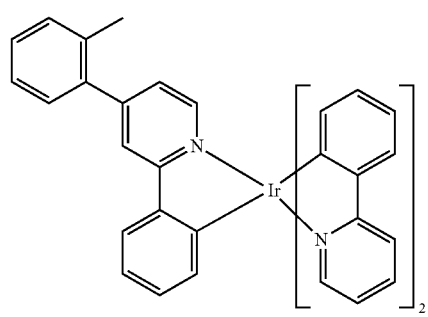
D-7
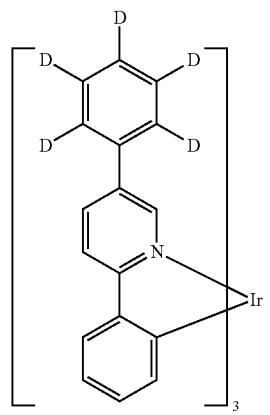
D-4
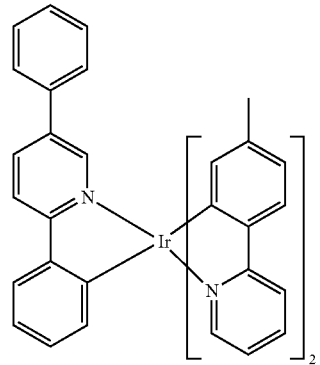
D-8
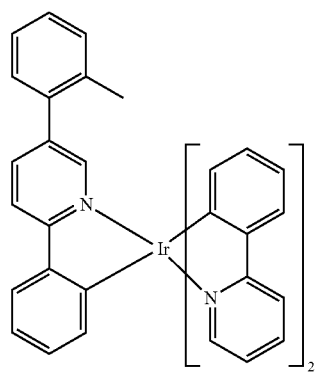
D-5
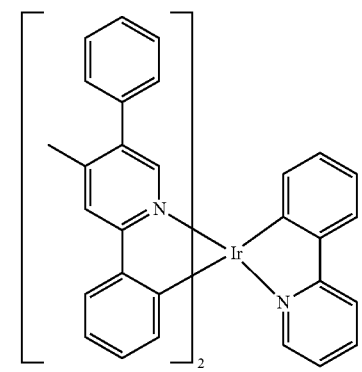
D-9

D-10
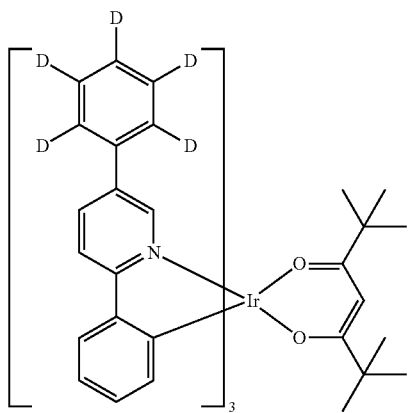
D-11
D-12
D-13
D-14
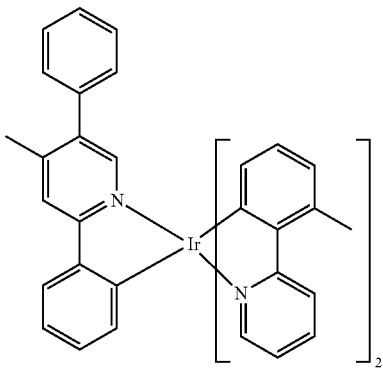
D-15
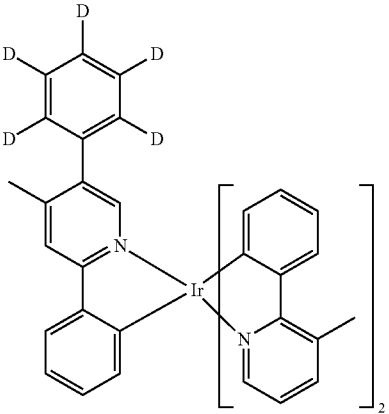
D-16
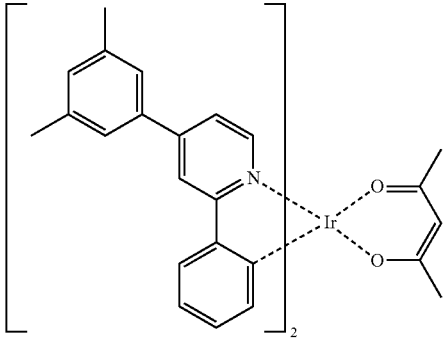
D-17
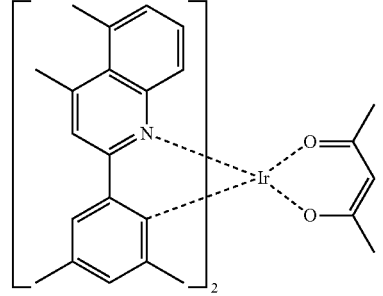

-continued
D-18
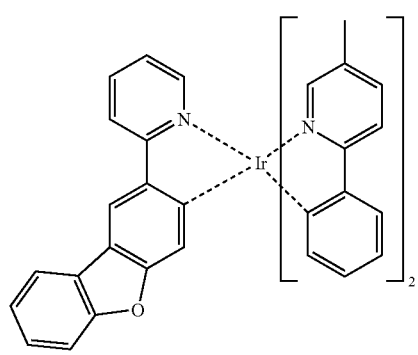
D-19
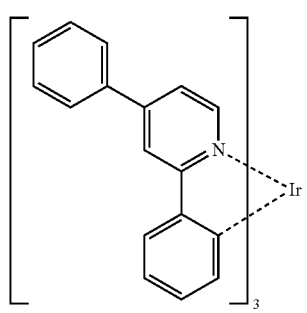
D-20
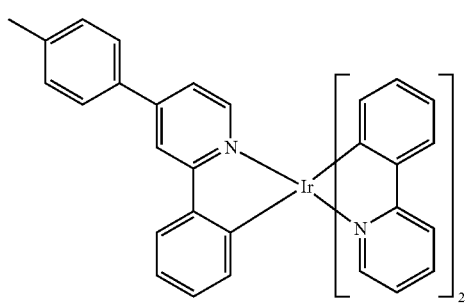
D-21
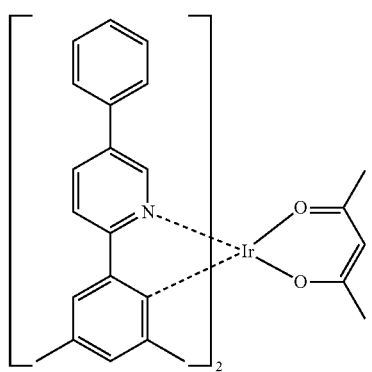
-continued
D-22
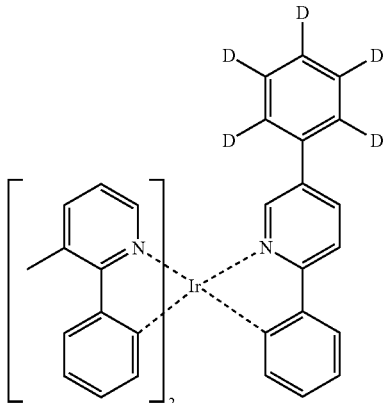
D-23
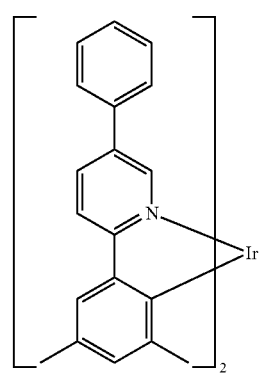
D-24
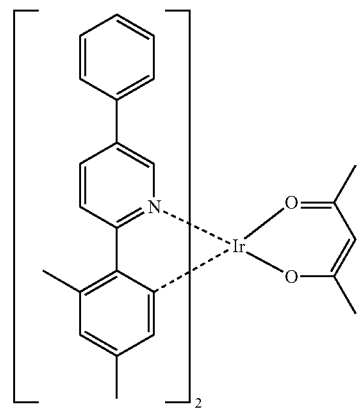
D-25
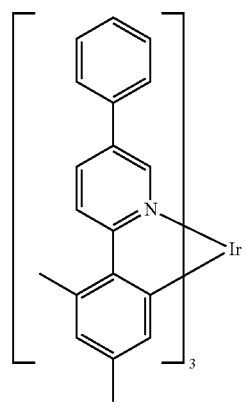

D-26 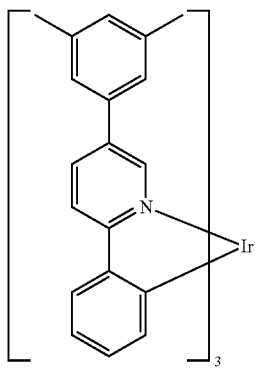
D-30 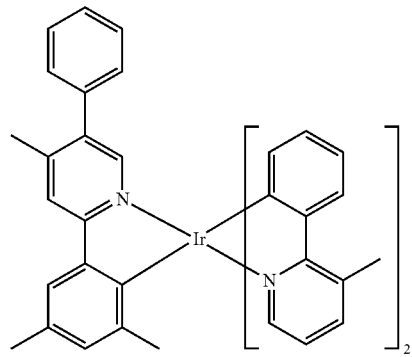
D-27 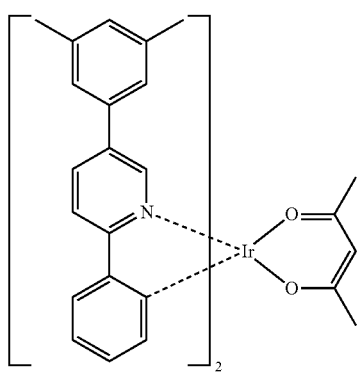
D-31 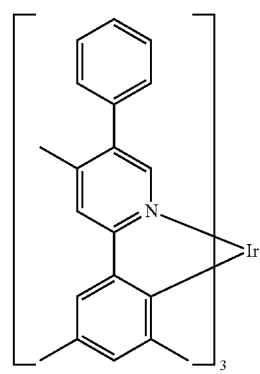
D-28 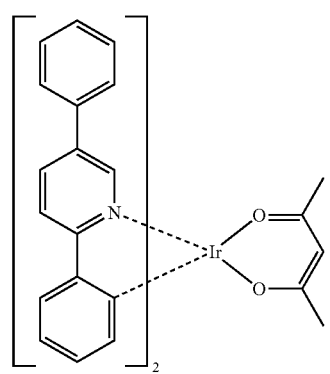
D-32 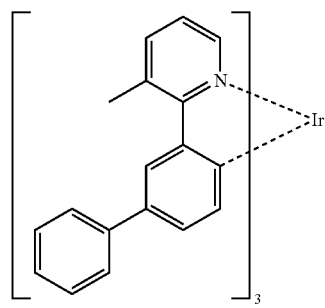
D-29 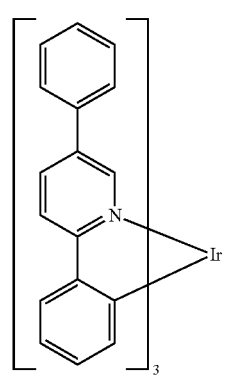
D-33 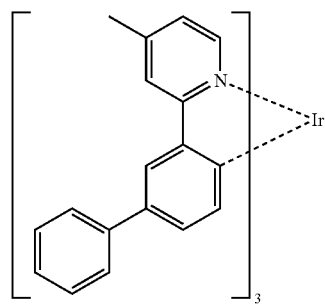

D-34
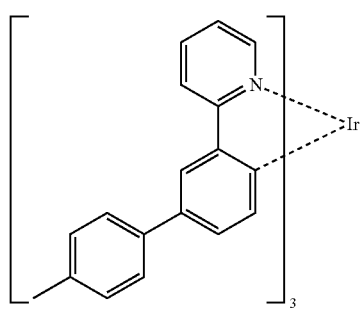
D-35
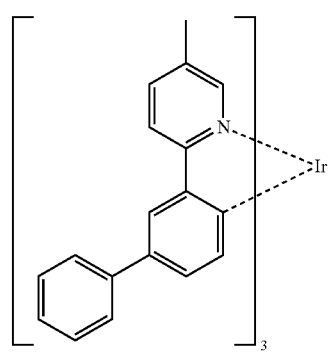
D-36
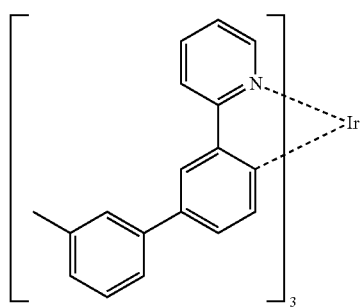
D-37
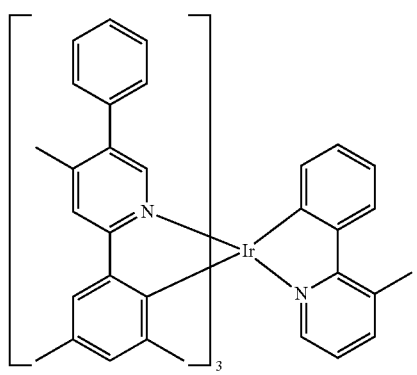
D-38
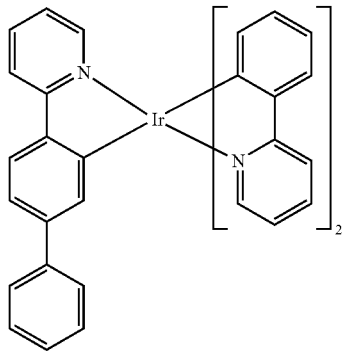
D-39
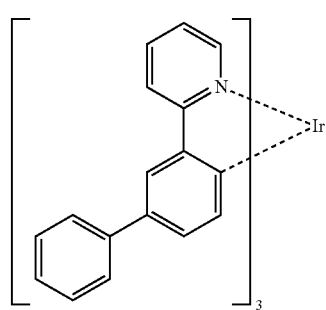
D-40
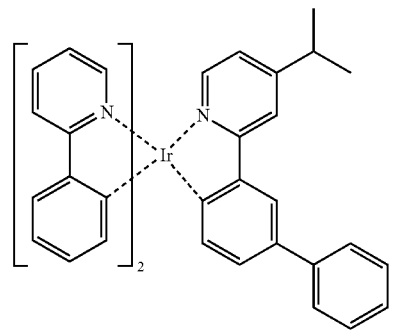
D-41
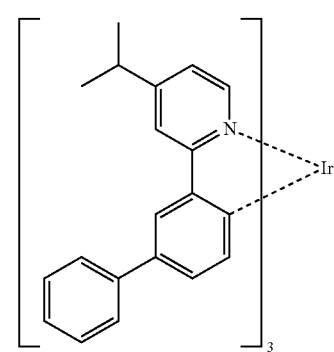
D-42
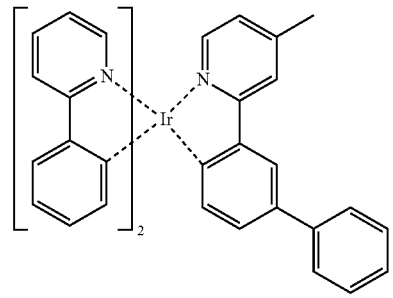

D-43 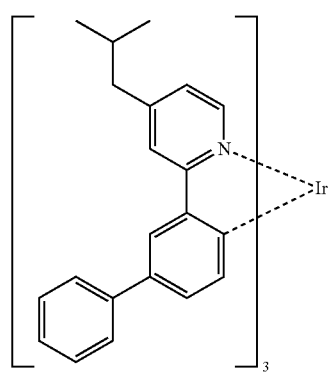
D-47 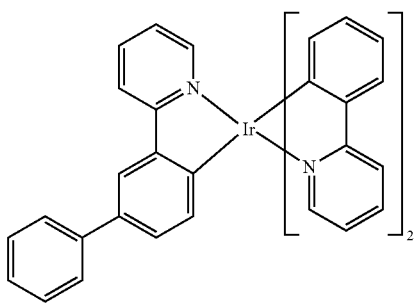
D-44 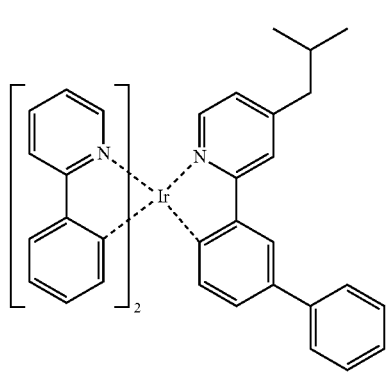
D-48 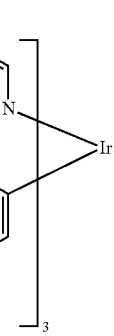
D-45 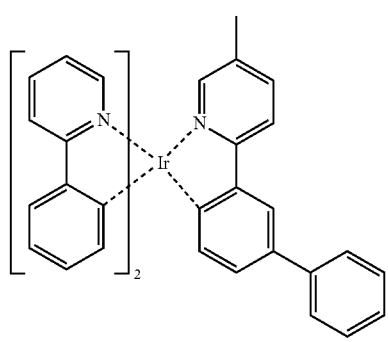
D-49 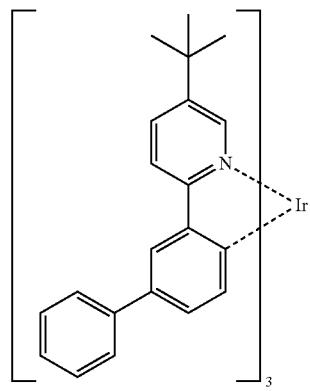
D-46 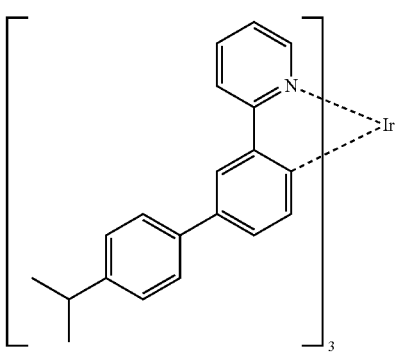
D-50 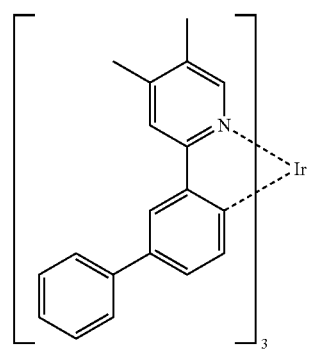

D-51
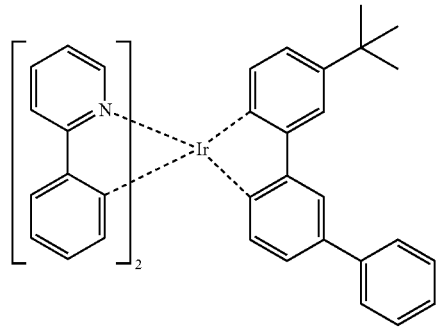
D-52
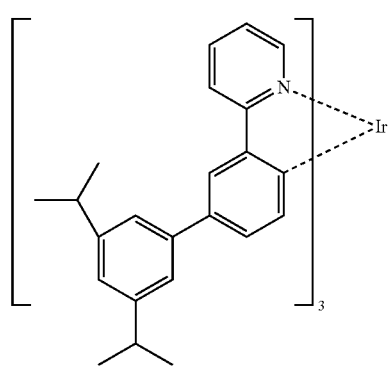
D-53
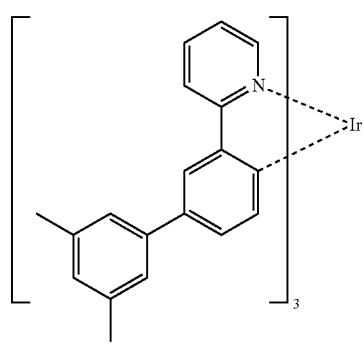
D-54
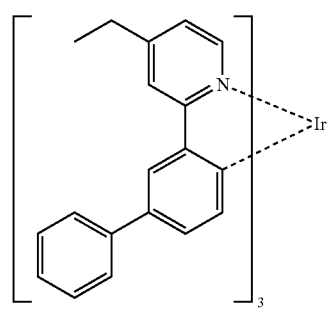
D-55
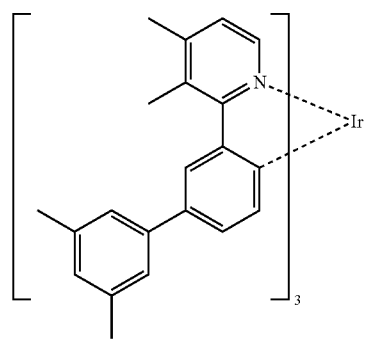
D-56
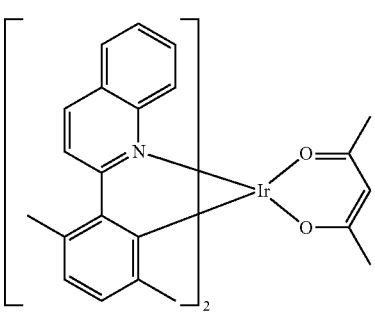
D-57
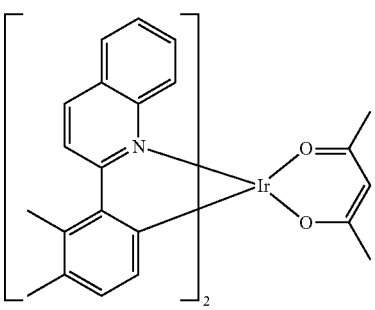
D-58
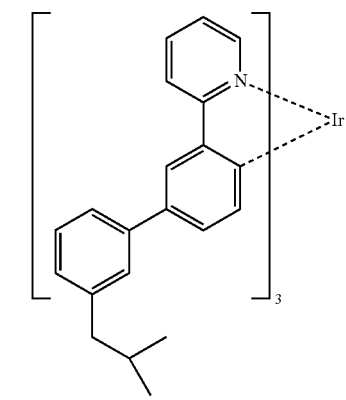

-continued
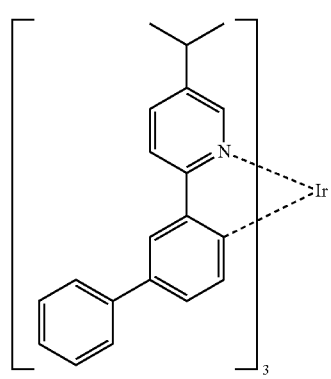 D-59
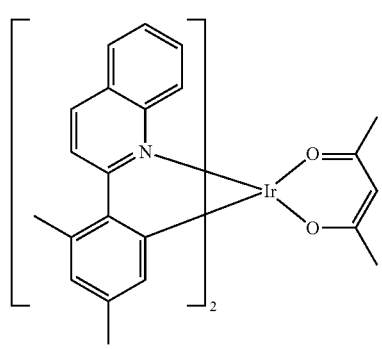 D-60
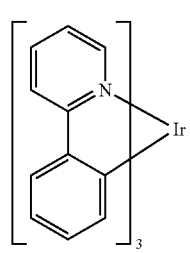
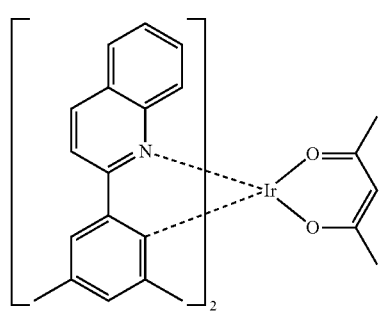 D-62
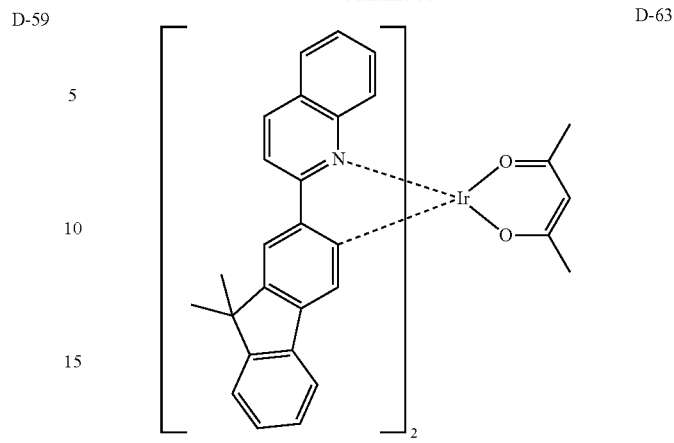 D-63
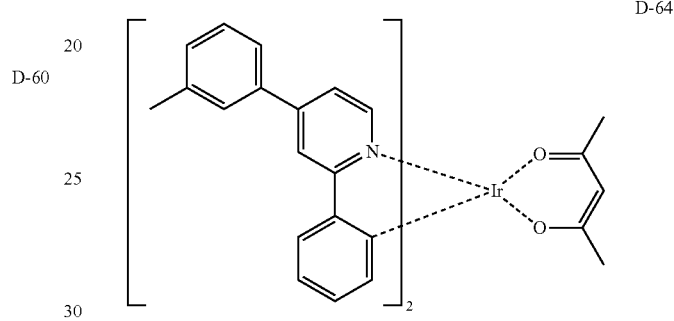 D-64
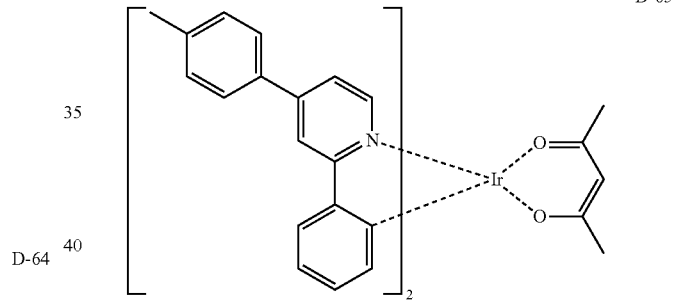 D-65
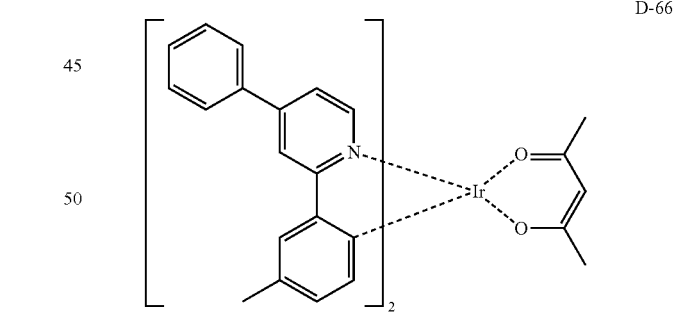 D-66
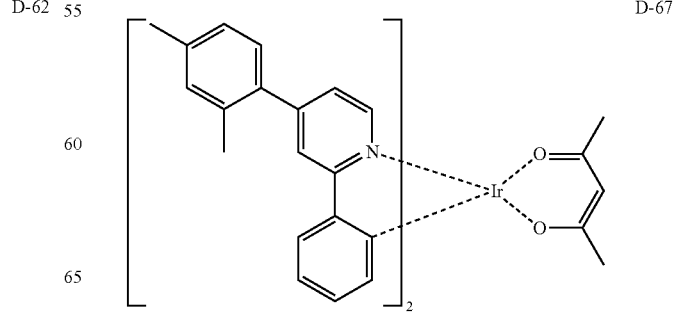 D-67

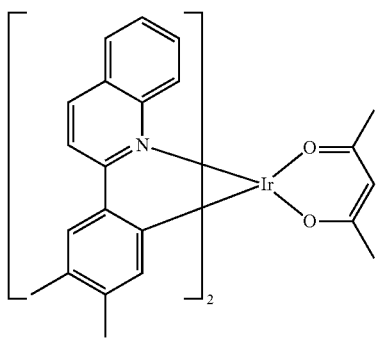
D-68
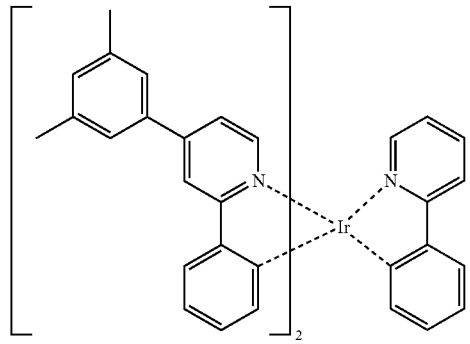
D-72
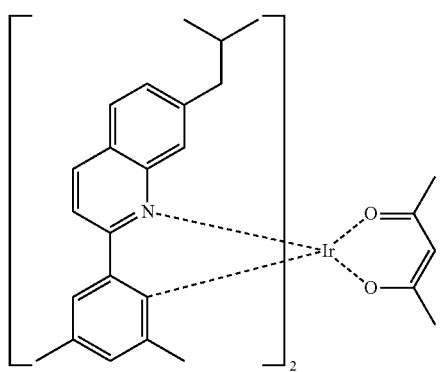
D-69
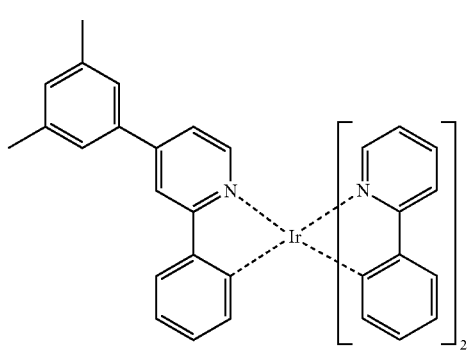
D-73
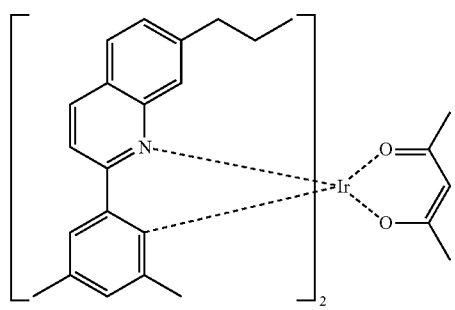
D-70
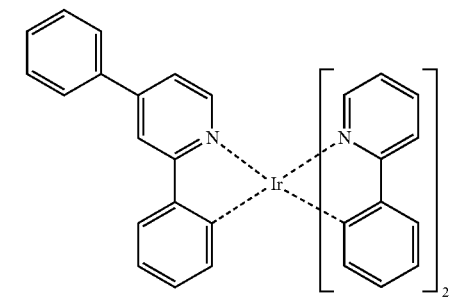
D-74
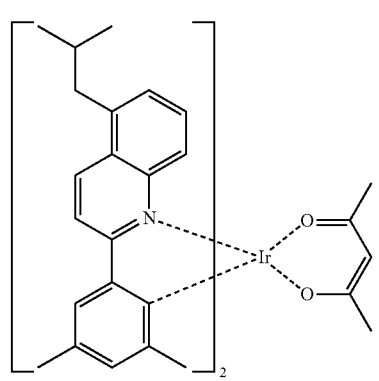
D-71
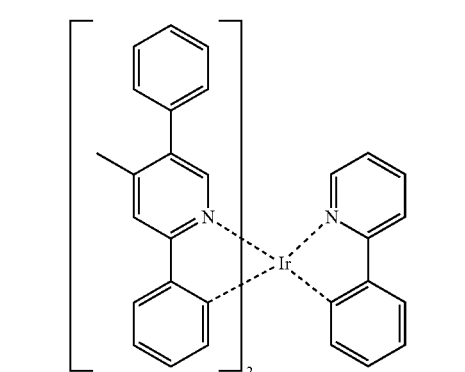
D-75

D-76
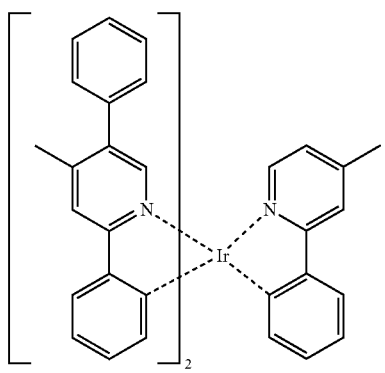
D-77
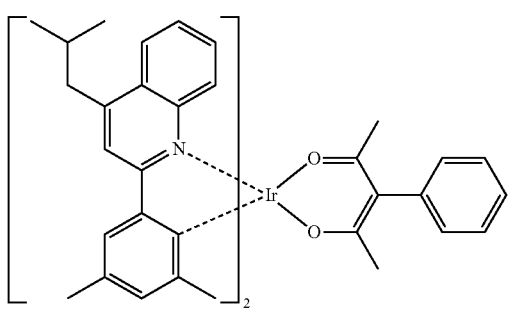
D-78
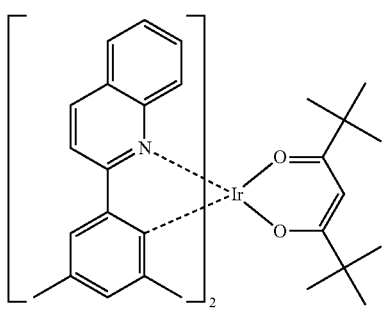
D-79
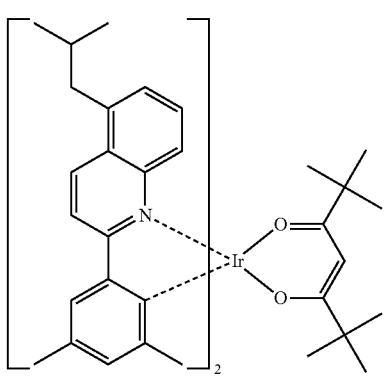
D-80
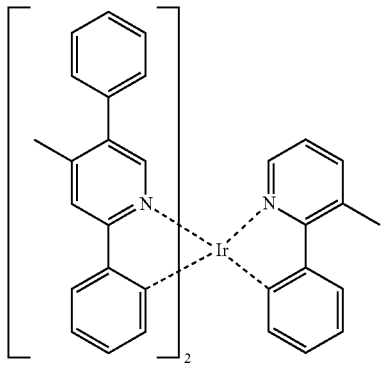
D-81
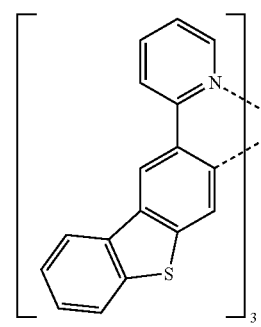
D-82
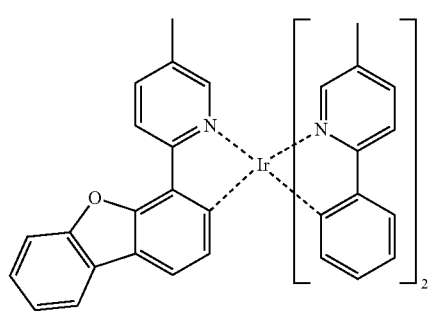
D-83
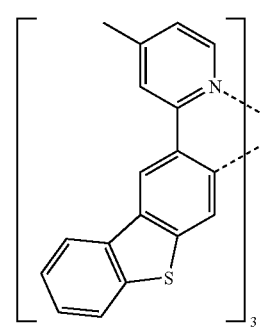
D-84
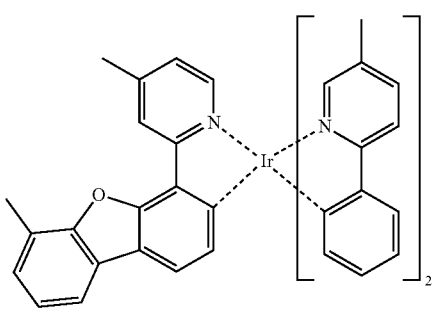

-continued
D-85
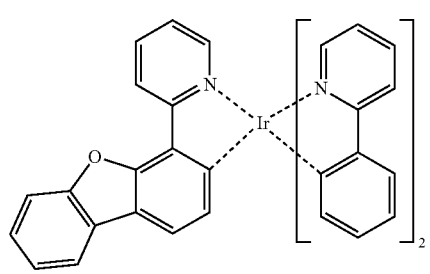
D-86
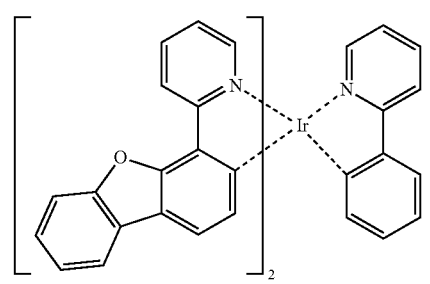
D-87
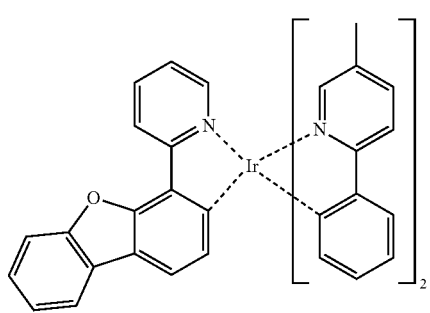
D-88
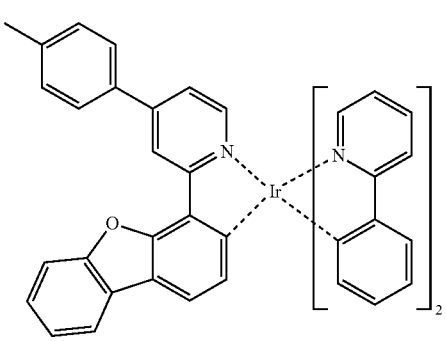
D-89
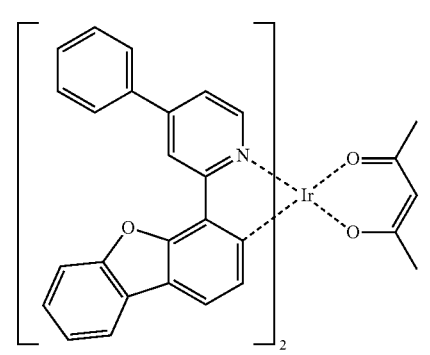
-continued
D-90
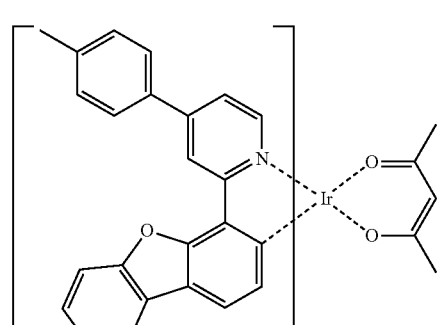
D-91
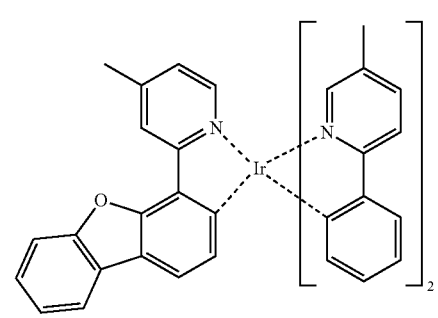
D-92
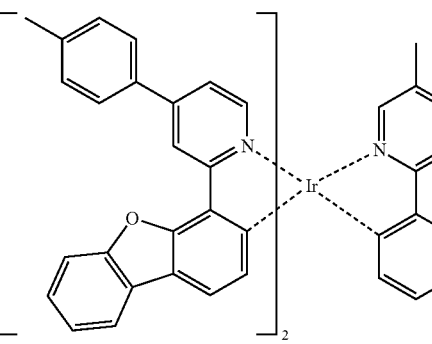
D-93
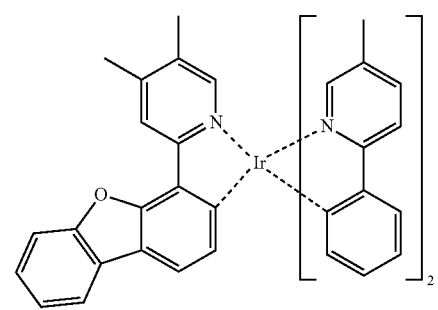
D-94
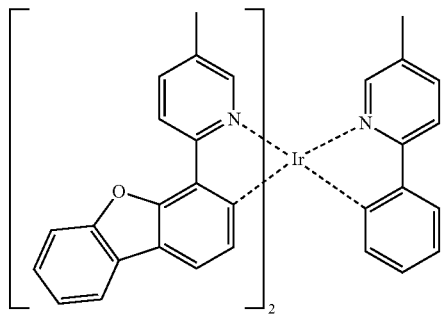

D-95
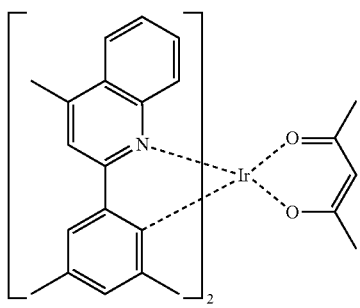
D-96
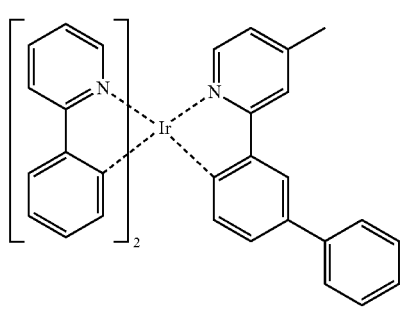
D-97
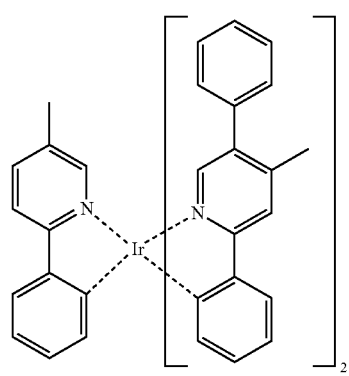
D-98
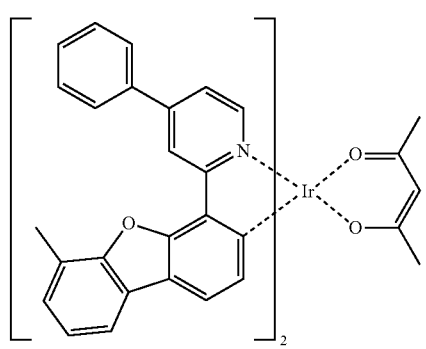
D-99
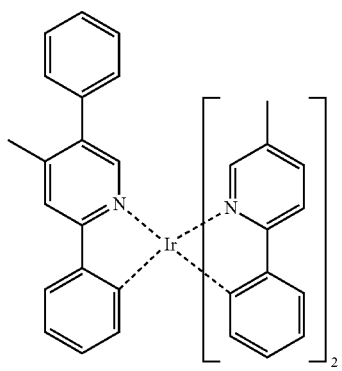
D-100
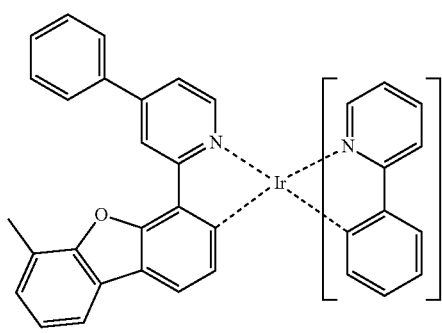
D-101
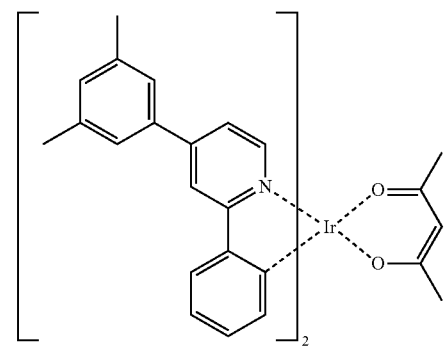
D-102
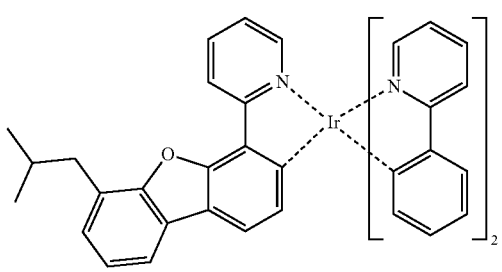

D-103
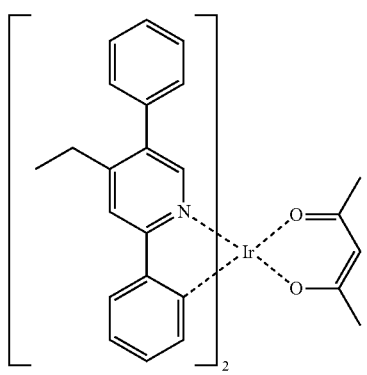
D-107
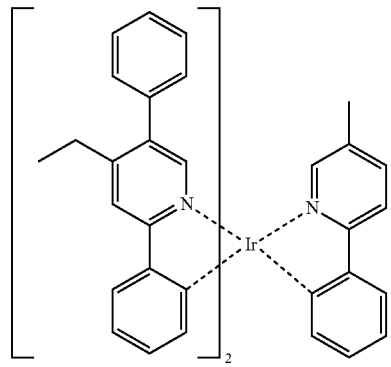
D-104
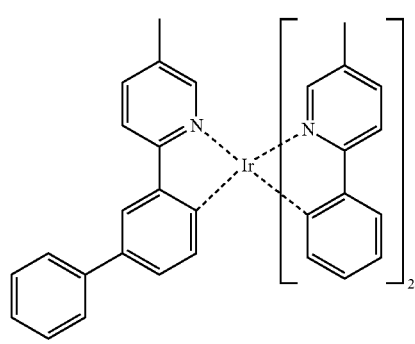
D-108
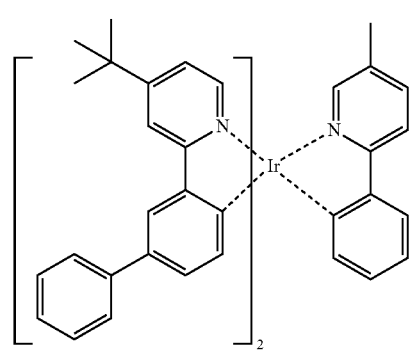
D-105
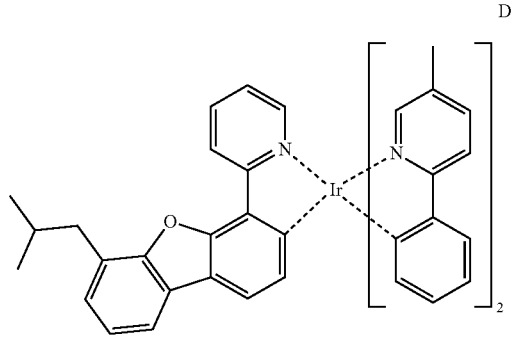
D-109
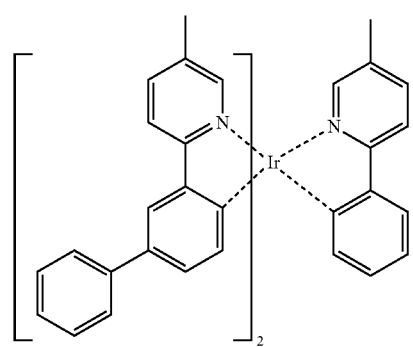
D-106
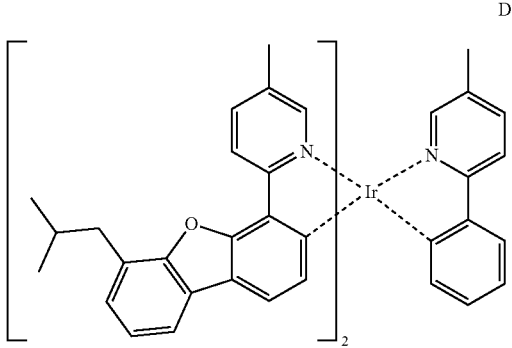
D-110
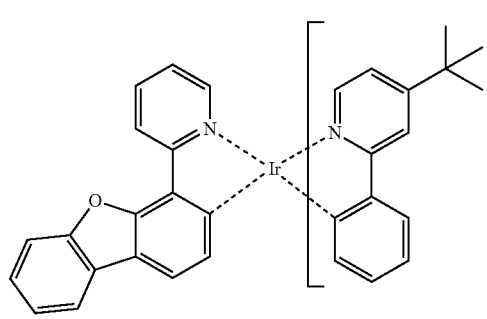

D-111 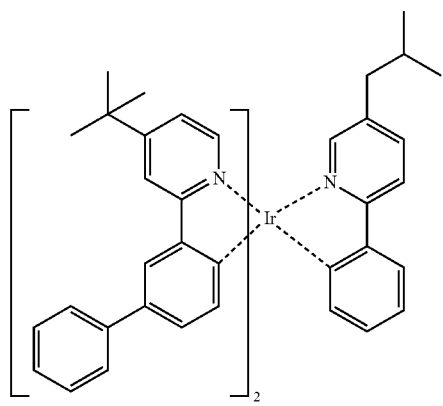
D-112 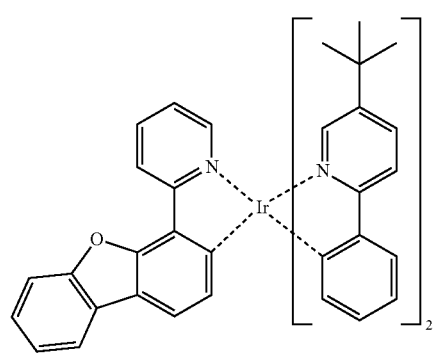
D-113 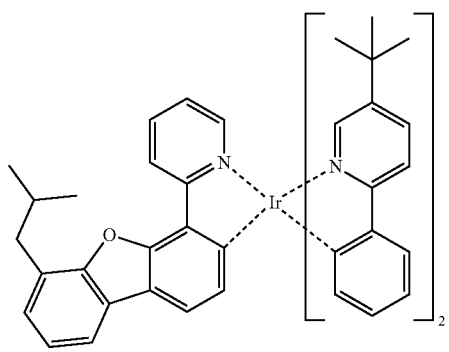
D-114 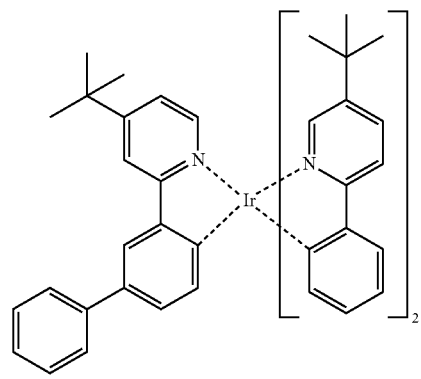
D-115 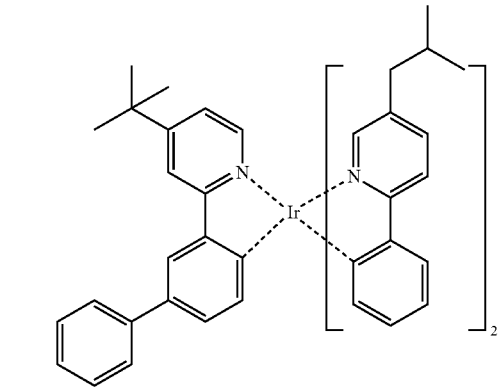
D-116 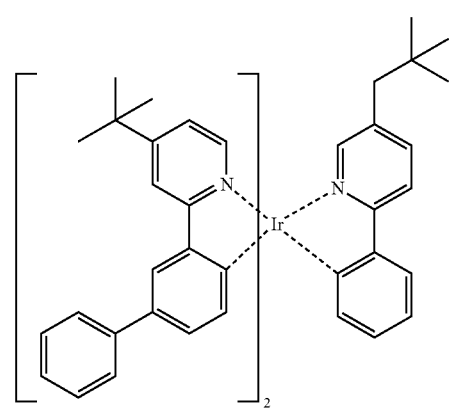
D-117 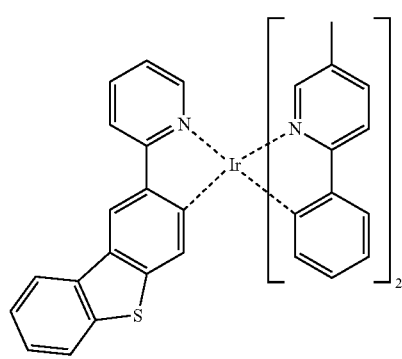
D-118 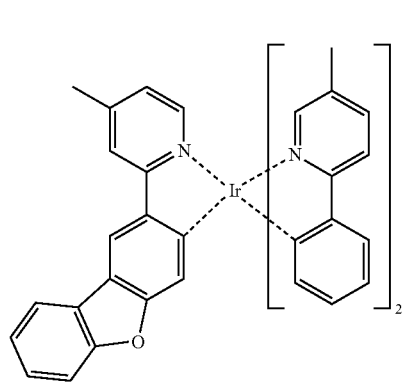

-continued
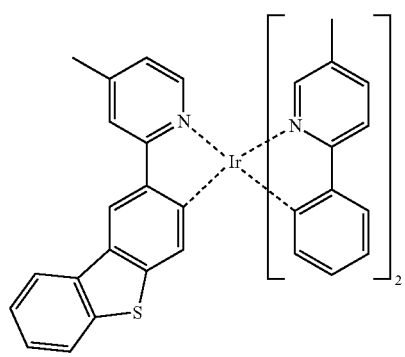
D-119
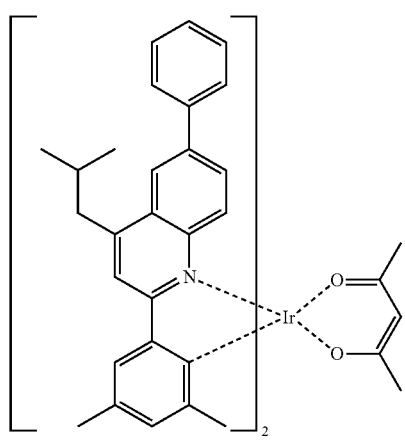
D-120
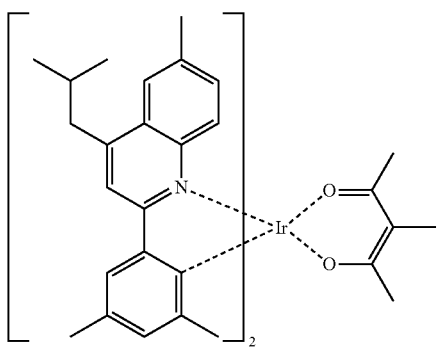
D-121
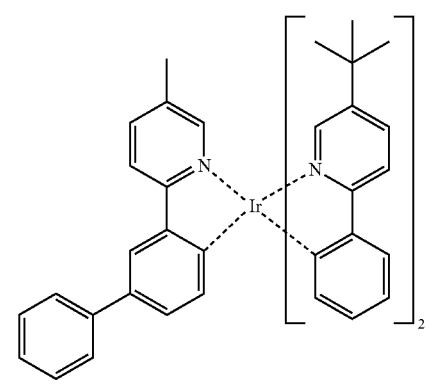
D-122
-continued
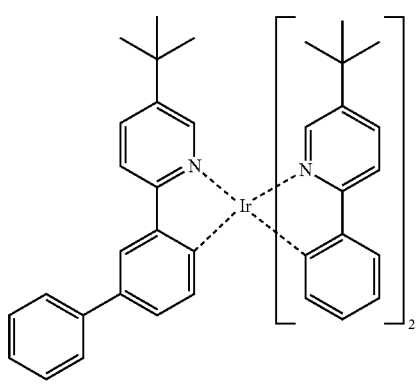
D-123
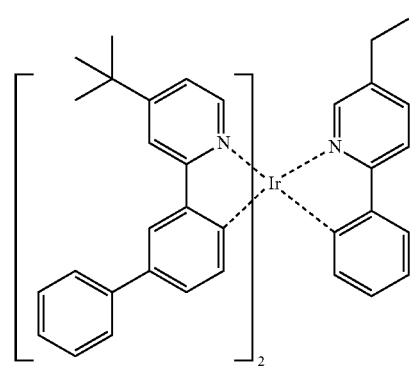
D-124
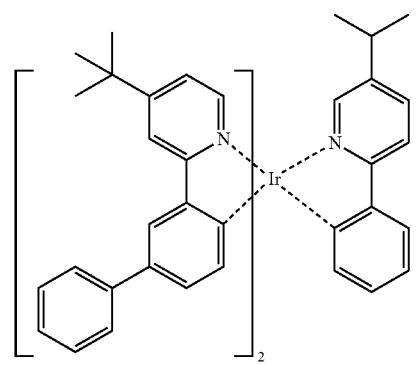
D-125
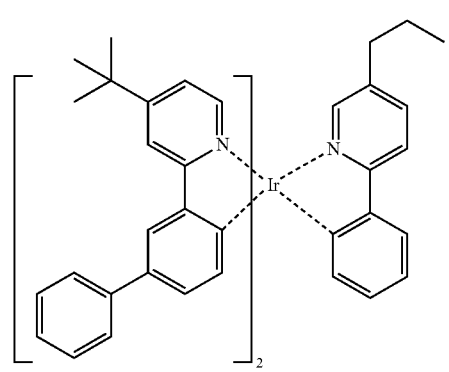
D-126

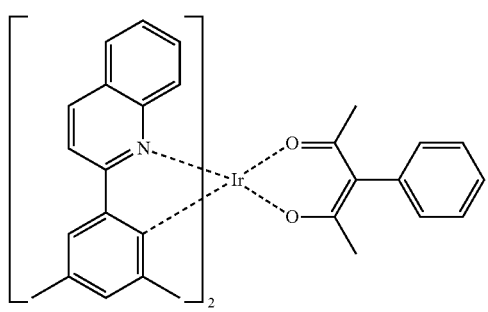
D-127
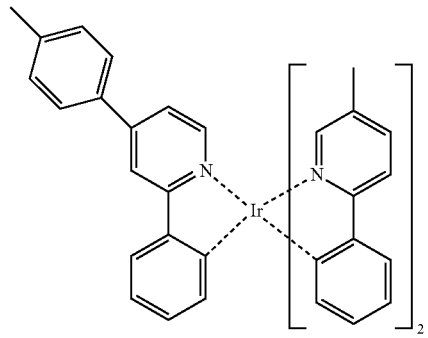
D-131
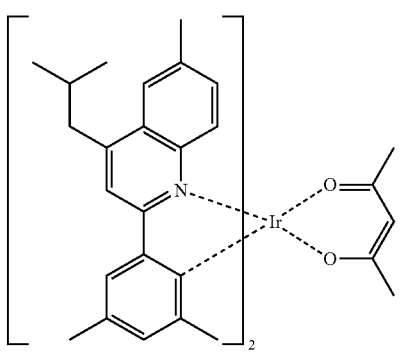
D-128
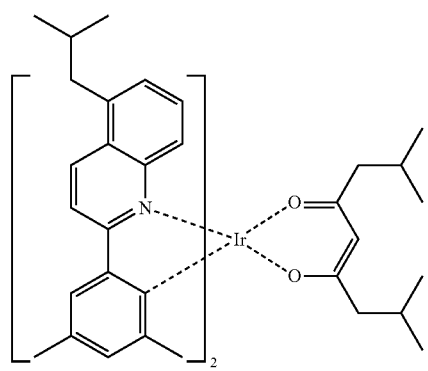
D-132
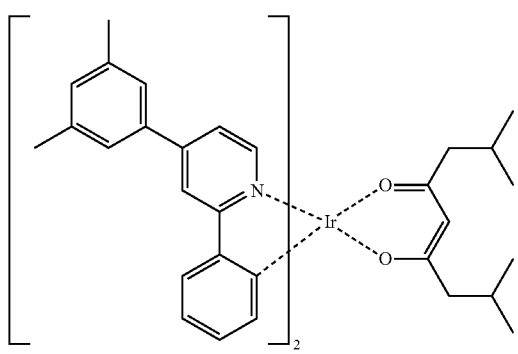
D-129
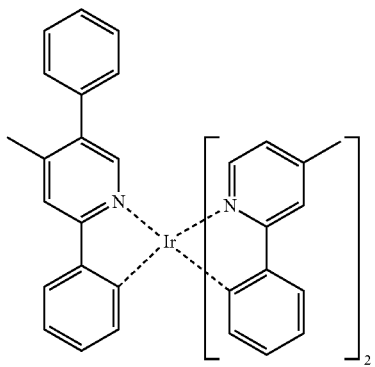
D-133
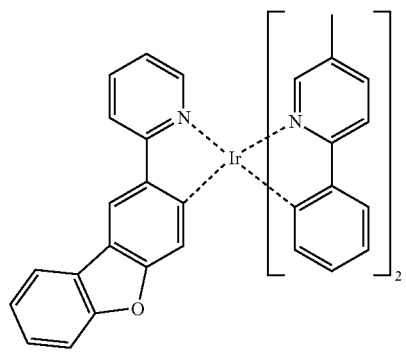
D-130
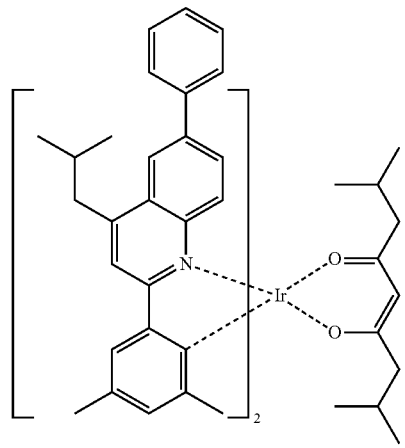
D-134

D-135
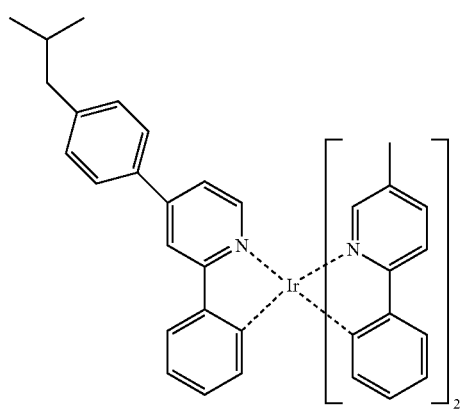
D-136
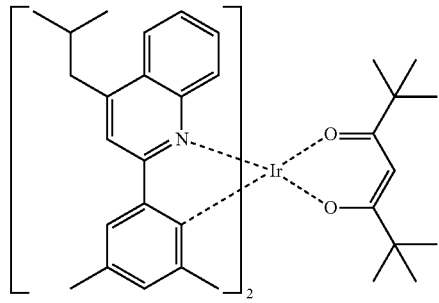
D-137
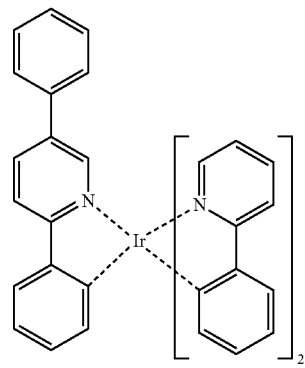
D-138
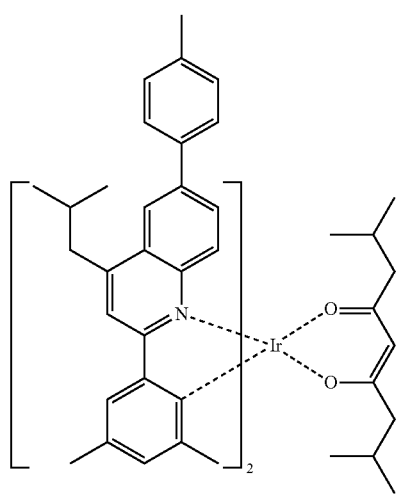
D-139
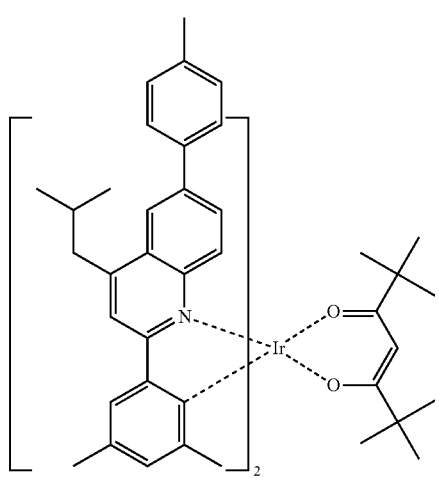
D-140
D-141
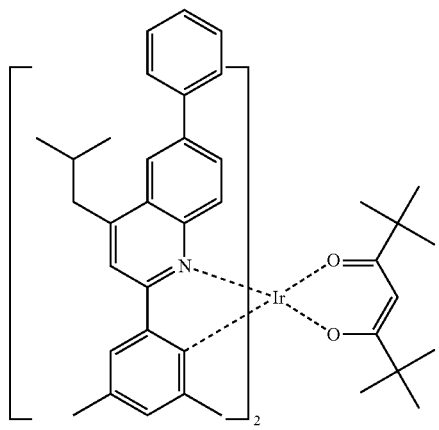

D-142

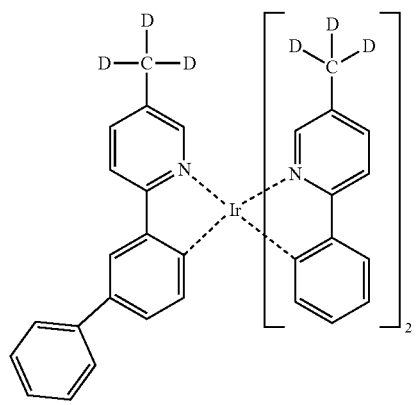

D-146

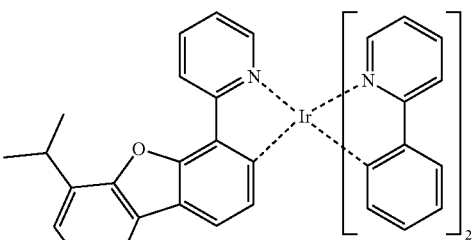

D-147

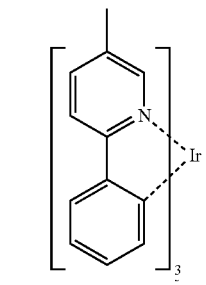

D-143

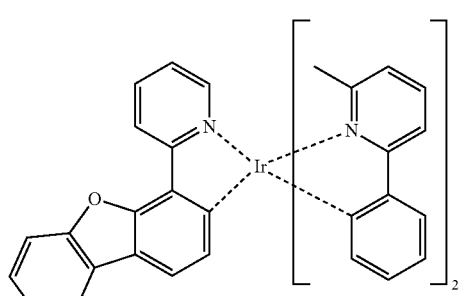

D-148

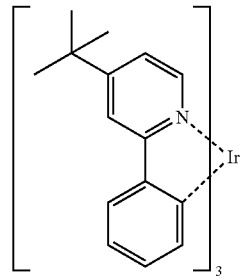

D-144

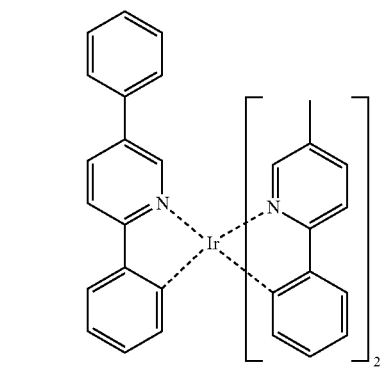

D-145

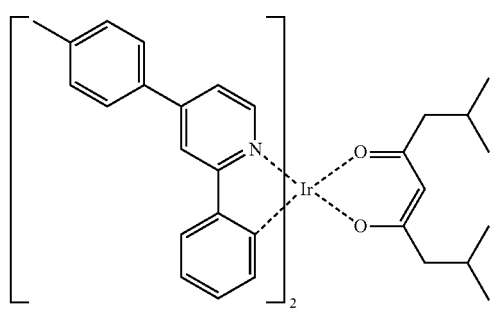

The organic electroluminescent device of the present disclosure may further comprise at least one compound selected from the group consisting of arylamine-based compounds and styrylarylamine-based compounds at the organic layer.

Also, in the organic electroluminescent device of the present disclosure, the organic layer may further comprise at least one metal selected from the group consisting of metals of Group 1, metals of Group 2, transition metals of the 4th period, transition metals of the 5th period, lanthanides and organic metals of the d-transition elements of the Periodic Table, or at least one complex compound comprising the metal.

Preferably, in the organic electroluminescent device of the present disclosure, at least one layer (hereinafter, "a surface layer") may be placed on an inner surface(s) of one or both electrode(s), selected from a chalcogenide layer, a metal halide layer and a metal oxide layer. Specifically, a chalcogenide (includes oxides) layer of silicon or aluminum is preferably placed on an anode surface of an electroluminescent medium layer, and a metal halide layer or a metal oxide layer is preferably placed on a cathode surface of an electroluminescent medium layer. Such a surface layer provides operation stability for the organic electroluminescent device. Preferably, the chalcogenide includes $SiO_X$ ($1 \leq X \leq 2$), $AlO_X$ ($1 \leq X \leq 1.5$), SiON, SiAlON, etc.; the metal halide includes LiF, $MgF_2$, $CaF_2$, a rare earth metal fluoride, etc.; and the metal oxide includes $Cs_2O$, $Li_2O$, MgO, SrO, BaO, CaO, etc.

A hole injection layer, a hole transport layer, an electron blocking layer, or a combination thereof may be disposed between the anode and the light-emitting layer. The hole injection layer may be composed of two or more layers in order to lower an energy barrier for injecting holes from the anode to a hole transport layer or an electron blocking layer (or a voltage for injecting holes). Each of the layers may comprise two or more compounds. The hole transport layer or electron blocking layer may be composed of two or more layers.

An electron buffering layer, a hole blocking layer, an electron transport layer, an electron injection layer, or a combination thereof may be disposed between the light-emitting layer and the cathode. The electron buffering layer may be composed of two or more layers in order to control the electron injection and improve characteristics of interface between the light-emitting layer and the electron injection layer. Each of the layers may comprise two or more compounds. The hole blocking layer or electron transport layer may be composed of two or more layers, and each of the layers may comprise two or more compounds.

In the organic electroluminescent device of the present disclosure, a mixed region of an electron transport compound and a reductive dopant, or a mixed region of a hole transport compound and an oxidative dopant may be placed on at least one surface of a pair of electrodes. In this case, the electron transport compound is reduced to an anion, and thus it becomes easier to inject and transport electrons from the mixed region to an electroluminescent medium. Furthermore, the hole transport compound is oxidized to a cation, and thus it becomes easier to inject and transport holes from the mixed region to the electroluminescent medium. Preferably, the oxidative dopant includes various Lewis acids and acceptor compounds, and the reductive dopant includes alkali metals, alkali metal compounds, alkaline earth metals, rare-earth metals, and mixtures thereof. A reductive dopant layer may be employed as a charge generating layer to prepare an electroluminescent device having two or more light-emitting layers and emitting white light.

In order to form each layer of the organic electroluminescent device of the present disclosure, dry film-forming methods such as vacuum evaporation, sputtering, plasma, ion plating methods, etc., or wet film-forming methods such as spin coating, dip coating, flow coating methods, etc., can be used. The first host compound and the second host compound of the present disclosure may be film-formed by co-evaporaton or mixture-evaporaton.

When using a wet film-forming method, a thin film can be formed by dissolving or diffusing materials forming each layer into any suitable solvent such as ethanol, chloroform, tetrahydrofuran, dioxane, etc. The solvent can be any solvent where the materials forming each layer can be dissolved or diffused, and where there are no problems in film-formation capability.

Also, the organic electroluminescent device of the present disclosure can be used for the manufacture of a display device or a lighting device.

Hereinafter, the luminescent properties of the device comprising the host compound of the present disclosure will be explained in detail with reference to the following examples.

[DEVICE EXAMPLE 1-1] PRODUCTION OF AN OLED DEVICE BY A CO-EVAPORATION OF A FIRST HOST COMPOUND AND A SECOND HOST COMPOUND OF THE PRESENT DISCLOSURE AS A HOST

An OLED device was produced comprising the plurality of host compounds of the present disclosure as follows. A transparent electrode indium tin oxide (ITO) thin film (10 Ω/sq) on a glass substrate for an organic electroluminescent device (OLED) (Geomatec) was subjected to an ultrasonic washing with acetone, ethanol, and distilled water sequentially, and was then stored in isopropanol. The ITO substrate was then mounted on a substrate holder of a vacuum vapor depositing apparatus. Compound HIL was introduced into a cell of the vacuum vapor depositing apparatus, and then the pressure in the chamber of the apparatus was controlled to $10^{-6}$ torr, and evaporated by applying electric current to the cell, thereby forming a first hole injection layer having a thickness of 90 nm on the ITO substrate. Thereafter, compound HITL was then introduced into another cell of the vacuum vapor depositing apparatus, and evaporated by applying electric current to the cell, thereby forming a second hole injection layer having a thickness of 5 nm on the first hole injection layer. Compound HTL1 was introduced into one cell of the vacuum vapor depositing apparatus, and evaporated by applying electric current to the cell, thereby forming a first hole transport layer having a thickness of 10 nm on the second hole injection layer. Compound HTL (compound HTL5) shown in Table 1 below was then introduced into another cell of the vacuum vapor depositing apparatus, and evaporated by applying electric current to the cell, thereby forming a second hole transport layer having a thickness of 60 nm on the first hole transport layer. After forming the hole injection layers and the hole transport layers, a light-emitting layer was then deposited as follows. As a host material, a first host compound and a second host compound shown in Table 1 below were introduced into two cells of the vacuum vapor depositing apparatus, respectively. Compound D-71 was introduced into another cell as a dopant. The two host compounds were evaporated at the same rate of 1:1, while the dopant was evaporated at a different rate from the host compounds, so that the dopant was deposited in a doping amount of 2 wt % based on the total amount of the host and dopant to form a light-emitting layer having a thickness of 40 nm on the second hole transport layer. Next, compound ETL and compound EIL were evaporated at the rate of 1:1 on another two cells of the vacuum vapor depositing apparatus to form an electron transport layer having a thickness of 35 nm on the light-emitting layer. After depositing compound EIL having a thickness of 2 nm as an electron injection layer on the electron transport layer, an Al cathode having a thickness of 80 nm was then deposited by another vacuum vapor deposition apparatus on the electron injection layer. Thus, an OLED device was produced.

Driving voltage in Table 1 below was measured at 1,000 nit of luminance. Roll-off represents the difference of the efficiency between at 1,000 nit and at 5,000 nit, i.e., "Roll-off=Δ Efficiency (1,000 nit-5,000 nit)=the efficiency at 1,000 nit of luminance—the efficiency at 5,000 nit of luminance," which indicates how much the efficiency decreases as luminance increases. A smaller roll-off value is preferable. Lifespan is the time taken to be reduced from 100% to 97% of the luminance at 5,000 nit and a constant current, in a system maintaining constant temperature and humidity.

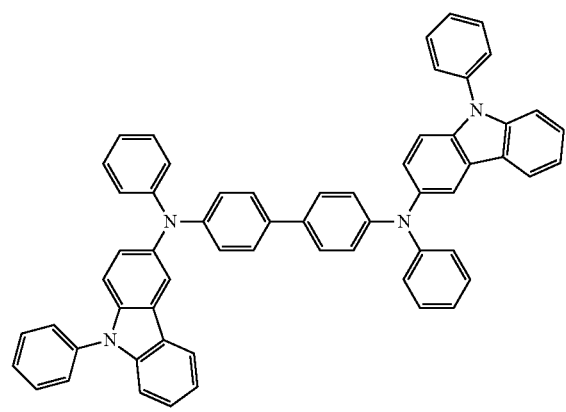
HIL
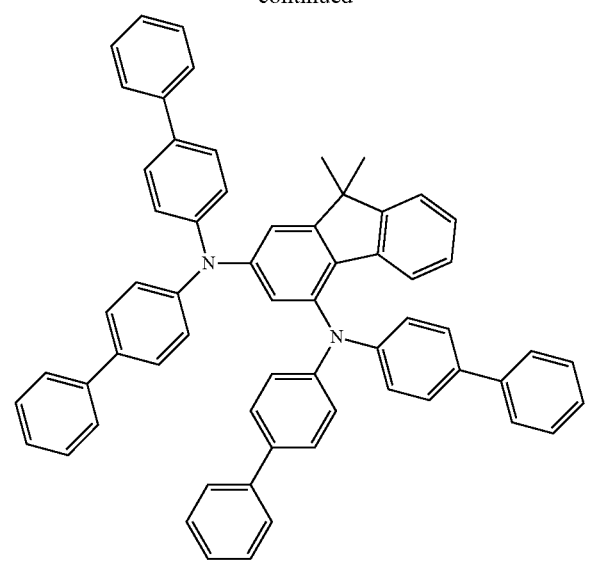
HTL3
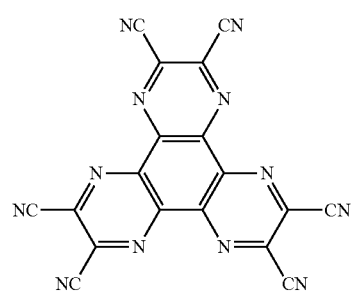
HITL
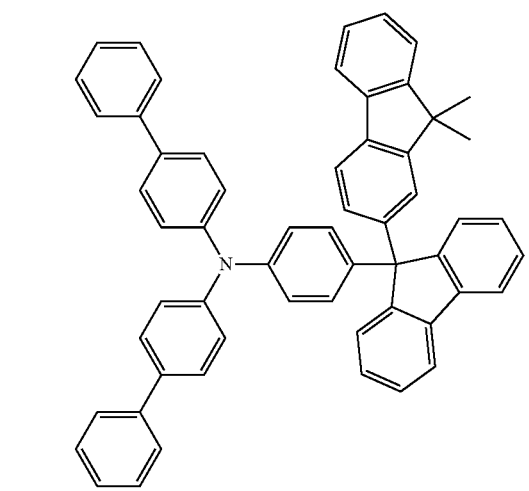
HTL4
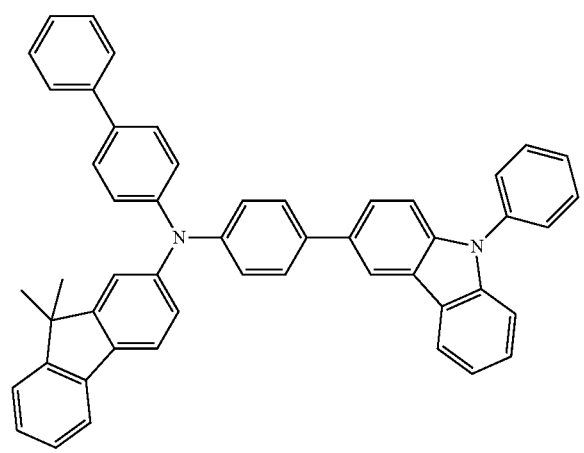
HTL1
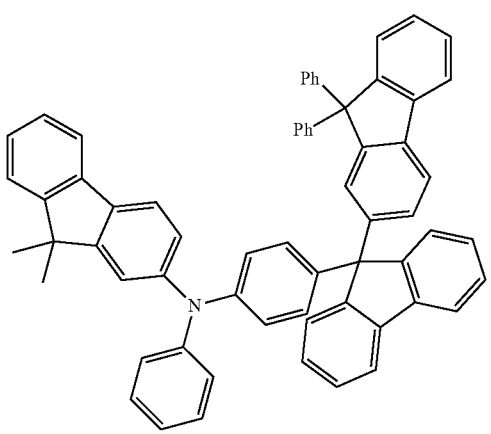
HTL5

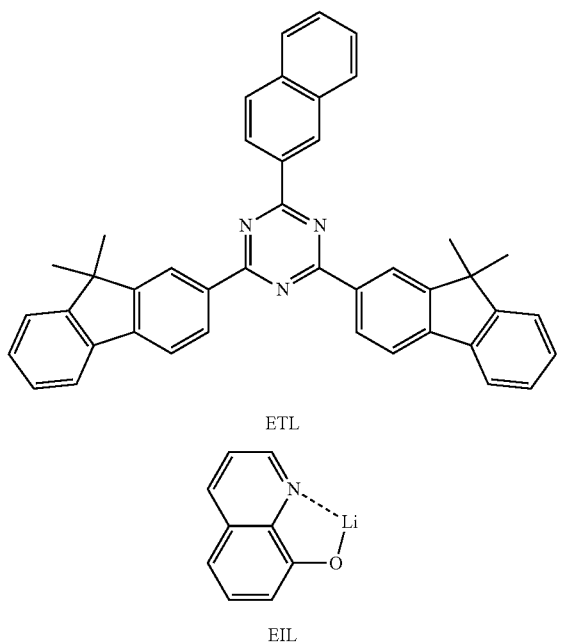

ETL

EIL

[Production of an OLED Device of Device Examples 1-2, 1-3, 2-1, 3-1 to 3-6, 4-1, 5-1, 7-1 and 7-2, and Comparative Examples 1-1, 2-1, 3-1, 4-1, 5-1 and 7-1]

An OLED device was produced in the same manner as in Device Example 1-1, except that only the compounds shown in Table 1 were used as the first host, the second host, and compound HTL.

[Production of an OLED Device of Device Examples 8-1, 9-1, 10-1, 10-2, 12-1, 13-1 and 14-1, and Comparative Examples 8-1, 9-1, 10-1, 12-1, 13-1 and 14-1]

An OLED device was produced in the same manner as in Device Example 1-1, except that only the compounds shown in Table 1 were used as the first host, the second host, and compound HTL, a first hole injection layer (HIL) having a thickness of 80 nm was formed, an electron transport layer (ETL) having a thickness of 30 nm was formed, and the doping amount was changed to 3 wt %.

TABLE 1

| | First host | Second host | HTL | Roll-off [cd/A] | Lifespan (T97) [hr] |
|---|---|---|---|---|---|
| Comparative Example 1-1 | — | C-1 | HTL5 | 3.0 | 40 |
| Device Example 1-1 | H1-85 | C-1 | HTL5 | 2.3 | 96 |
| Device Example 1-2 | H1-7 | C-1 | HTL5 | 2.1 | 180 |
| Device Example 1-3 | H1-90 | C-1 | HTL5 | 2.3 | 124 |
| Comparative Example 2-1 | — | C-1 | HTL3 | 5.3 | 30 |
| Device Example 2-1 | H1-7 | C-1 | HTL3 | 2.6 | 112 |
| Comparative Example 3-1 | — | C-9 | HTL4 | 3.0 | 48 |
| Device Example 3-1 | H1-87 | C-9 | HTL4 | 2.2 | 72 |
| Device Example 3-2 | H1-88 | C-9 | HTL4 | 2.5 | 61 |
| Device Example 3-3 | H1-86 | C-9 | HTL4 | 2.5 | 88 |
| Device Example 3-4 | H1-90 | C-9 | HTL4 | 2.0 | 122 |

TABLE 1-continued

| | First host | Second host | HTL | Roll-off [cd/A] | Lifespan (T97) [hr] |
|---|---|---|---|---|---|
| Device Example 3-5 | H1-85 | C-9 | HTL4 | 2.2 | 73 |
| Device Example 3-6 | H1-7 | C-9 | HTL5 | 2.0 | 160 |
| Comparative Example 4-1 | — | C-86 | HTL4 | 2.7 | 110 |
| Device Example 4-1 | H1-85 | C-86 | HTL4 | 2.3 | 292 |
| Comparative Example 5-1 | — | C-89 | HTL4 | 2.6 | 45 |
| Device Example 5-1 | H1-85 | C-89 | HTL4 | 2.0 | 67 |
| Comparative Example 7-1 | — | C-91 | HTL4 | 2.8 | 179 |
| Device Example 7-1 | H1-90 | C-91 | HTL4 | 2.4 | 308 |
| Device Example 7-2 | H1-85 | C-91 | HTL4 | 2.5 | 325 |
| Comparative Example 8-1 | — | C-97 | HTL5 | 2.5 | 3 |
| Device Example 8-1 | H1-7 | C-97 | HTL5 | 1.6 | 8 |
| Comparative Example 9-1 | — | C-117 | HTL5 | 2.3 | 57 |
| Device Example 9-1 | H1-7 | C-117 | HTL5 | 2.0 | 65 |
| Comparative Example 10-1 | — | C-108 | HTL5 | 2.9 | 45 |
| Device Example 10-1 | H1-7 | C-108 | HTL5 | 2.4 | 184 |
| Device Example 10-2 | H1-85 | C-108 | HTL5 | 2.3 | 220 |
| Comparative Example 12-1 | — | C-10 | HTL5 | 3.3 | 27 |
| Device Example 12-1 | H1-91 | C-10 | HTL5 | 2.3 | 100 |
| Comparative Example 13-1 | — | C-11 | HTL5 | 2.9 | 37 |
| Device Example 13-1 | H1-91 | C-11 | HTL5 | 2.1 | 59 |
| Comparative Example 14-1 | — | C-8 | HTL5 | 3.1 | 20 |
| Device Example 14-1 | H1-91 | C-8 | HTL5 | 2.2 | 105 |

[Production of an OLED Device of Device Examples 15-1 to 15-6, and Comparative Example 15-1]

An OLED device was produced in the same manner as in Device Example 1-1, except that only the compounds shown in Table 2 were used as the first host, the second host, and compound HTL, and compound D-134 was used as the dopant. Lifespan is the time taken to be reduced from 100% to 99% of the luminance at 5,000 nit and a constant current.

TABLE 2

| | First host | Second host | HTL | Roll-off [cd/A] | Lifespan (T99) [hr] |
|---|---|---|---|---|---|
| Comparative Example 15-1 | — | C-4 | HTL5 | 3.2 | 3 |
| Device Example 15-1 | H1-7 | C-4 | HTL5 | 2.4 | 57 |
| Device Example 15-2 | H1-91 | C-4 | HTL5 | 2.4 | 72 |
| Device Example 15-3 | H1-92 | C-4 | HTL5 | 2.5 | 68 |
| Device Example 15-4 | H1-93 | C-4 | HTL5 | 2.2 | 134 |
| Device Example 15-5 | H1-94 | C-4 | HTL5 | 2.0 | 55 |
| Device Example 15-6 | H1-95 | C-4 | HTL5 | 2.4 | 97 |

The organic electroluminescent device of the present disclosure comprises a light-emitting layer comprising a plurality of host compounds and a phosphorescent dopant, wherein at least a first host compound of the plurality of host compounds has an amine-carbazole structure substituted with naphthyl-phenyl and aryl, and a second host compound has a di-C-benzocarbazole structure comprising a specific nitrogen-containing heteroaryl. It can be seen that by having the above structure, high efficiency is maintained at high luminance, and lifespan is highly improved compared to conventional devices.

The invention claimed is:

1. An organic electroluminescent device comprising at least one light-emitting layer disposed between an anode and a cathode, wherein the light-emitting layer comprises a host and a phosphorescent dopant, wherein the host comprises a plurality of host compounds, wherein at least a first host compound of the plurality of host compounds is represented by the following formula 1:

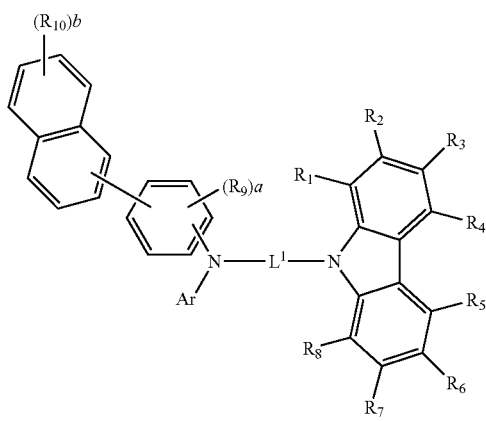

(1)

wherein $L_1$ represents a substituted or unsubstituted (C6-C30) arylene;

Ar represents a substituted or unsubstituted (C6-C60)aryl;

$R_1$ to $R_{10}$, each independently, represent hydrogen, deuterium, a halogen, a cyano, a substituted or unsubstituted (C1-C30)alkyl, a substituted or unsubstituted (C2-C30)alkenyl, a substituted or unsubstituted (C2-C30)alkynyl, a substituted or unsubstituted (C3-C30) cycloalkyl, a substituted or unsubstituted (C6-C60)aryl, a substituted or unsubstituted (3- to 30-membered) heteroaryl, a substituted or unsubstituted tri(C1-C30) alkylsilyl, a substituted or unsubstituted tri(C6-C30) arylsilyl, a substituted or unsubstituted di(C1-C30) alkyl(C6-C30)arylsilyl, or a substituted or unsubstituted mono- or di-(C6-C30)arylamino; or may be linked to an adjacent substituent(s) to form a substituted or unsubstituted mono- or polycyclic (C3-C30), alicyclic or aromatic ring, whose carbon atom(s) may be replaced with at least one heteroatom selected from nitrogen, oxygen, and sulfur;

the (hetero)aromatic ring formed by linking to an adjacent substituent(s) is selected from the group consisting of benzene, cyclopentadiene, indole, indene, benzofuran, and benzothiophene, and may be substituted with a (C1-C10)alkyl or a (C6-C15)aryl;

the heteroaryl contains at least one heteroatom selected from B, N, O, S, Si, and P;

a represents an integer of 1 to 4; b represents an integer of 1 to 7; where a and b, each independently, represent an integer of 2 or more, each of $R_9$ and $R_{10}$ may be the same or different;

and at least a second host compound of the plurality of host compounds is represented by the following formula 2:

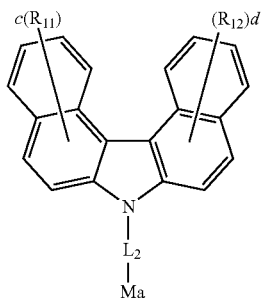

(2)

wherein $L_2$ represents a single bond, a substituted or unsubstituted nitrogen-containing (5- to 18-membered)heteroarylene, or a substituted or unsubstituted (C6-C30) arylene;

Ma represents a substituted or unsubstituted nitrogen-containing (5- to 30-membered)heteroaryl;

$R_{11}$ and $R_{12}$, each independently, represent hydrogen, deuterium, a halogen, a cyano, a carboxyl, a nitro, a hydroxyl, a substituted or unsubstituted (C1-C30)alkyl, a substituted or unsubstituted (C3-C30)cycloalkyl, a substituted or unsubstituted (C3-C30)cycloalkenyl, a substituted or unsubstituted (3- to 7-membered)heterocycloalkyl, a substituted or unsubstituted (C6-C30)aryl, a substituted or unsubstituted (3- to 30-membered) heteroaryl, —$NR_{13}R_{14}$, or —$SiR_{15}R_{16}R_{17}$;

$R_{13}$ to $R_{17}$, each independently, represent a substituted or unsubstituted (C6-C30)aryl, or a substituted or unsubstituted (3- to 30-membered)heteroaryl;

the heteroaryl(ene) and the heterocycloalkyl contain at least one heteroatom selected from B, N, O, S, Si, and P; and c and d represents an integer of 1 to 6; where c and d, each independently, represent an integer of 2 or more, each of $R_{11}$ and $R_{12}$ may be the same or different.

2. The organic electroluminescent device according to claim 1, wherein Ar in formula 1 represents a substituted or unsubstituted (C6-C20)aryl.

3. The organic electroluminescent device according to claim 1, wherein Ma in formula 2 represents a substituted or unsubstituted nitrogen-containing (5- to 20-membered)heteroaryl.

4. The organic electroluminescent device according to claim 1, wherein Ma in formula 2 represents a substituted or unsubstituted triazinyl, a substituted or unsubstituted pyrimidinyl, a substituted or unsubstituted pyridyl, a substituted or unsubstituted quinazolinyl, a substituted or unsubstituted quinoxalinyl, a substituted or unsubstituted dibenzoquinoxalinyl, or a substituted or unsubstituted quinolyl.

5. The organic electroluminescent device according to claim 1, wherein the substituents of the substituted alkyl, the substituted alkenyl, the substituted alkynyl, the substituted cycloalkyl, the substituted cycloalkenyl, the substituted heterocycloalkyl, the substituted aryl(ene), the substituted heteroaryl(ene), the substituted trialkylsilyl, the substituted triarylsilyl, the substituted dialkylarylsilyl, the substituted mono- or di-arylamino, and the substituted mono- or polycyclic, alicyclic or aromatic ring in formulas 1 and 2, each independently, are at least one selected from the group consisting of deuterium; a halogen; a cyano; a carboxyl; a nitro; a hydroxyl; a (C1-C30)alkyl; a halo(C1-C30)alkyl; a (C2-C30)alkenyl; a (C2-C30)alkynyl; a (C1-C30)alkoxy; a (C1-C30)alkylthio; a (C3-C30)cycloalkyl; a (C3-C30)cycloalkenyl; a (3- to 7-membered)heterocycloalkyl; a (C6-C30)aryloxy; a (C6-C30)arylthio; a (3- to 30-membered) heteroaryl unsubstituted or substituted with a (C6-C30)aryl; a (C6-C30)aryl unsubstituted or substituted with a (3- to 30-membered)heteroaryl; a tri(C1-C30)alkylsilyl; a tri(C6-C30)arylsilyl; a di(C1-C30)alkyl(C6-C30)arylsilyl; a (C1-C30)alkyldi(C6-C30)arylsilyl; an amino; a mono- or di-(C1-C30)alkylamino; a mono- or di-(C6-C30)arylamino; a (C1-C30)alkyl(C6-C30)arylamino; a (C1-C30)alkylcarbonyl; a (C1-C30)alkoxycarbonyl; a (C6-C30)arylcarbonyl; a di(C6-C30)arylboronyl; a di(C1-C30)alkylboronyl; a (C1-C30)alkyl(C6-C30)arylboronyl; a (C6-C30)aryl(C1-C30)alkyl; and a (C1-C30)alkyl(C6-C30)aryl.

6. The organic electroluminescent device according to claim 1, wherein the compound represented by formula 1 is selected from the group consisting of:

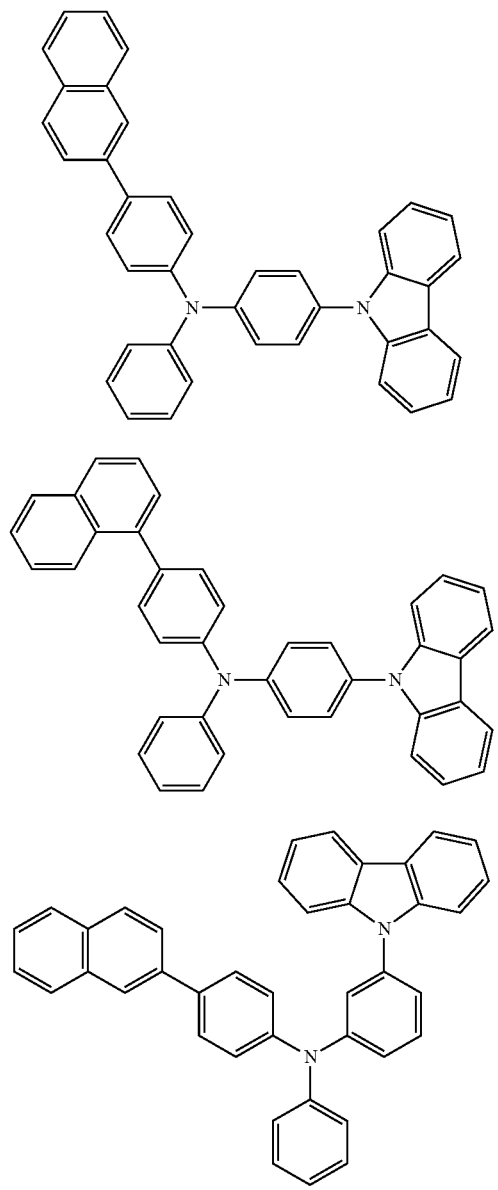

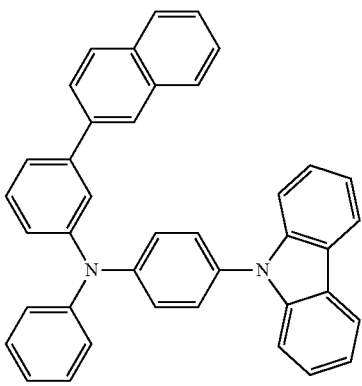

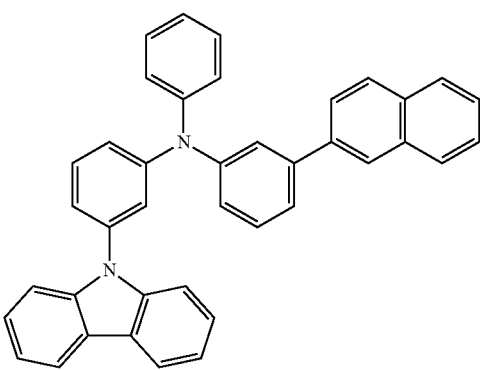

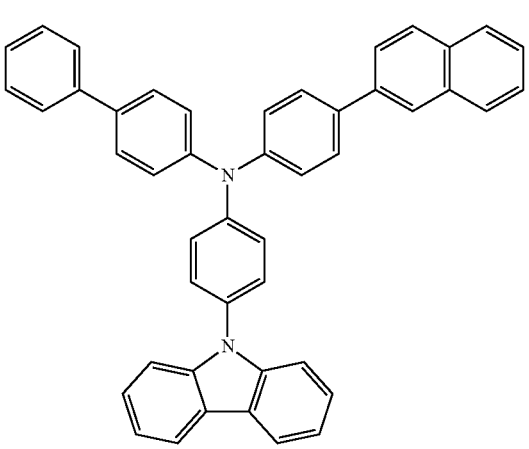

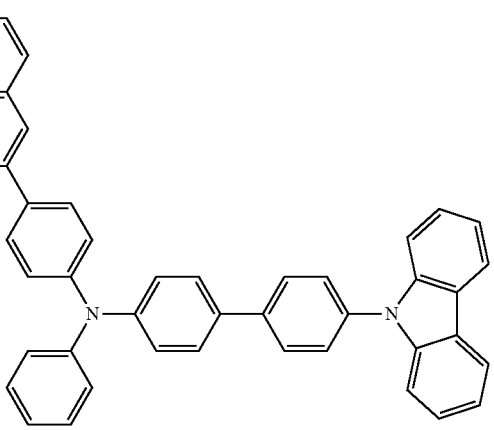

-continued
H1-8
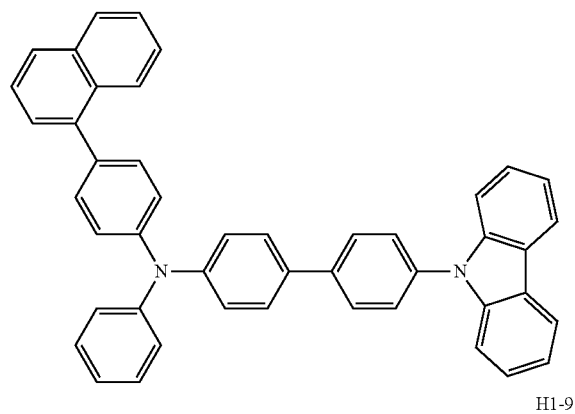
H1-9
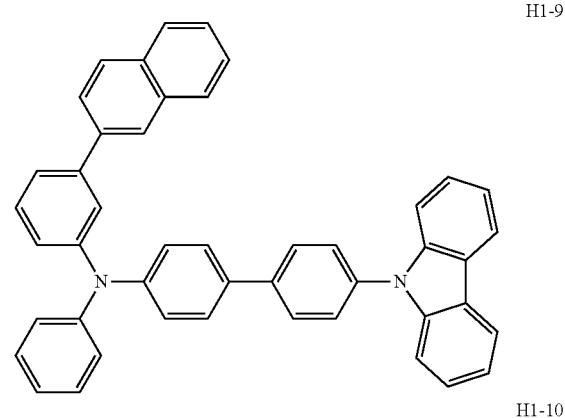
H1-10
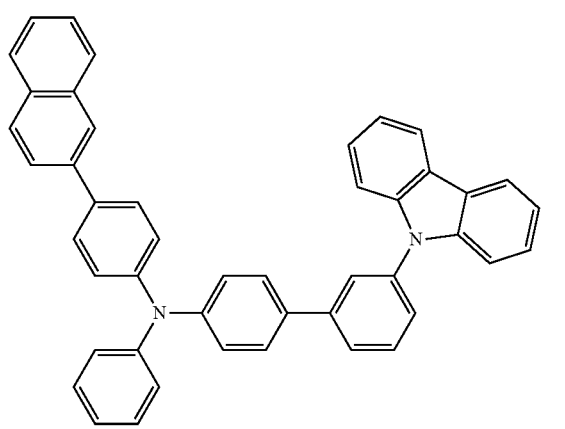
H1-11
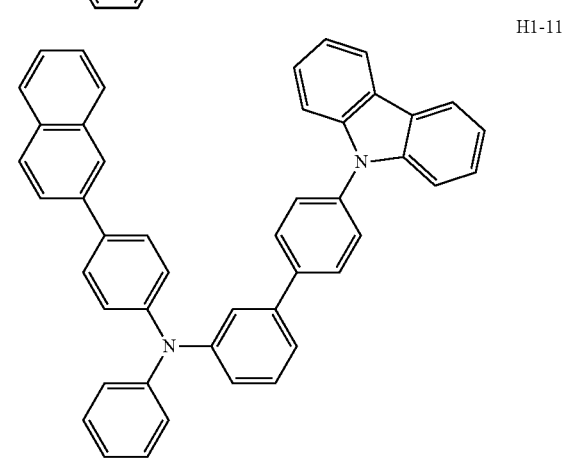
-continued
H1-12
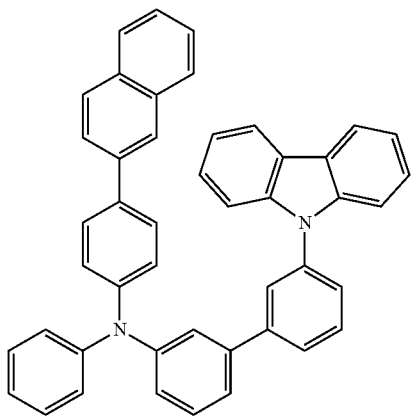
H1-13
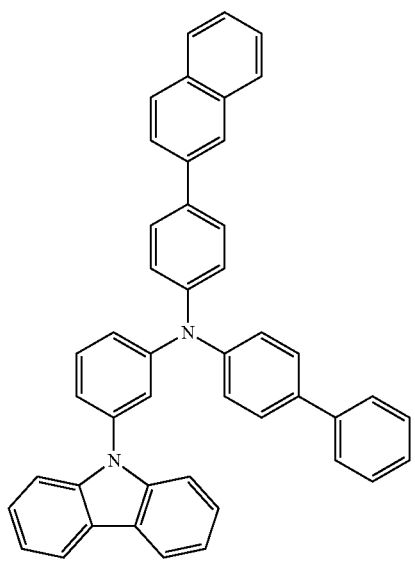
H1-14
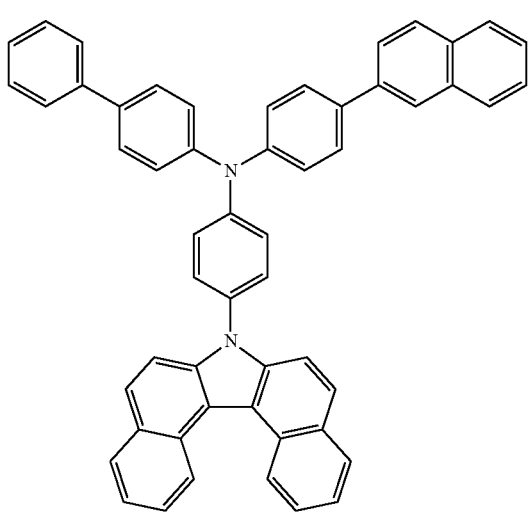

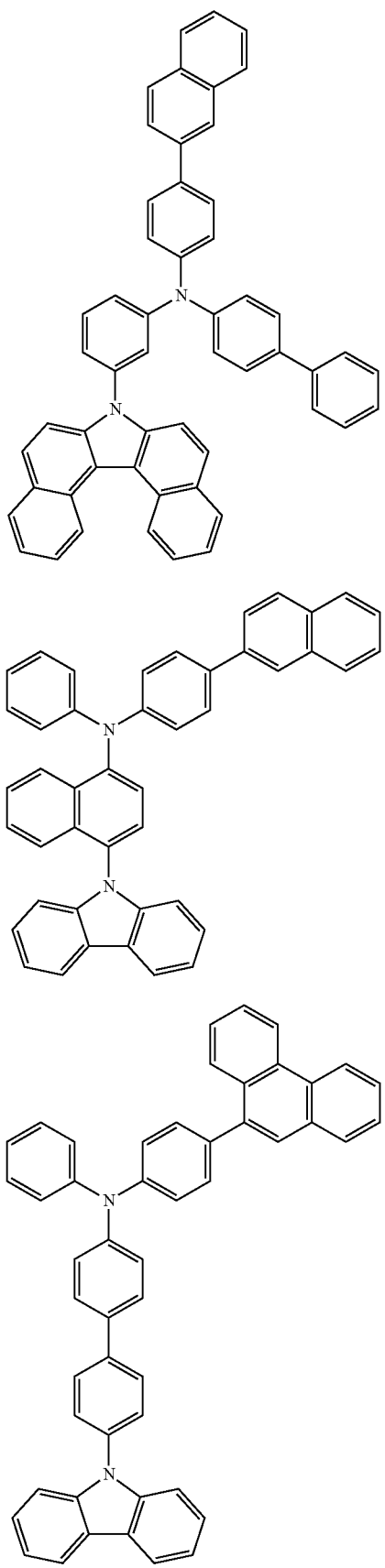
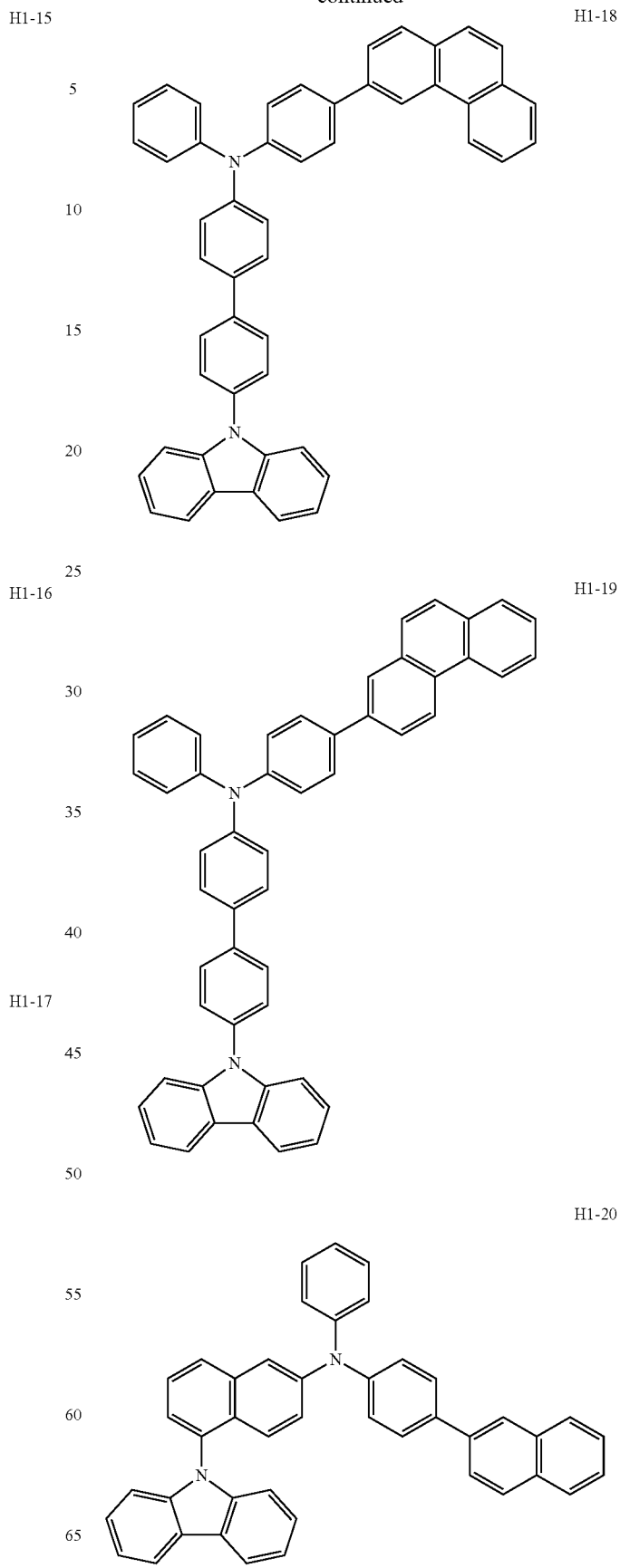

H1-21
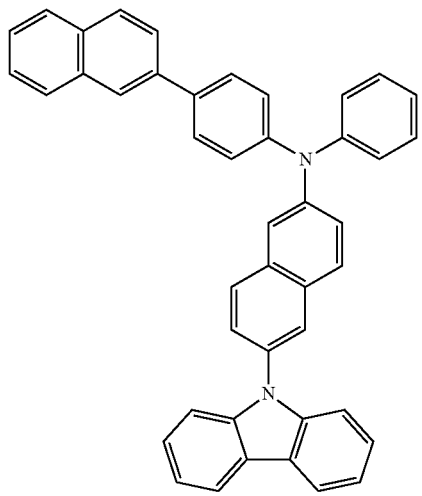
H1-24
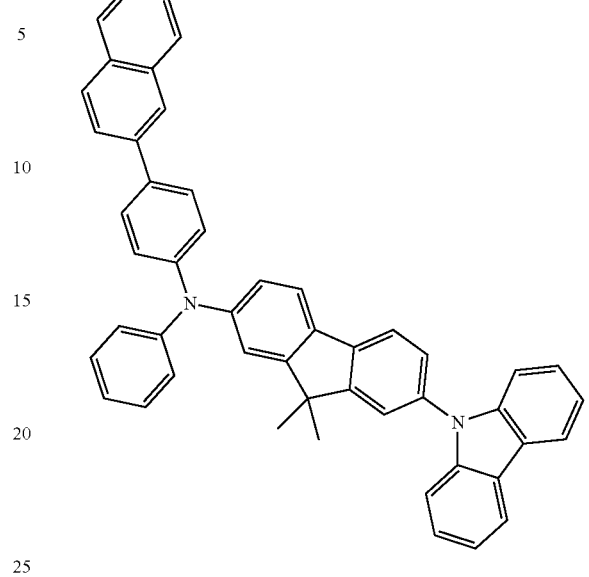
H1-22
H1-25
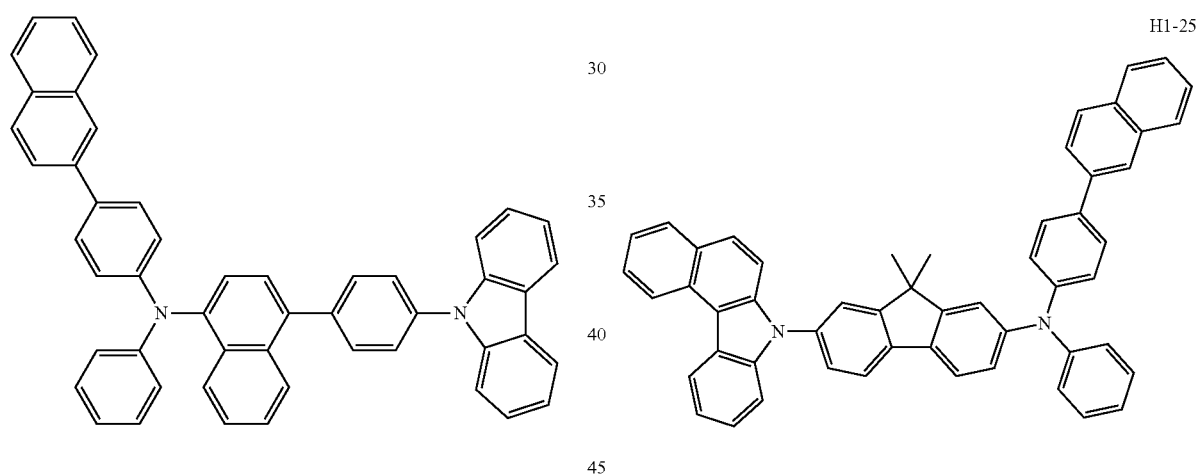
H1-23
H1-26
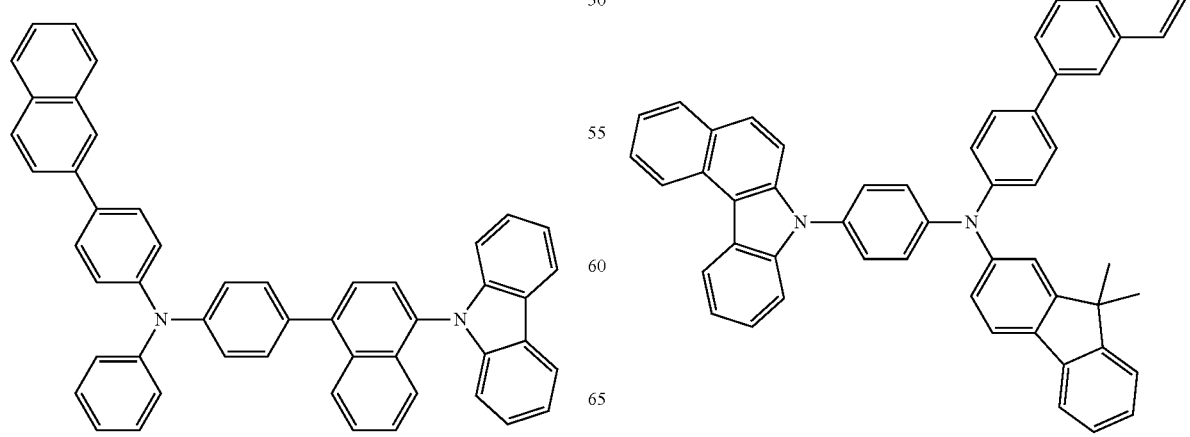

H1-27
H1-31
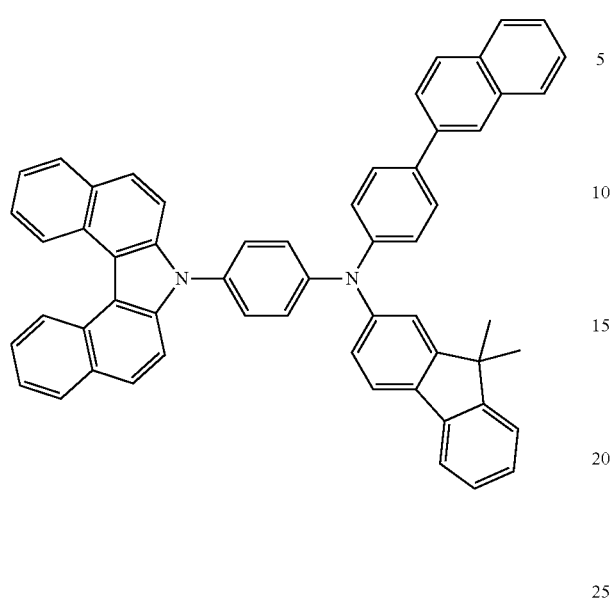
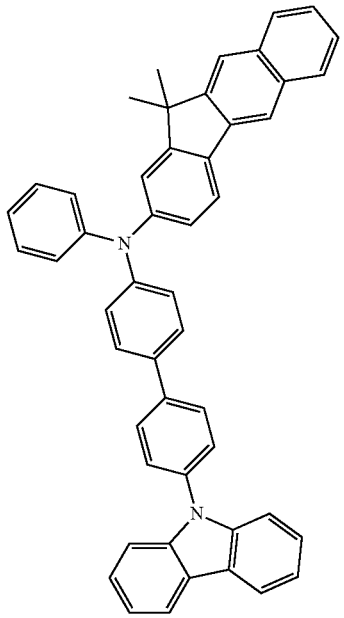
H1-28
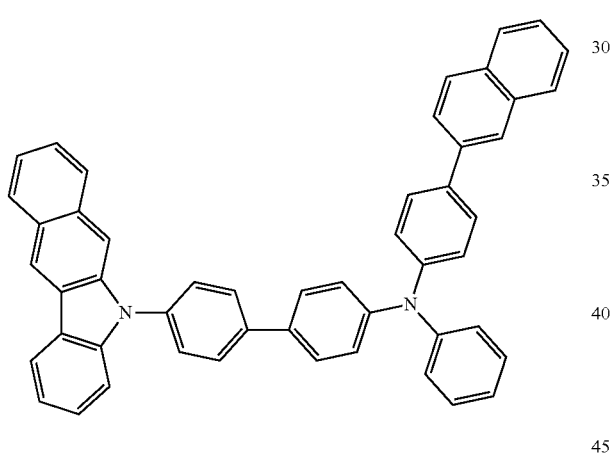
H1-29
H1-32
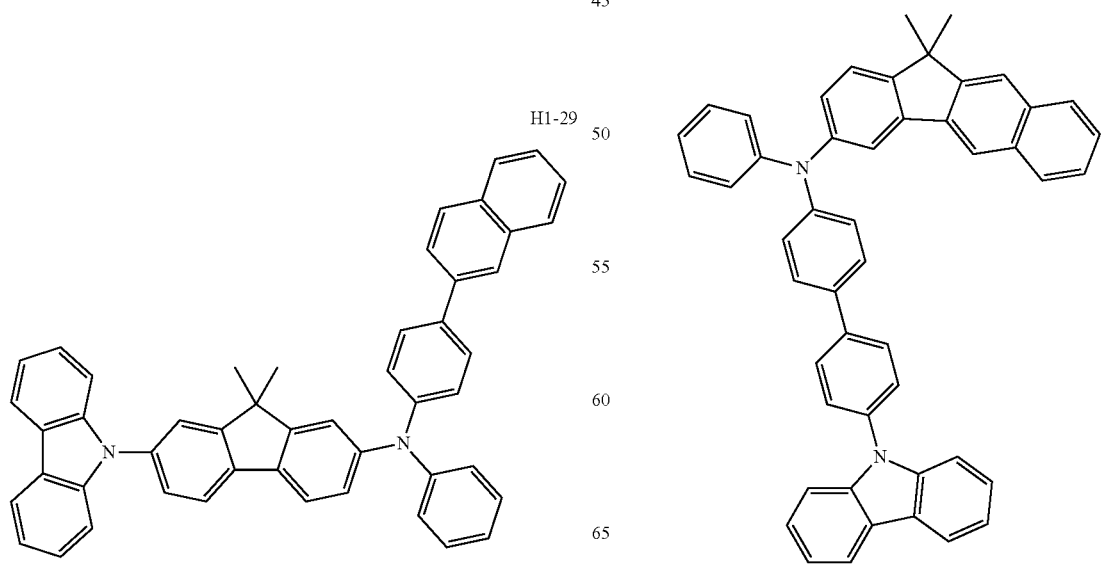

H1-33
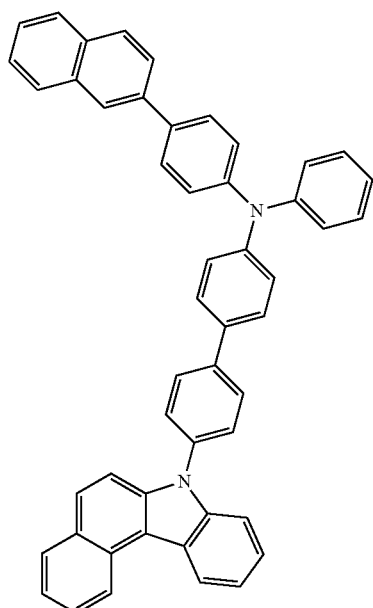
H1-34
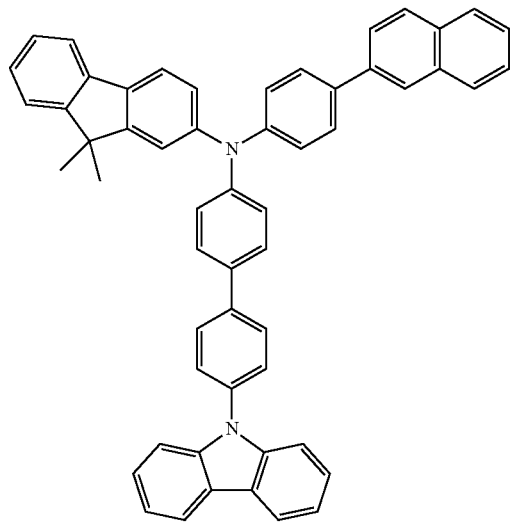
H1-35
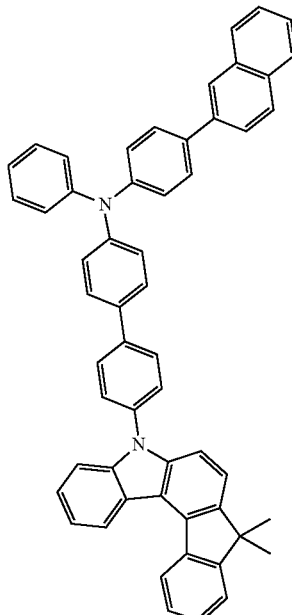
H1-36
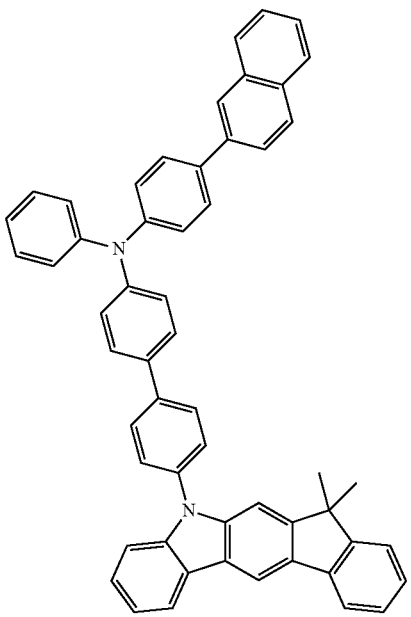

141
-continued
H1-37
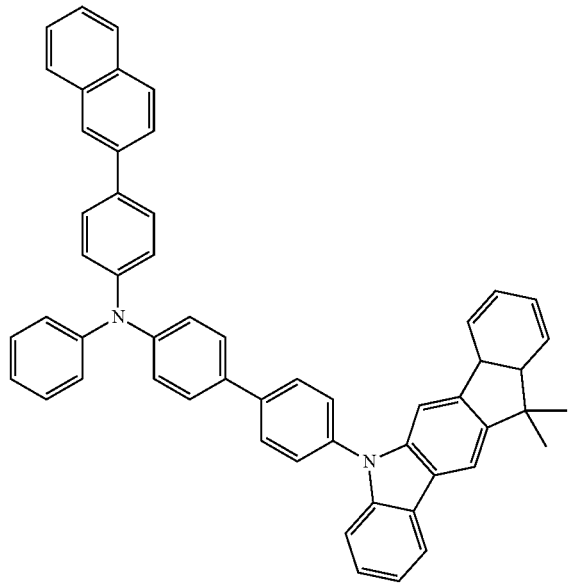
H1-38
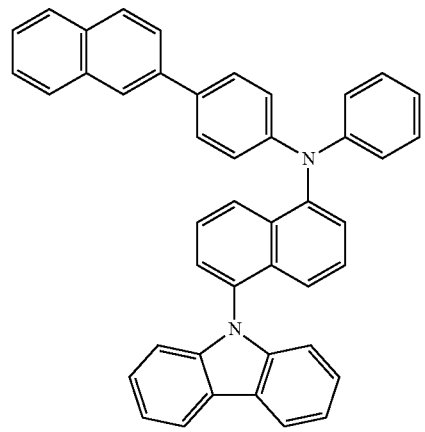
H1-39
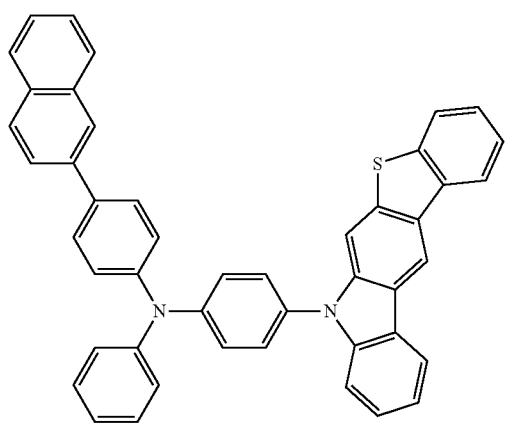
142
-continued
H1-40
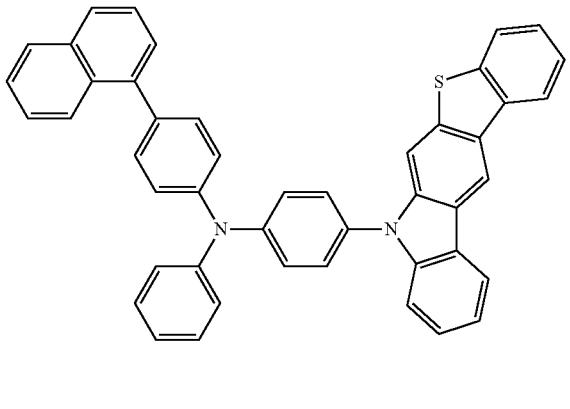
H1-41
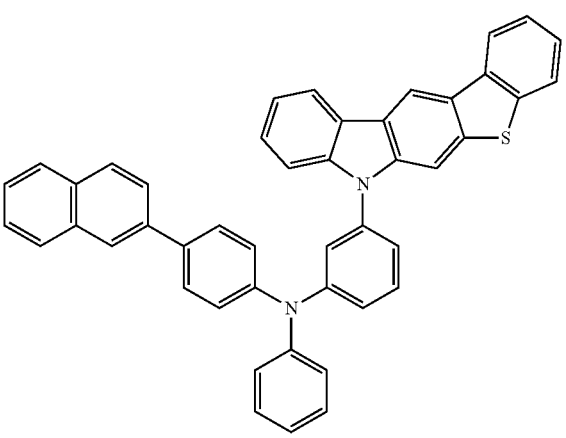
H1-42
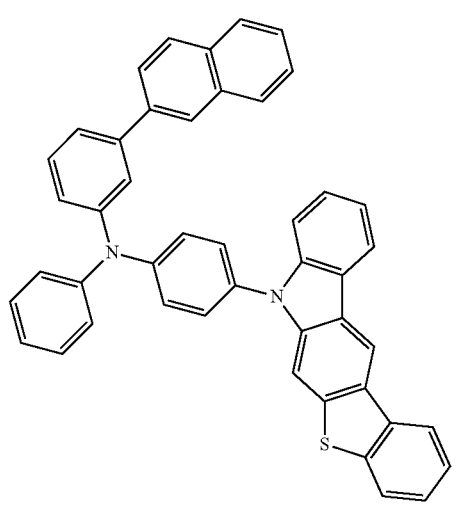

H1-43
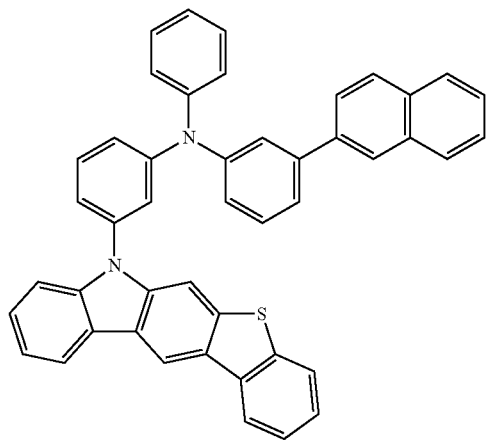
H1-46
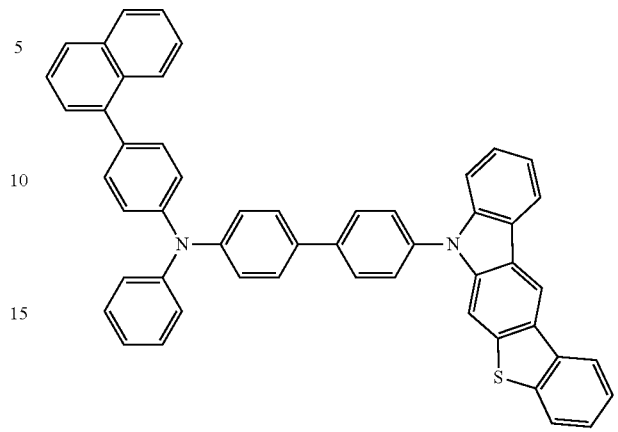
H1-44
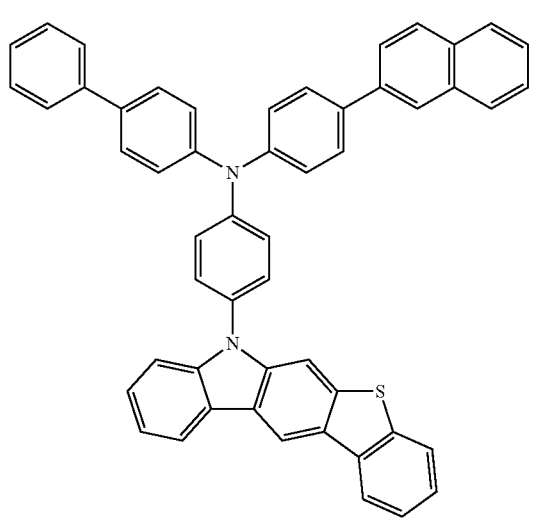
H1-47
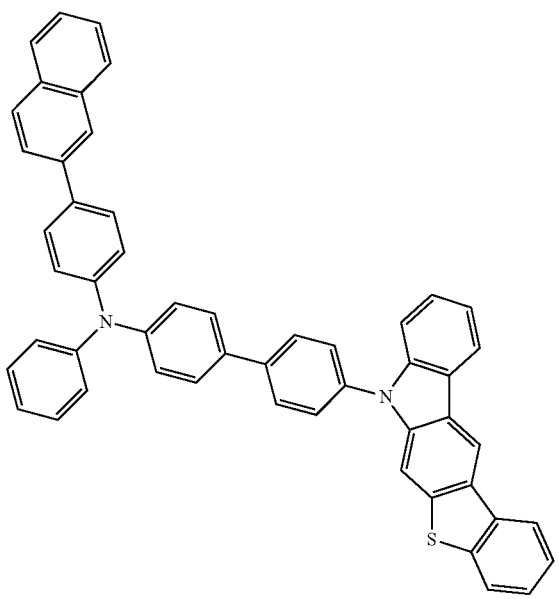
H1-45
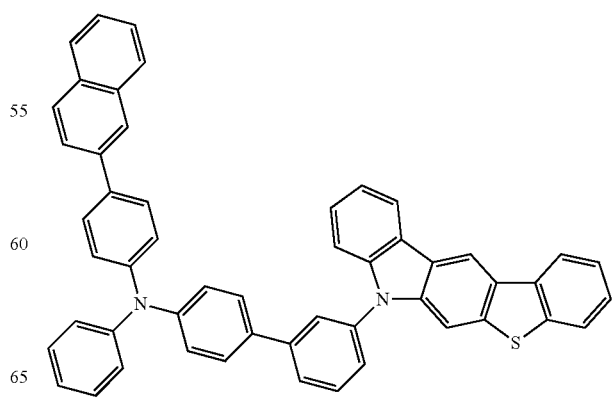
H1-48

H1-49
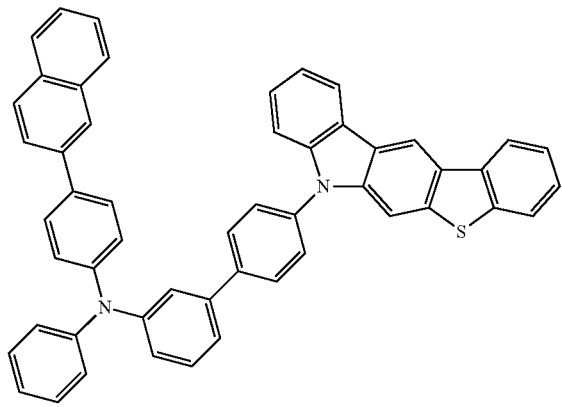
H1-50
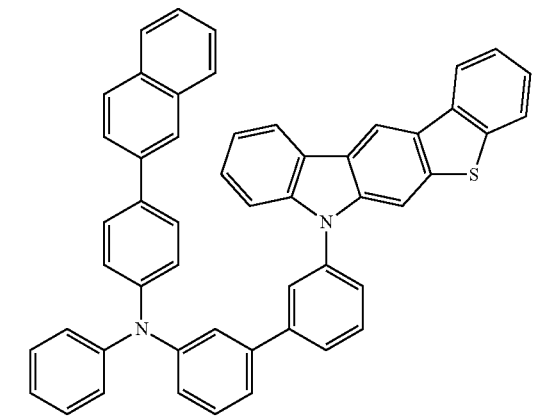
H1-51
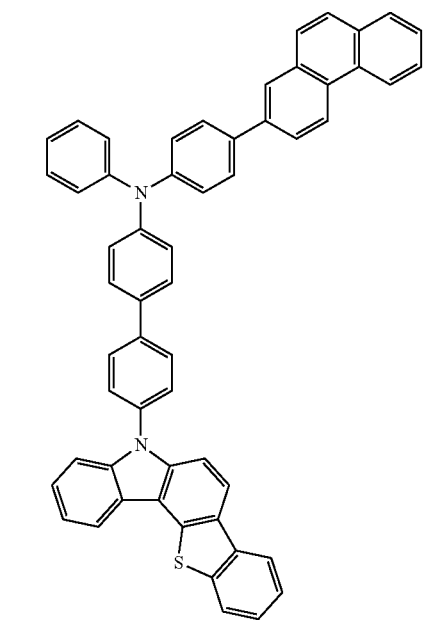
H1-52
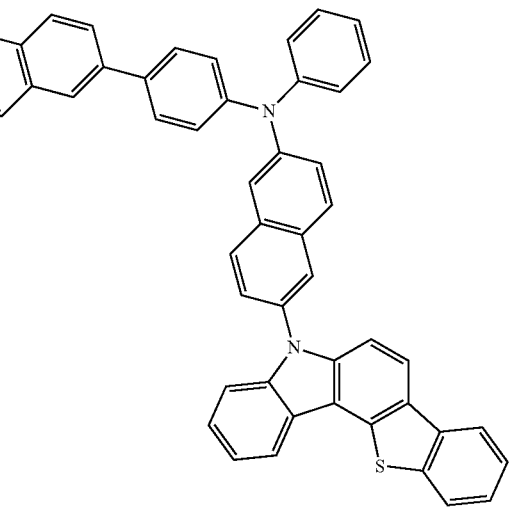
H1-53
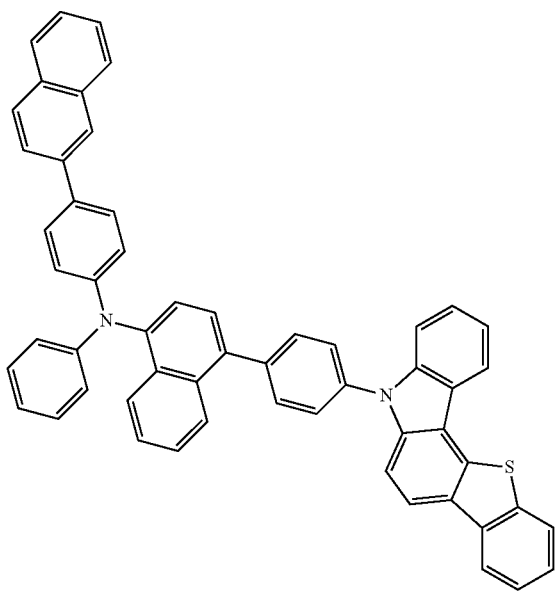

H1-54
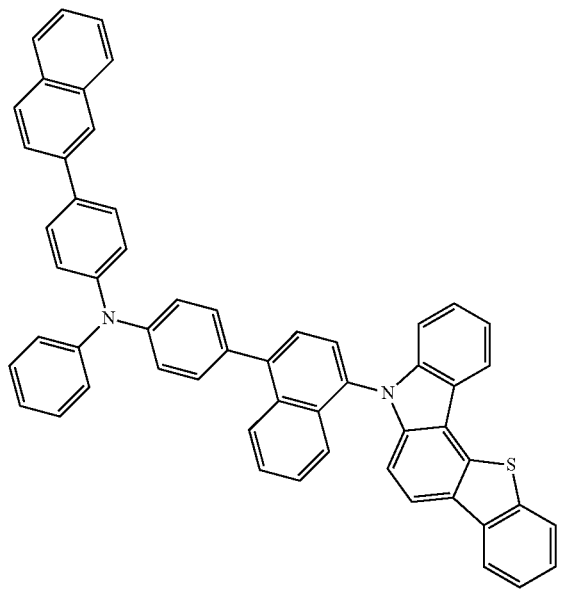
H1-56
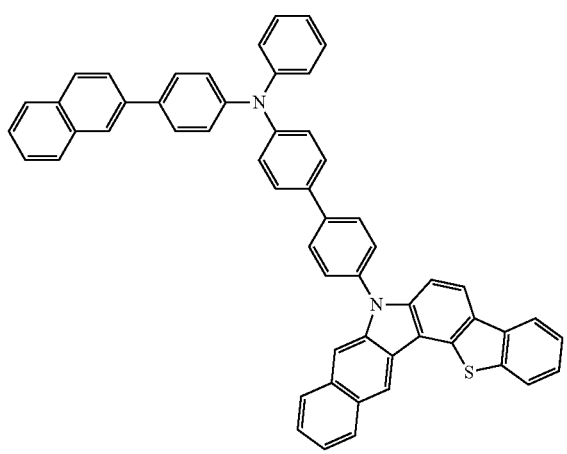
H1-55
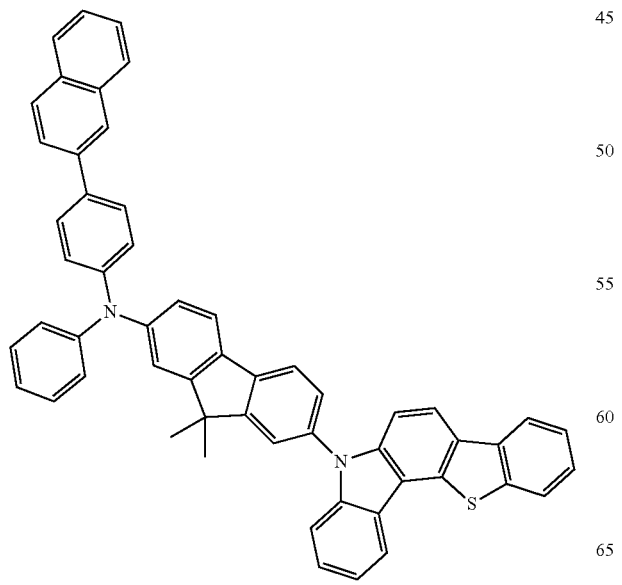
H1-57
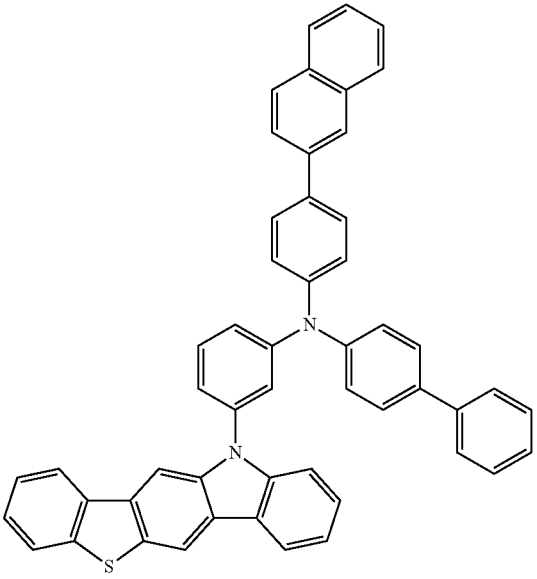

H1-58
H1-59
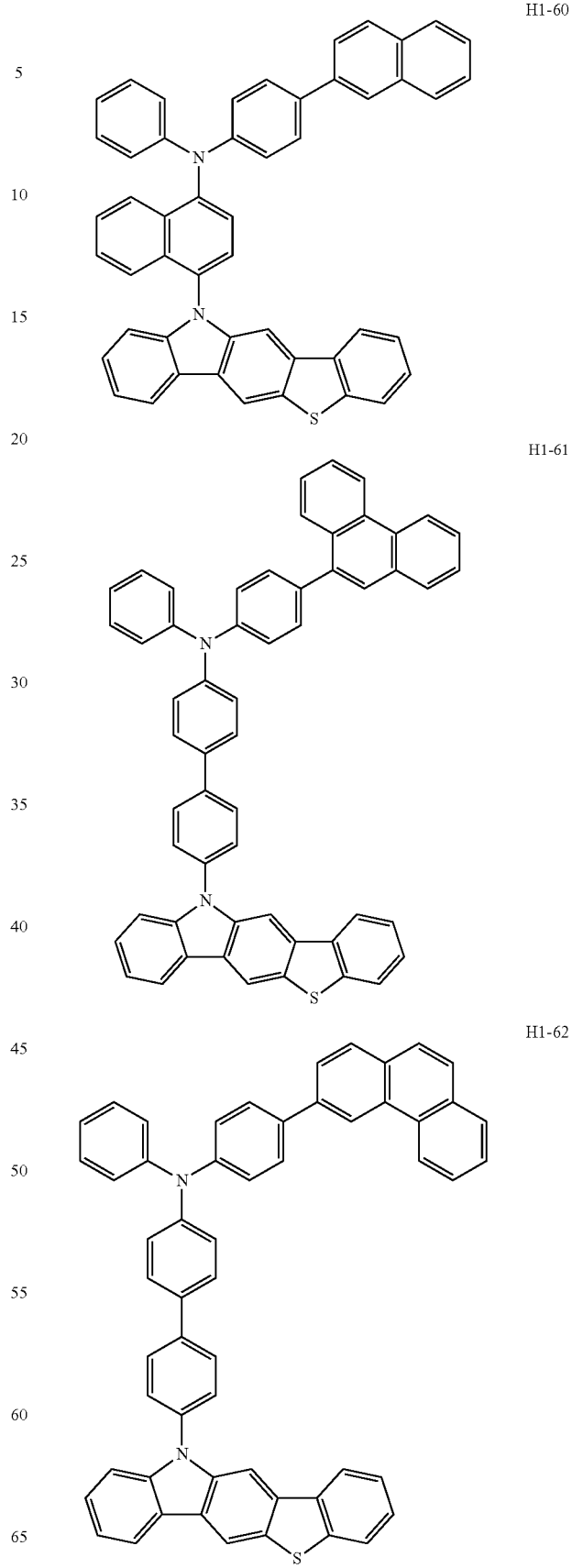
H1-60
H1-61
H1-62

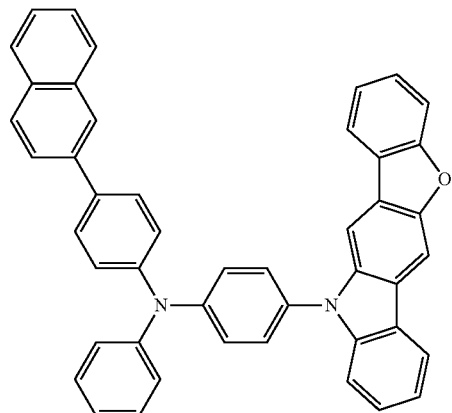
H1-63
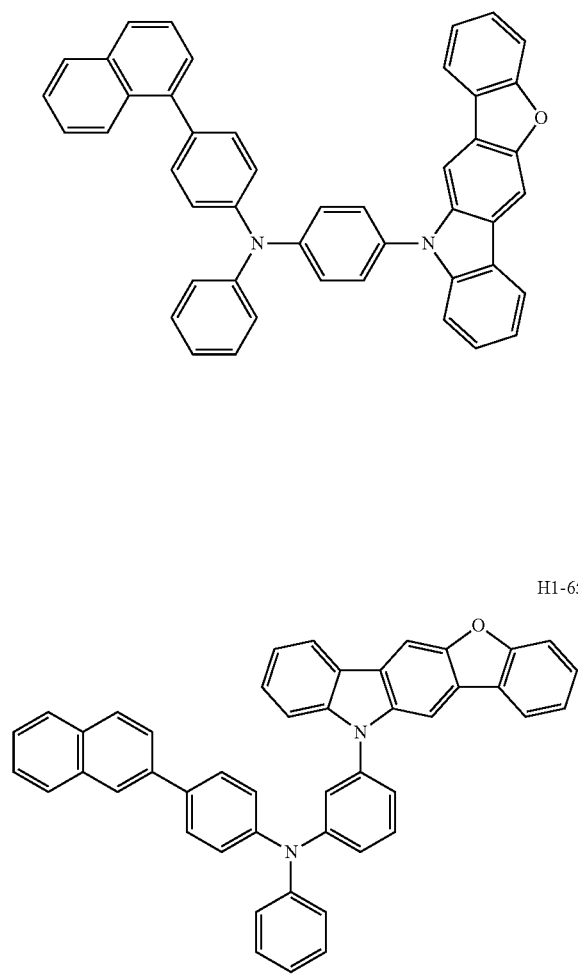
H1-64
H1-65
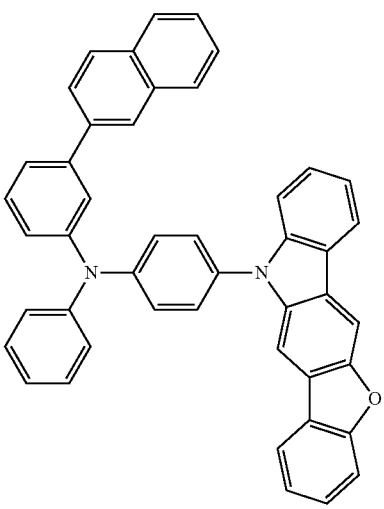
H1-66
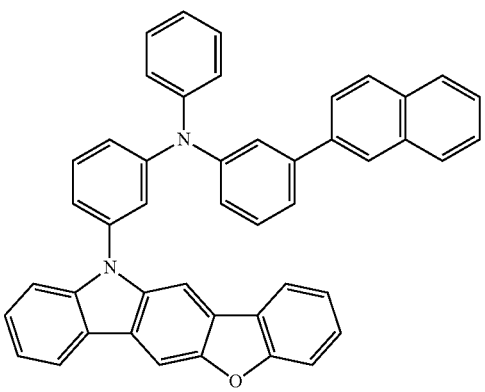
H1-67
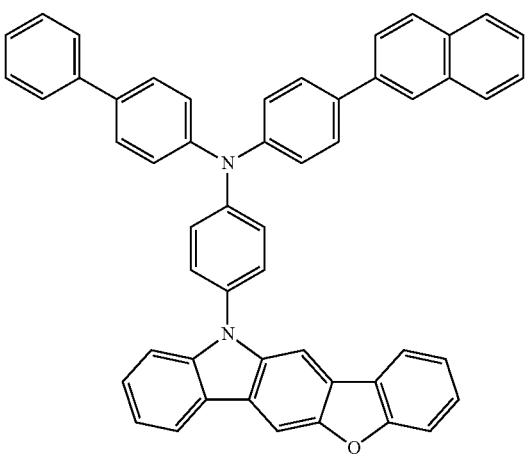
H1-68

H1-69
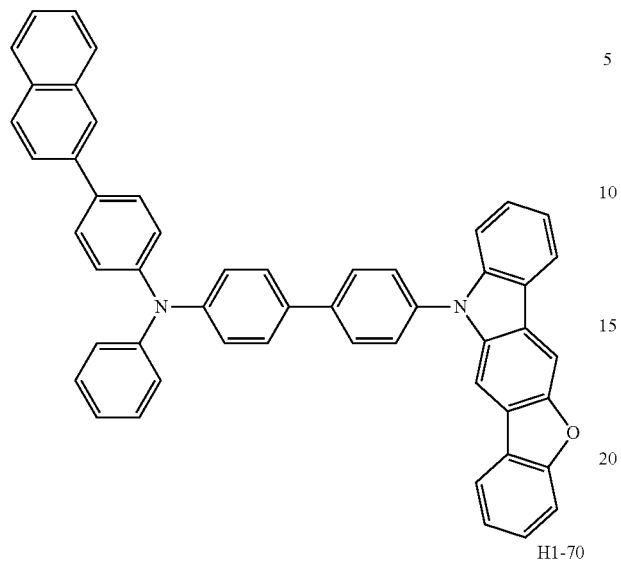
H1-70
H1-71
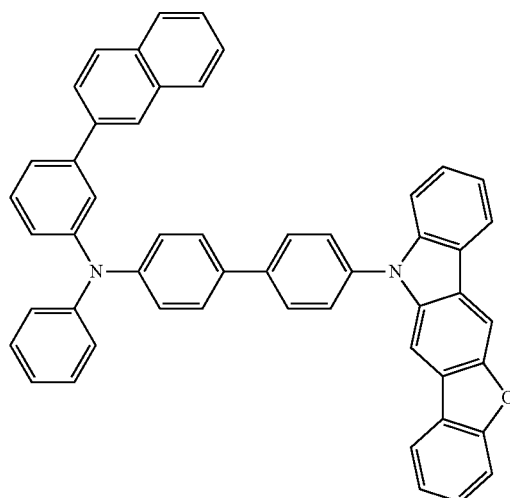
H1-72
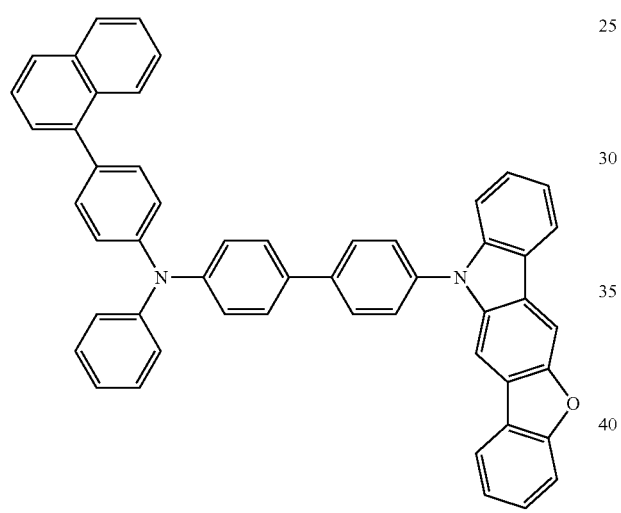
H1-73
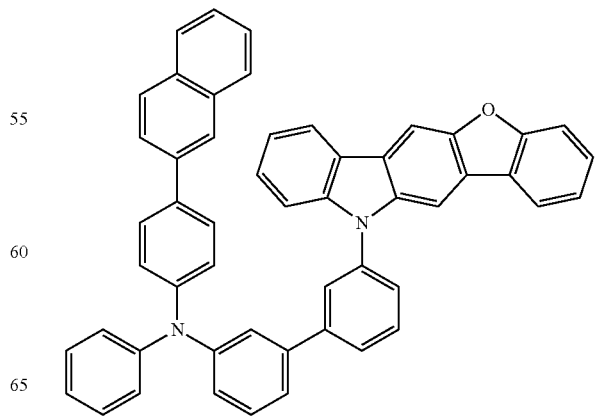
H1-74

H1-75
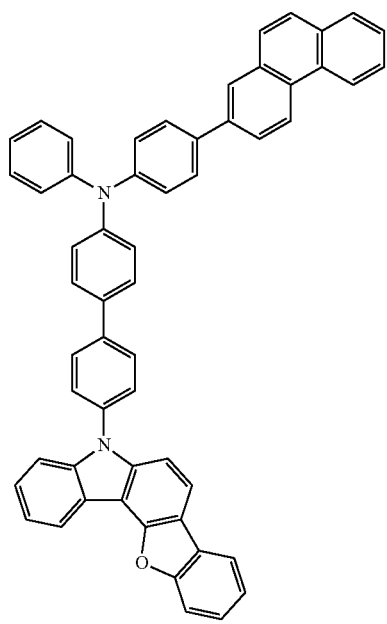
H1-76
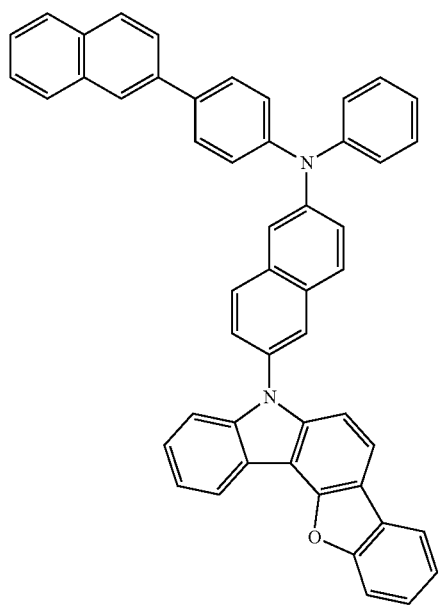
H1-77
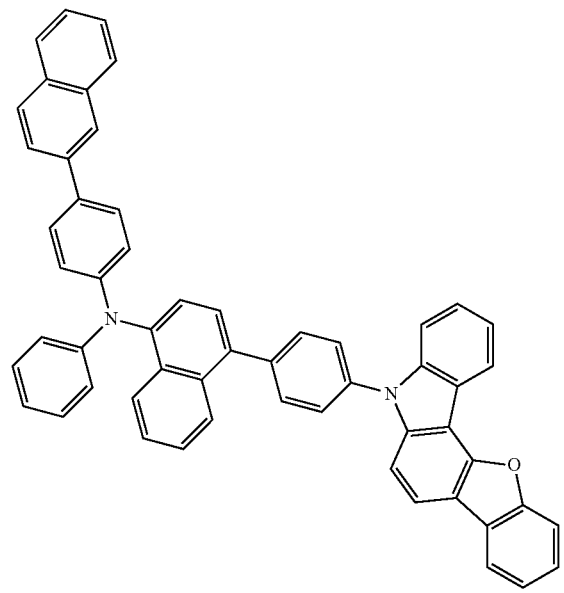
H1-78
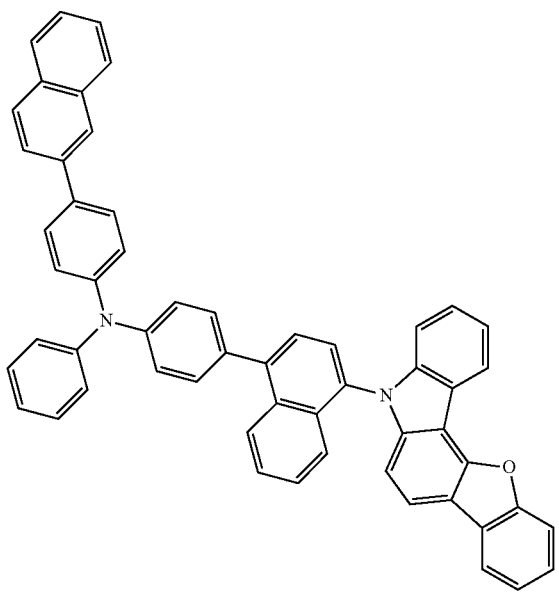

H1-79
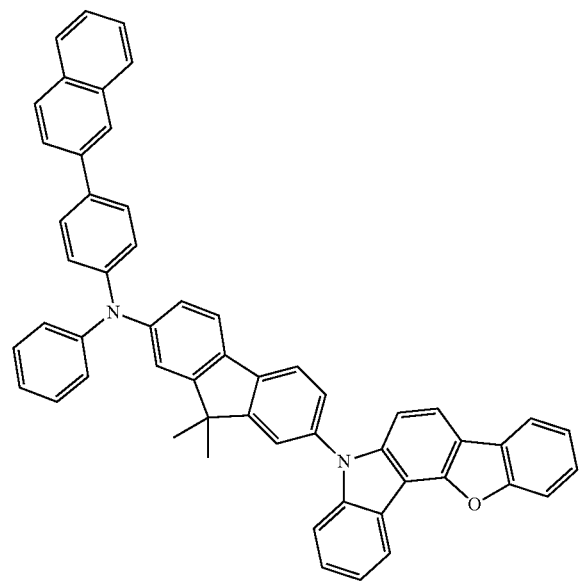
H1-81
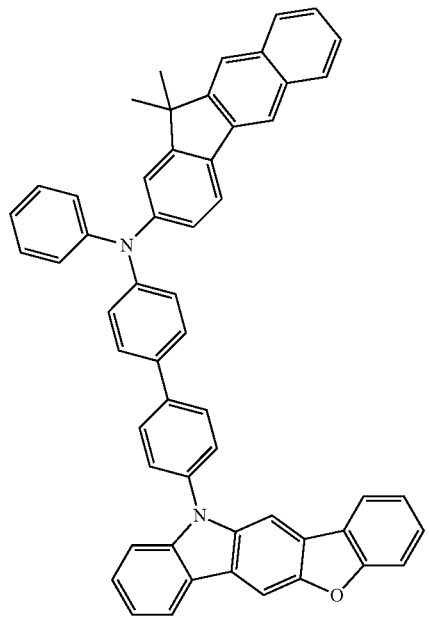
H1-80
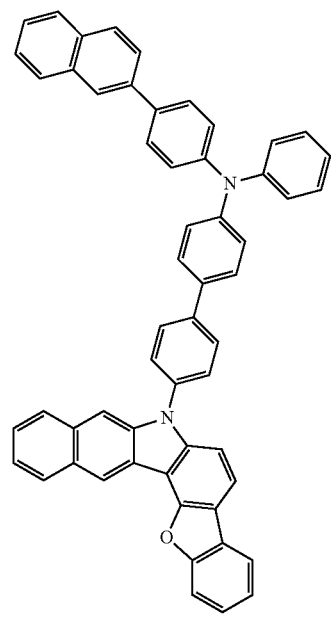
H1-82
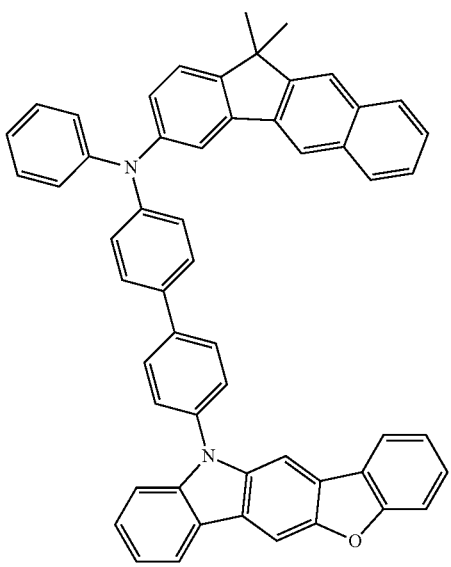

-continued
H1-83
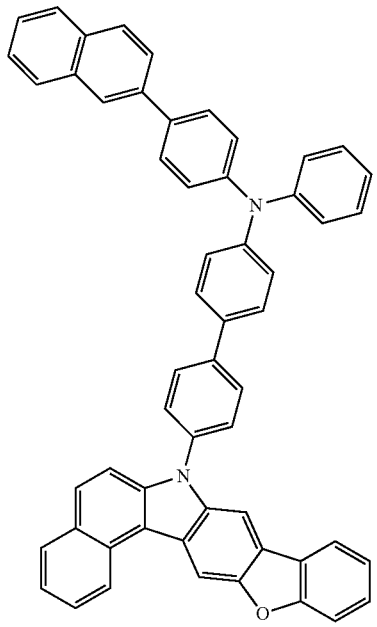
H1-84
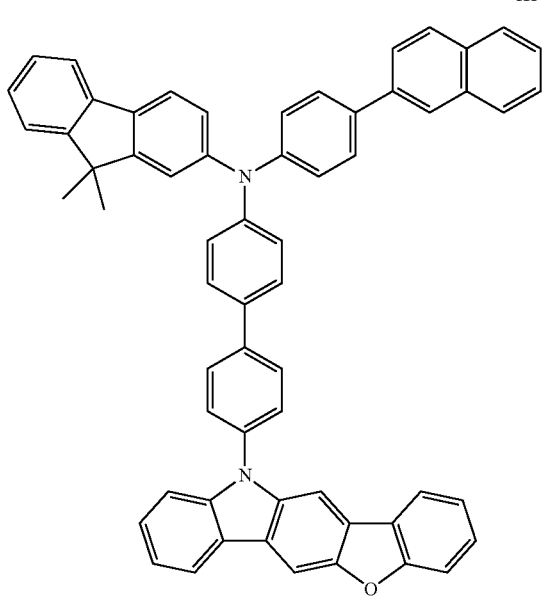
H1-85
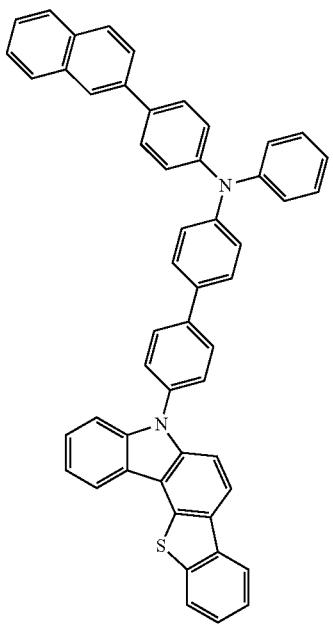
H1-86
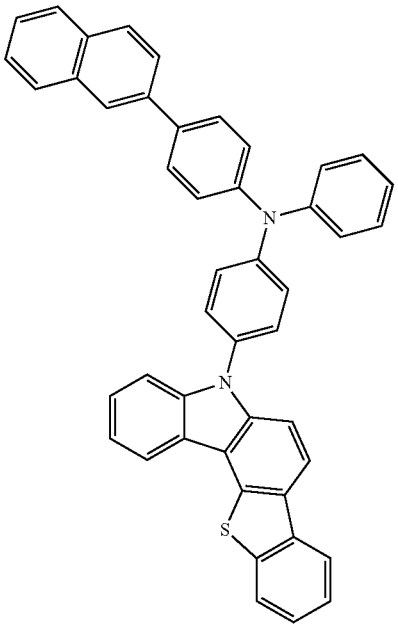

H1-87
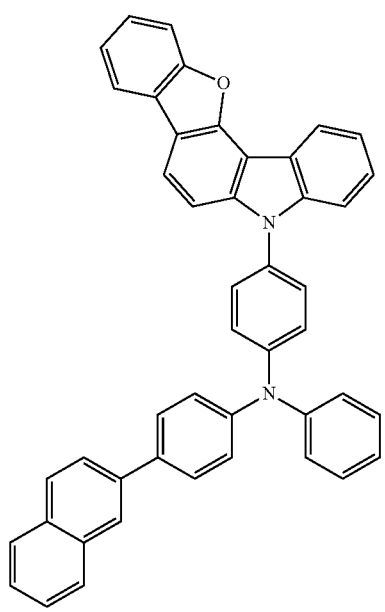
H1-89
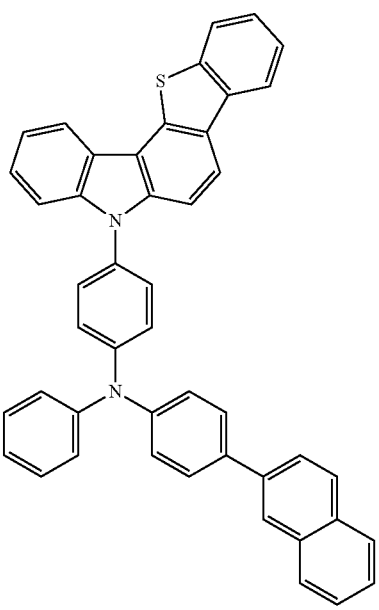
H1-88
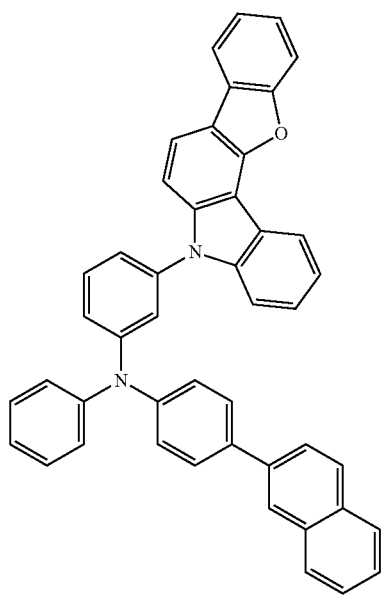
H1-90
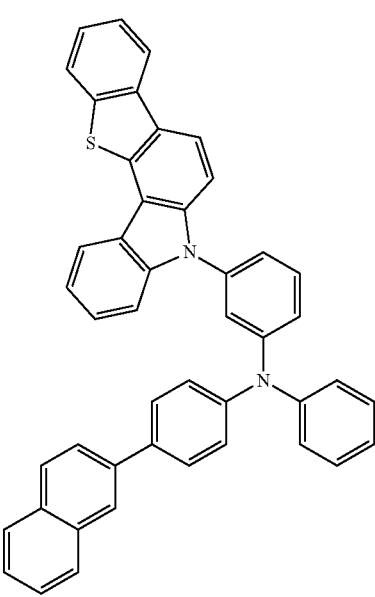

H1-91
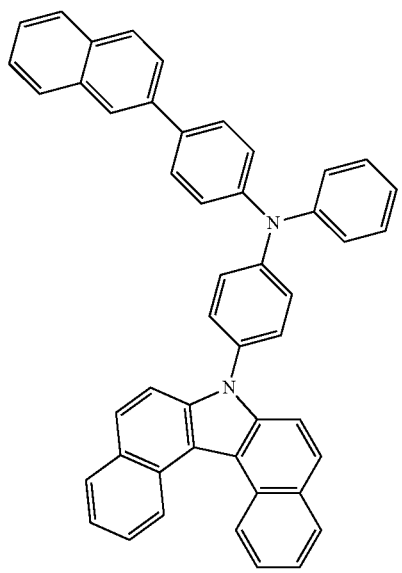
H1-93
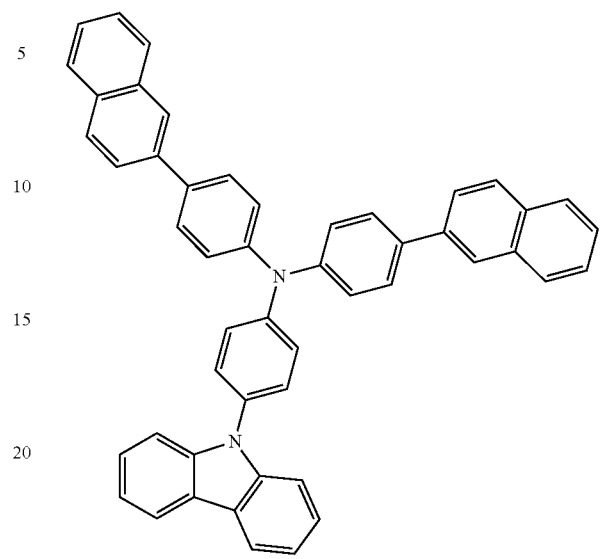
H1-94
H1-92
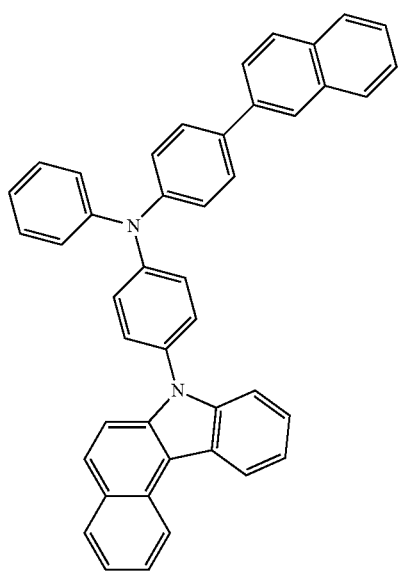
7. The organic electroluminescent device according to claim 1, wherein the compound represented by formula 2 is selected from the group consisting of:

C-1
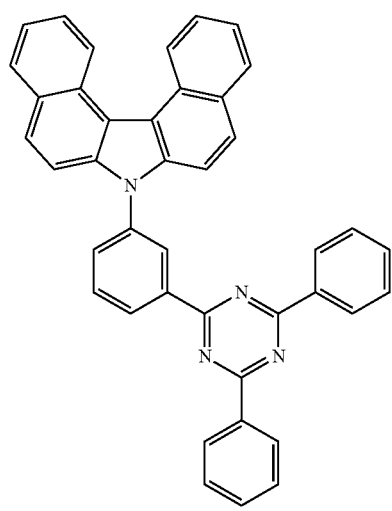
C-2
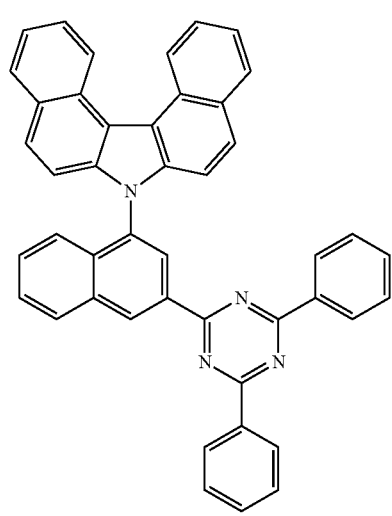
C-3
C-4
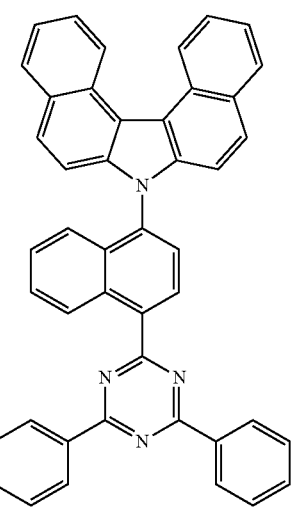
C-5
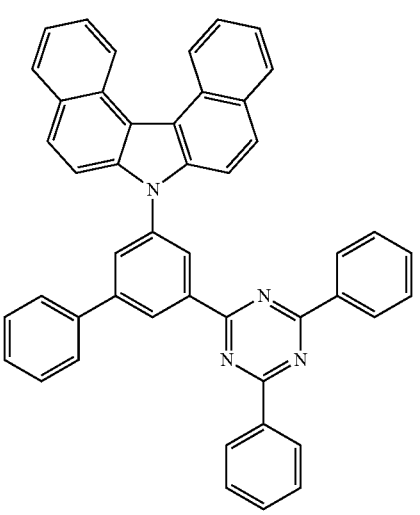
C-6
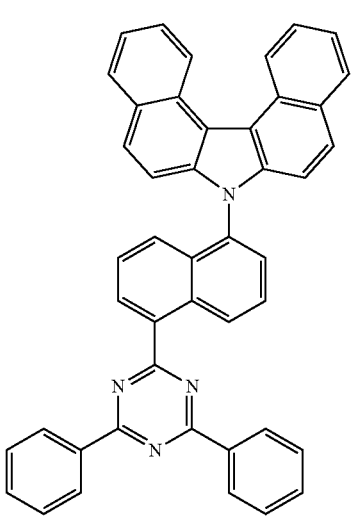

C-7
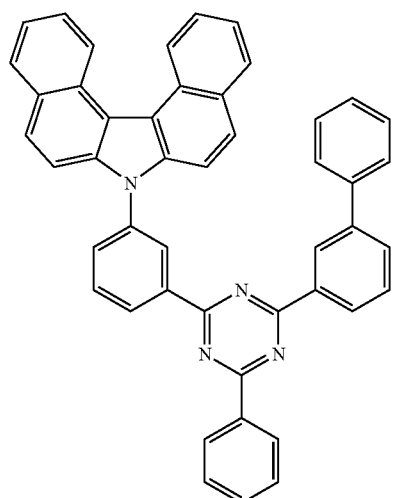
C-8
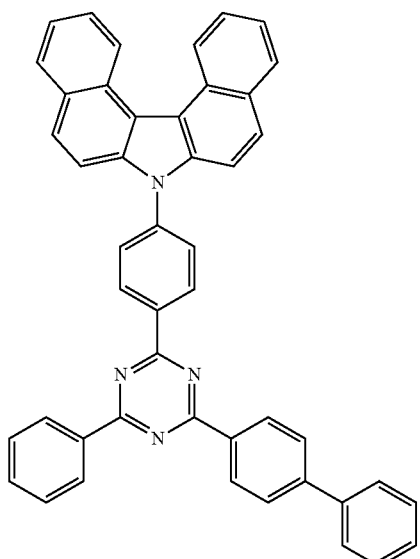
C-9
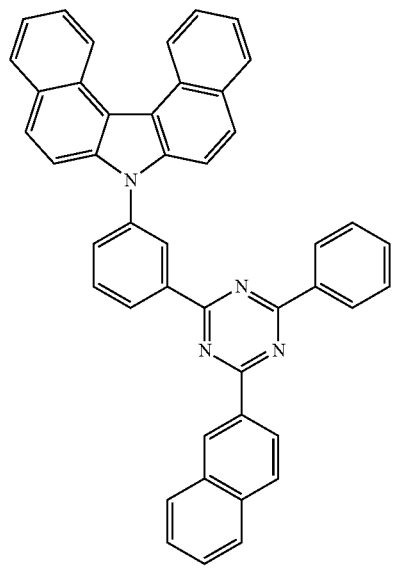
C-10
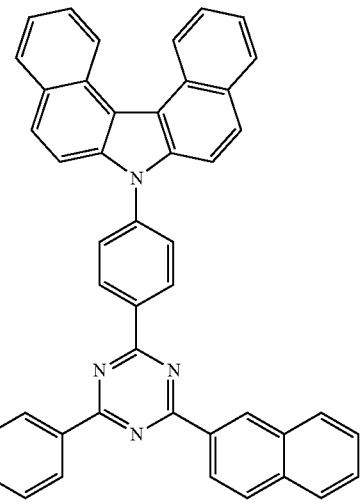
C-11
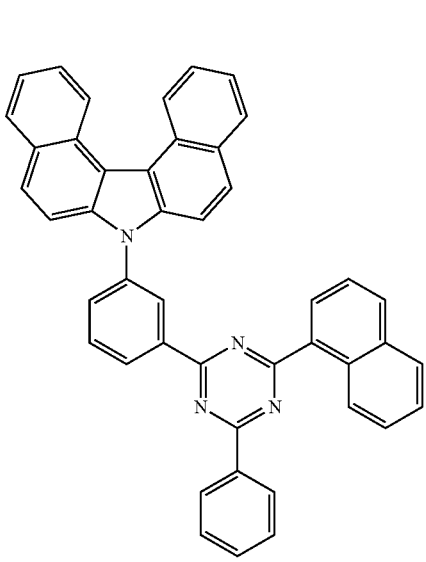
C-12
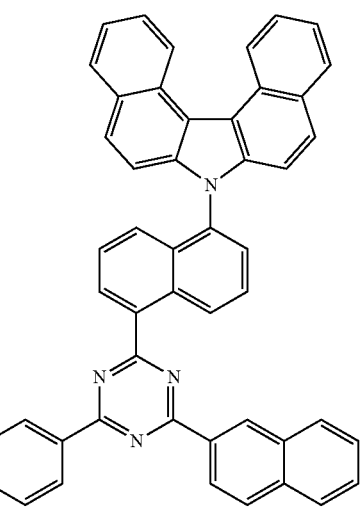

C-13
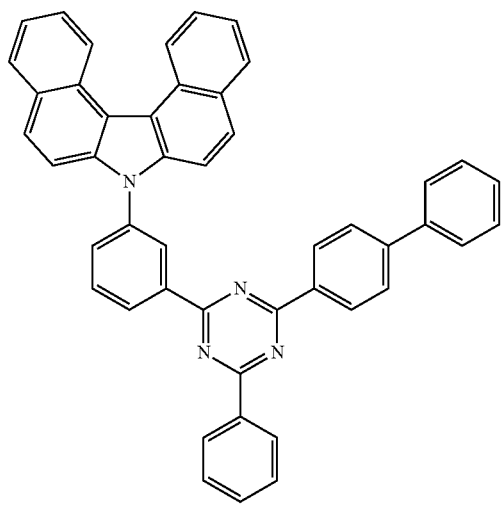
C-14
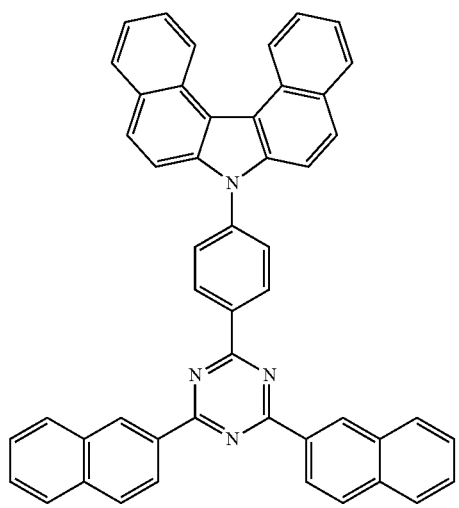
C-15
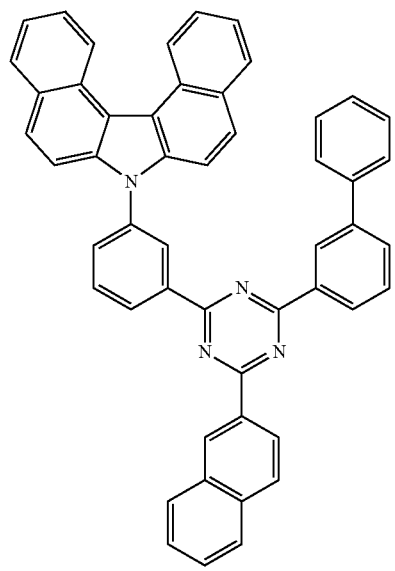
C-16
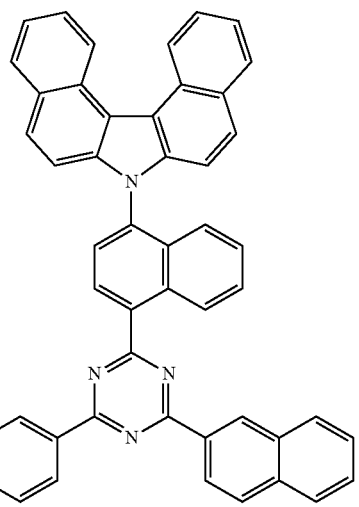
C-17
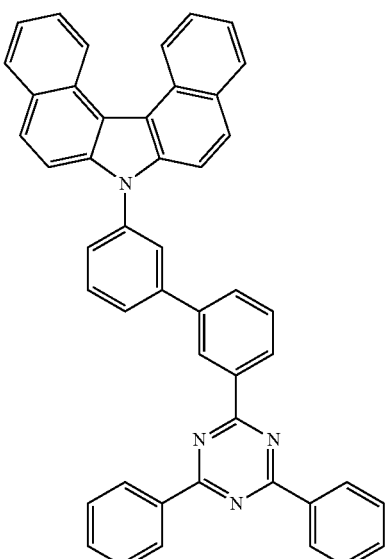
C-18
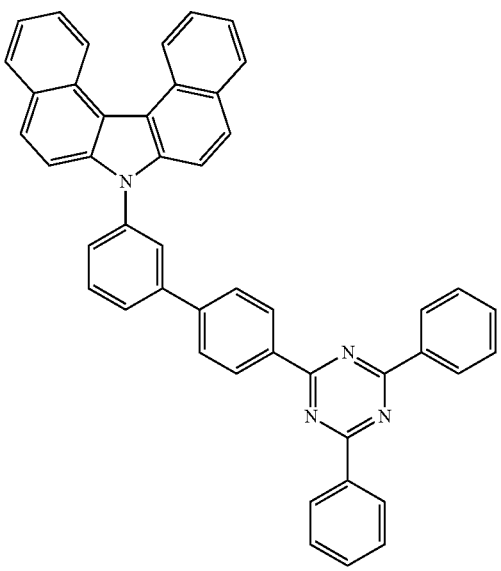

-continued
C-19
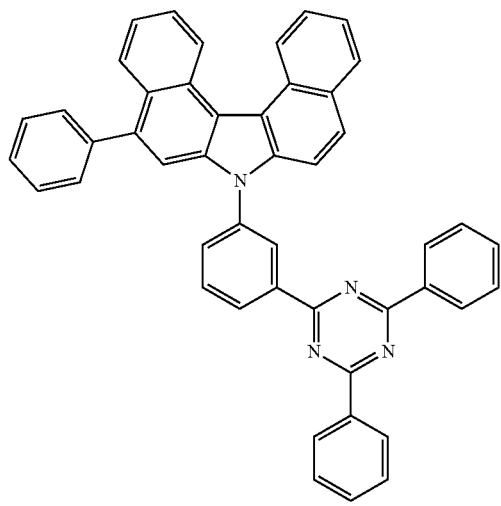
C-20
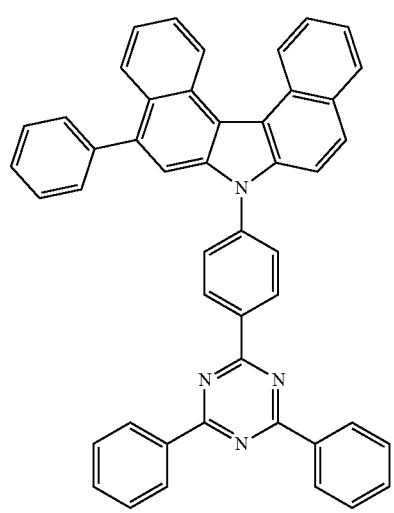
C-21
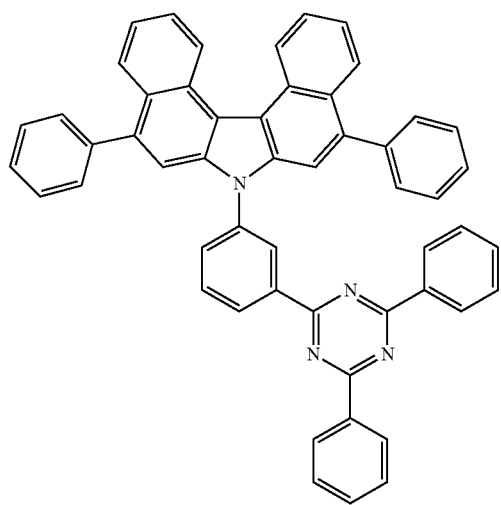
-continued
C-22
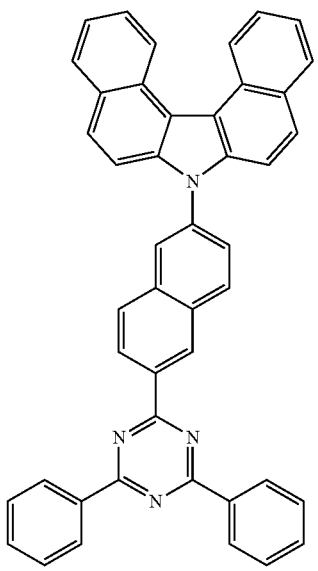
C-23
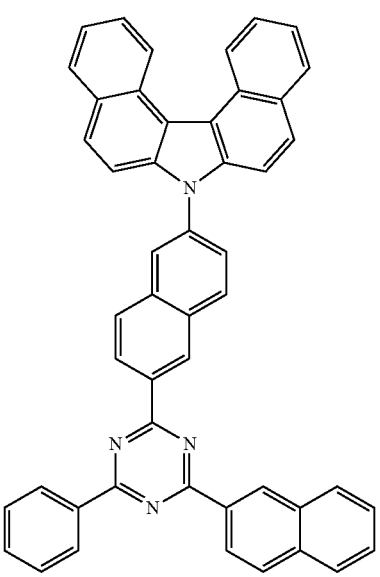
C-24
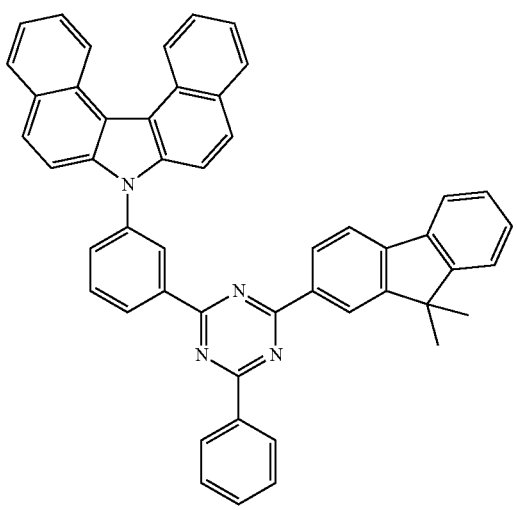

C-25
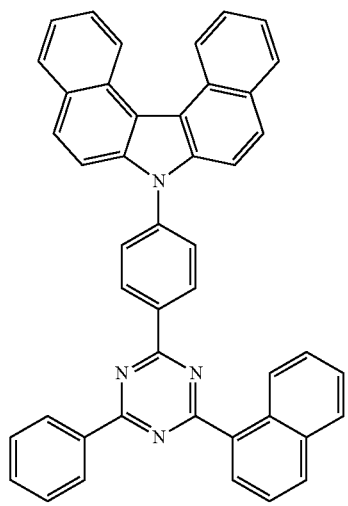
C-26
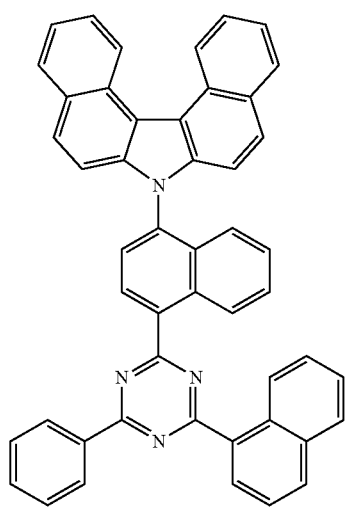
C-27
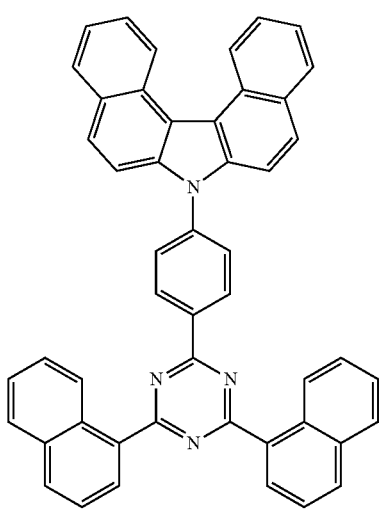
C-28
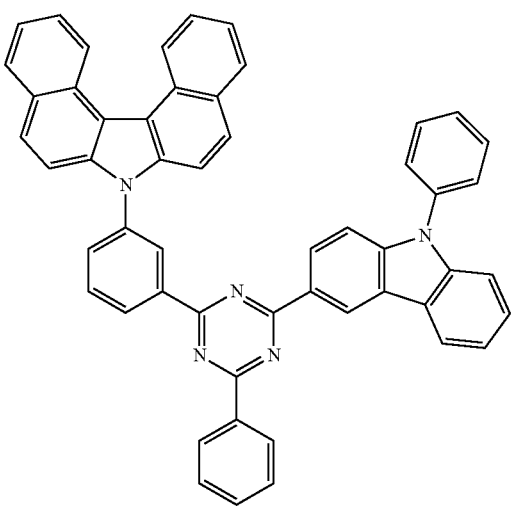
C-29
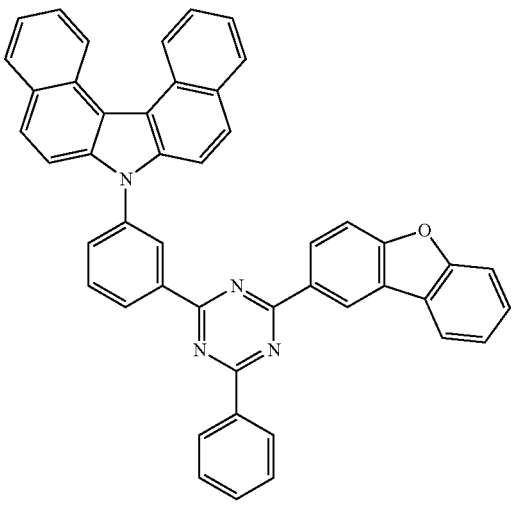
C-30
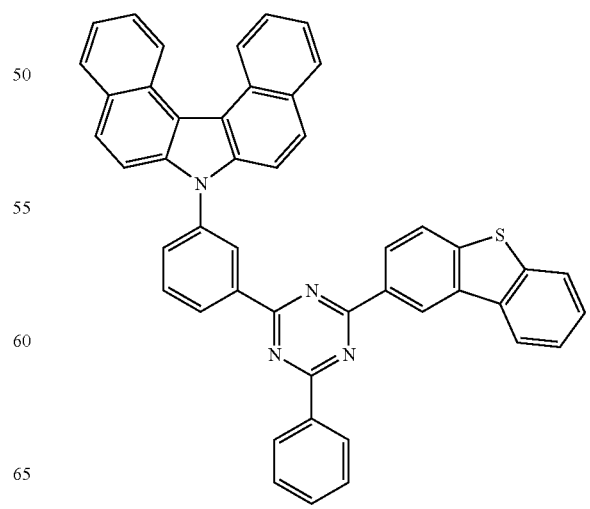

C-31
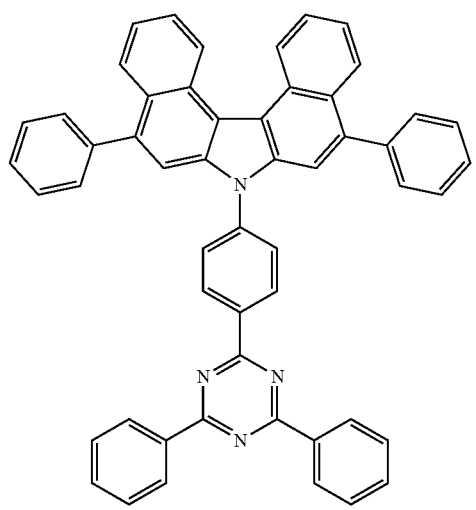
C-32
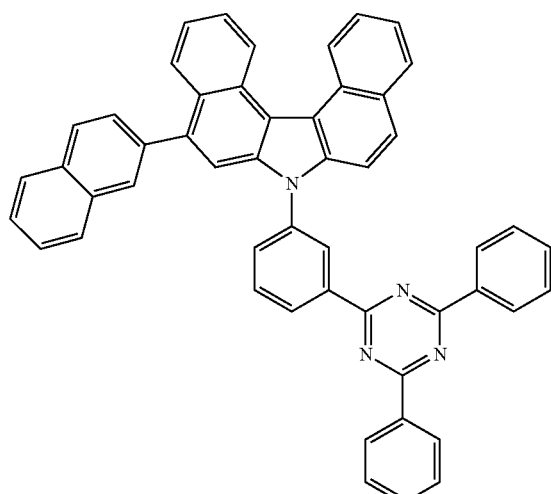
C-33
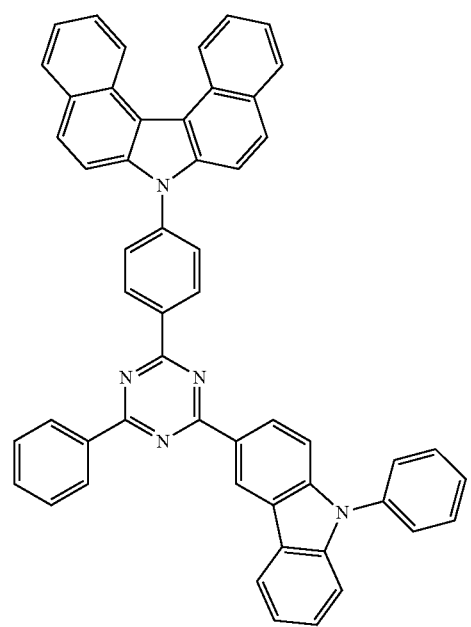
C-34
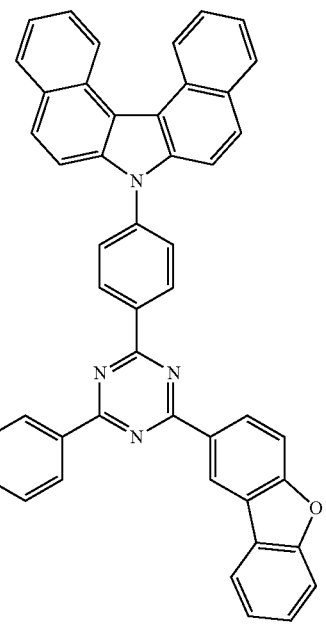
C-35
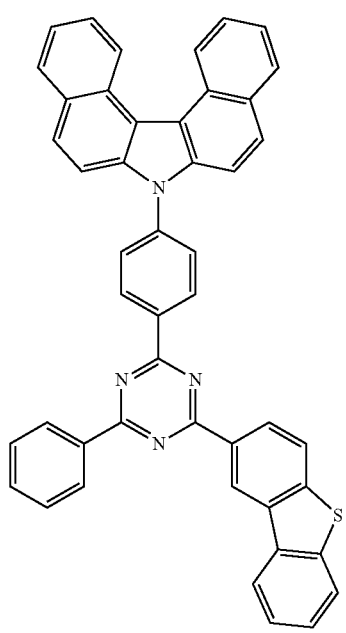

C-36
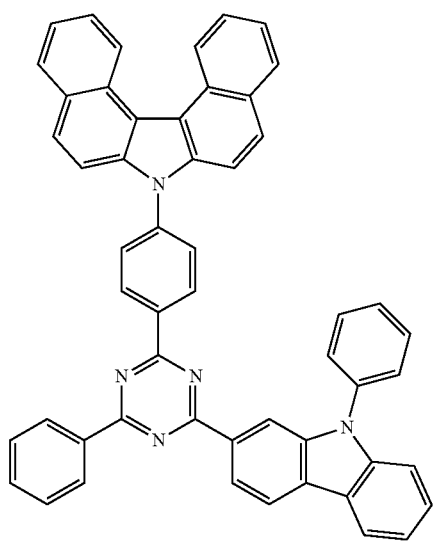
C-37
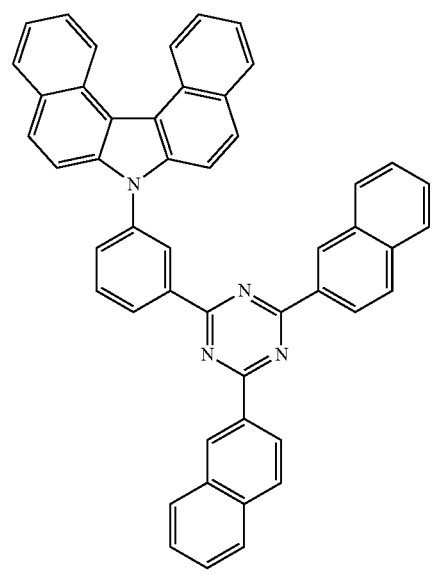
C-38
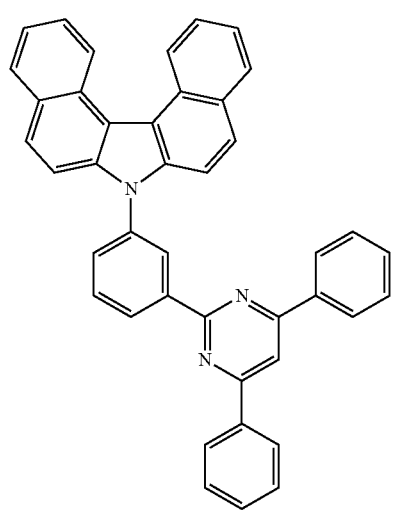
C-39
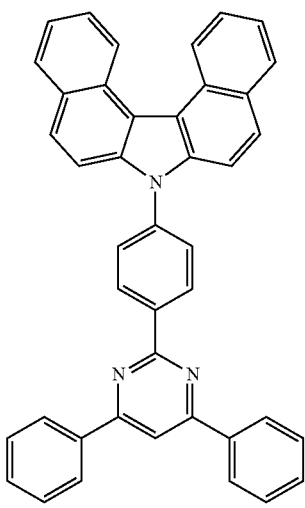
C-40
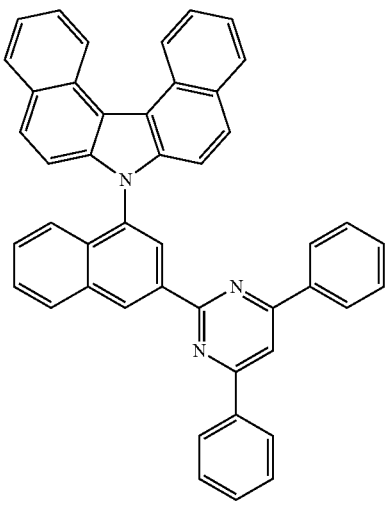
C-41
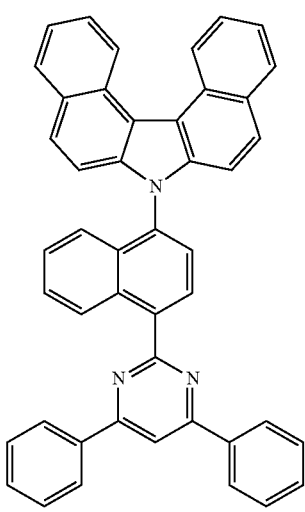

-continued
C-42
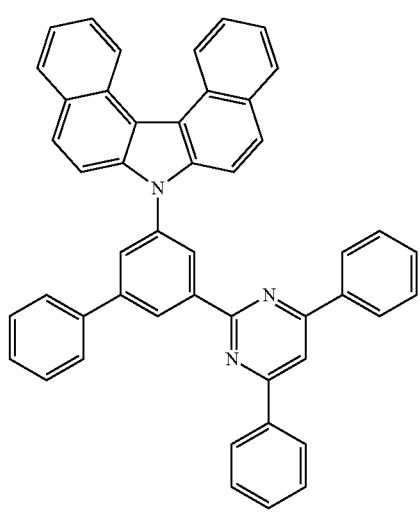
C-43
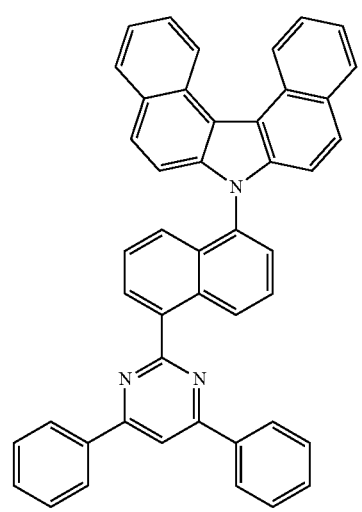
C-44
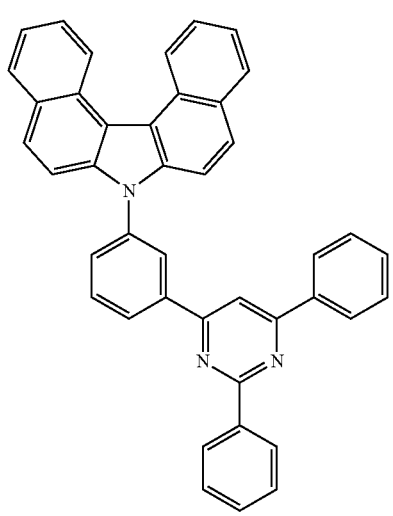
C-45
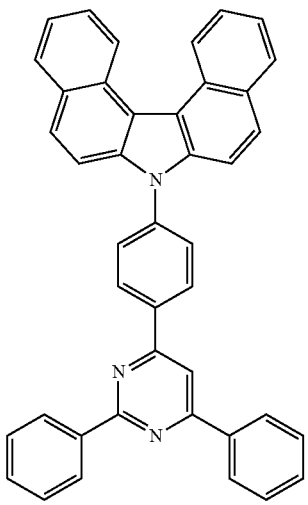
C-46
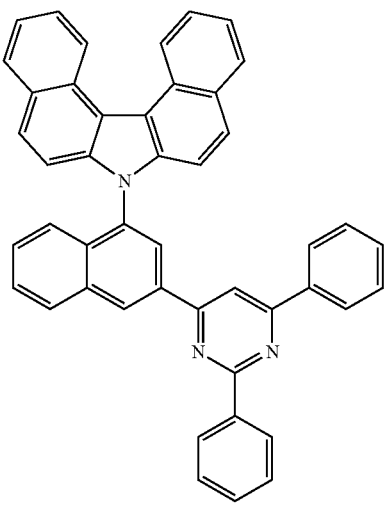
C-47
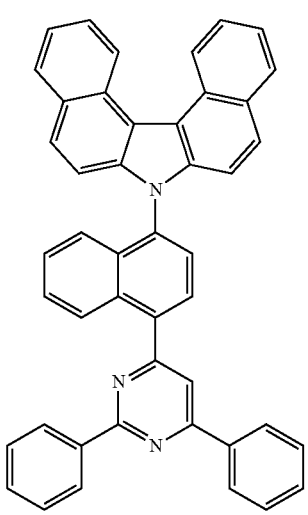

C-48
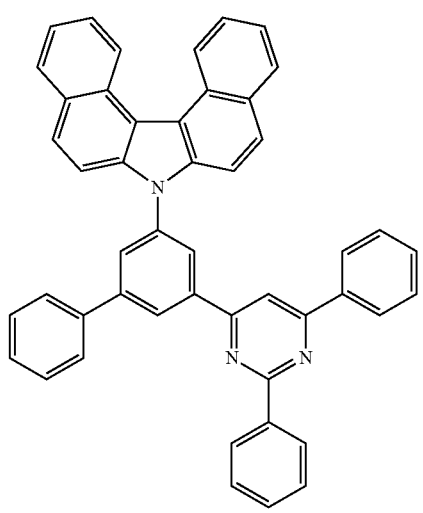
C-49
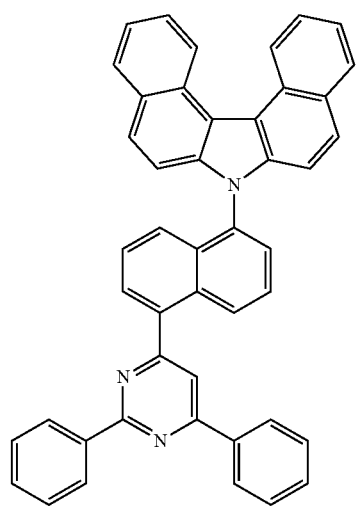
C-50
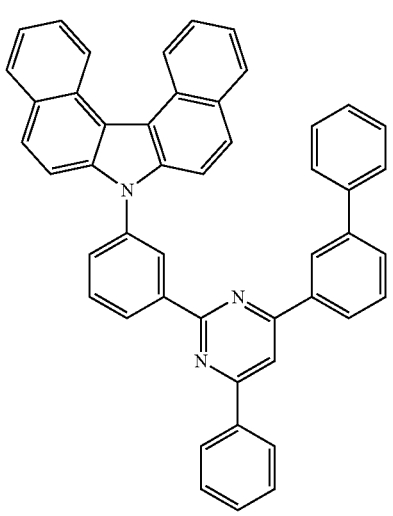
C-51
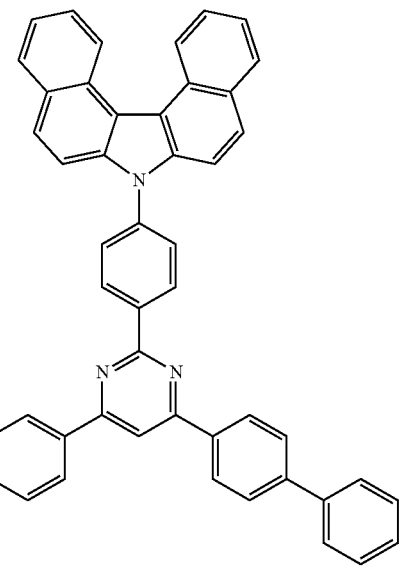
C-52
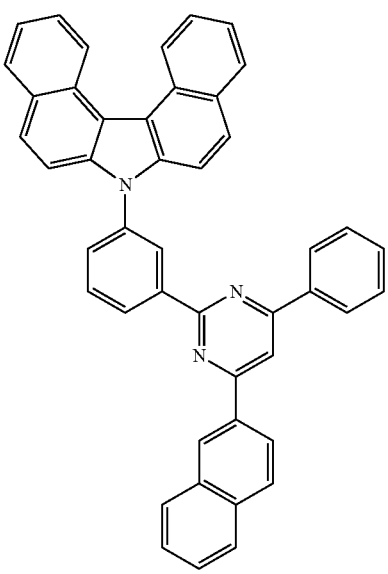
C-53
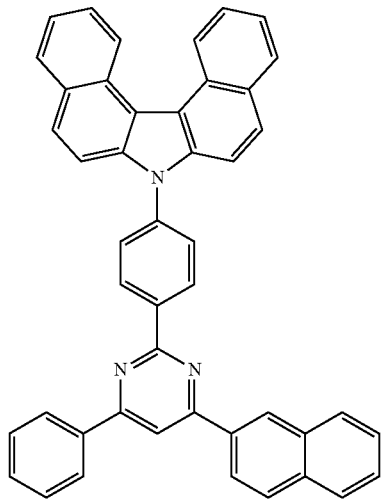

C-54
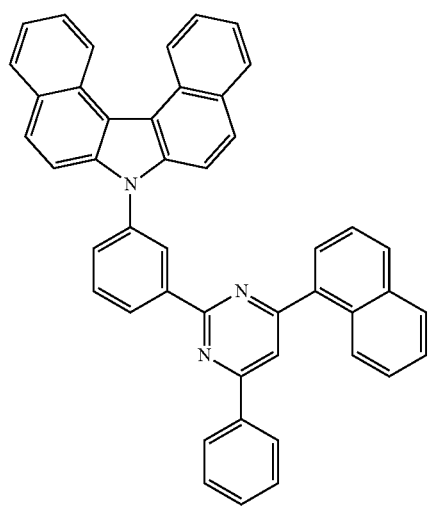
C-57
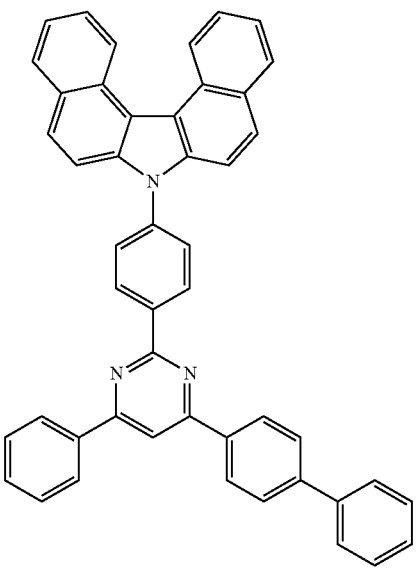
C-55
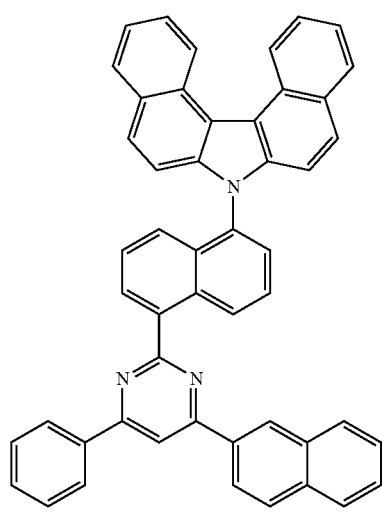
C-58
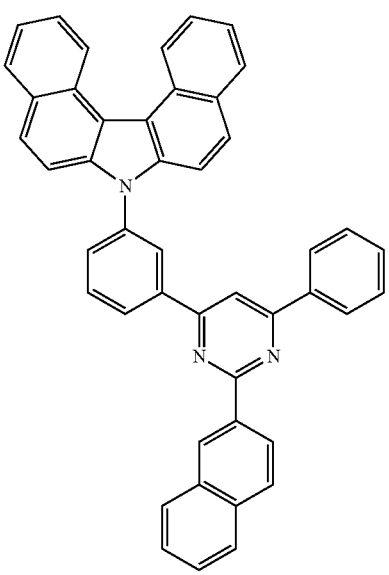
C-56
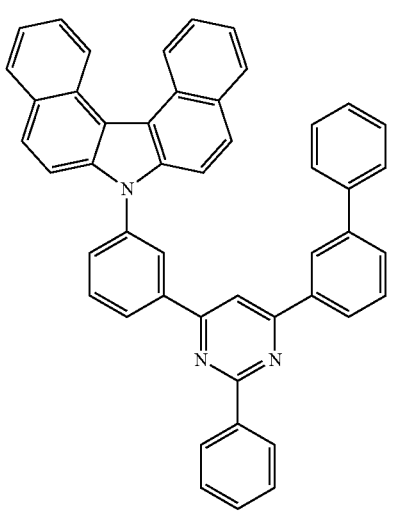
C-59
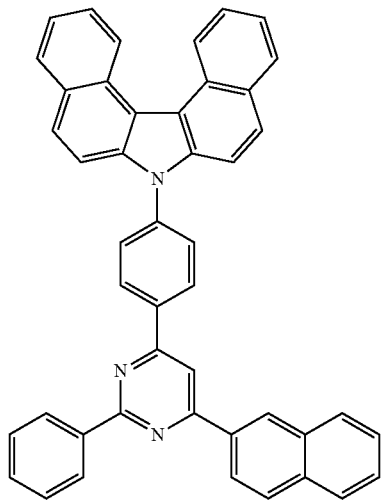

C-60
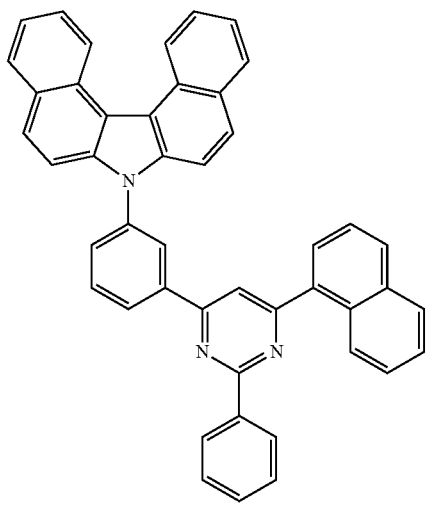
C-61
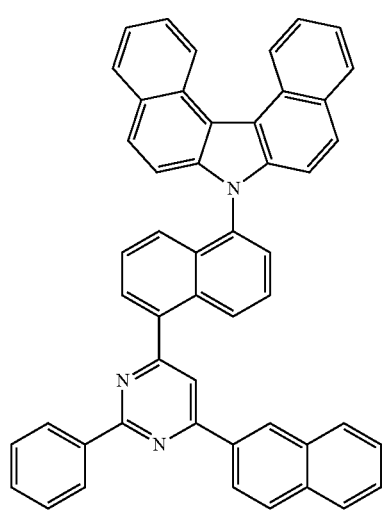
C-62
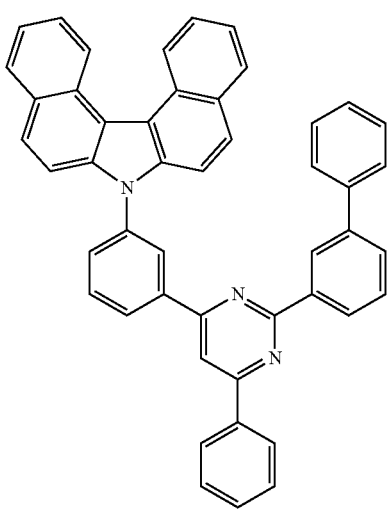
C-63
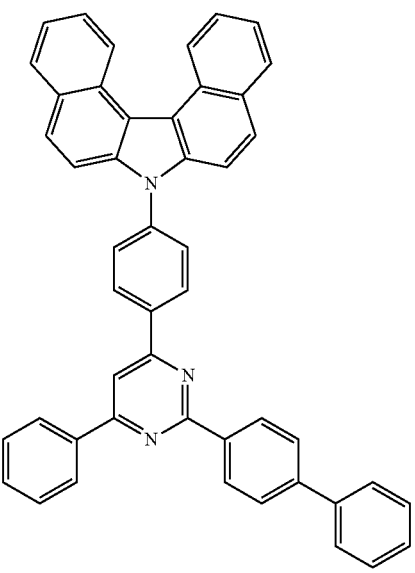
C-64
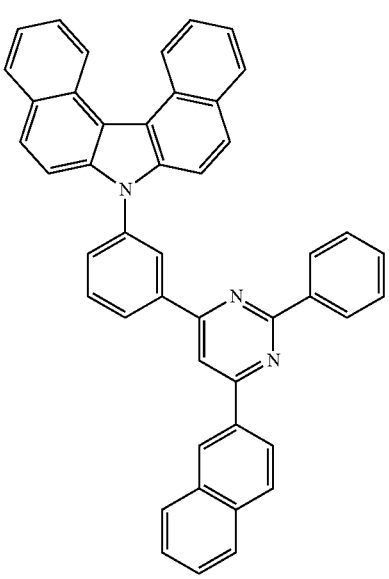
C-65
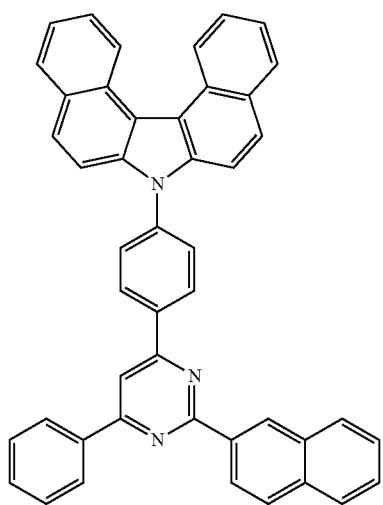

-continued
C-66
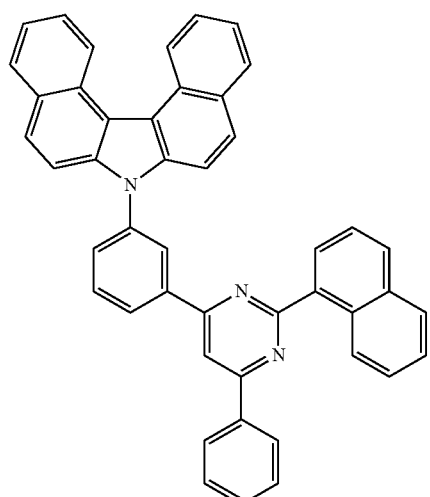
C-67
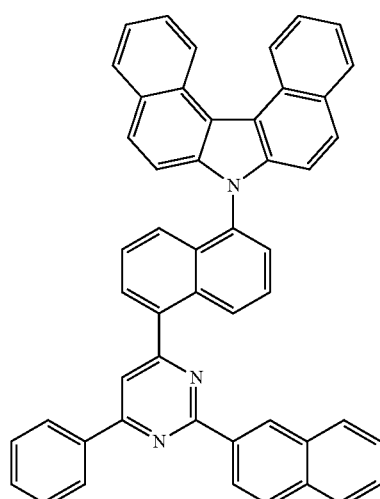
C-68
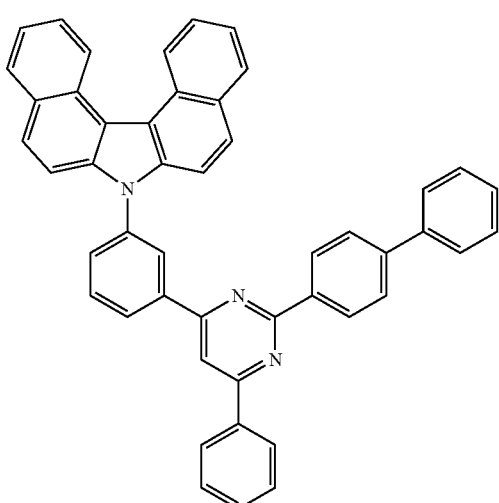
-continued
C-69
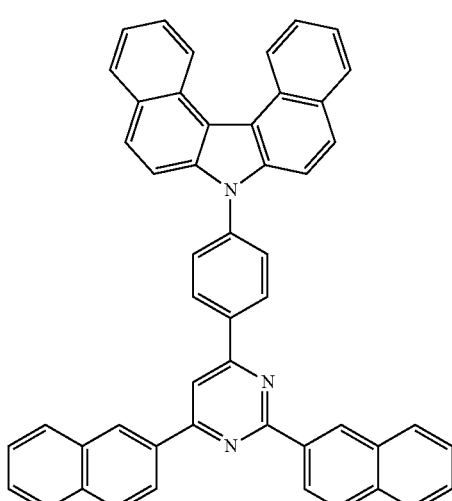
C-70
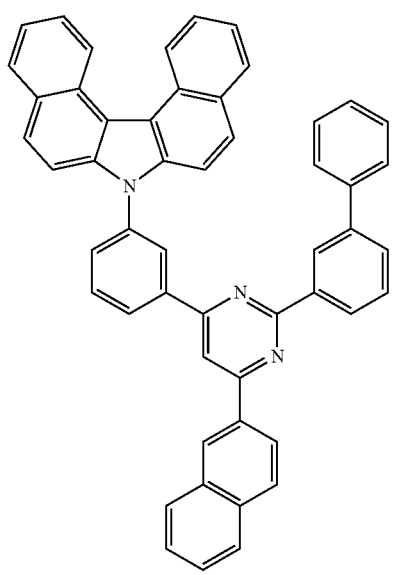
C-71
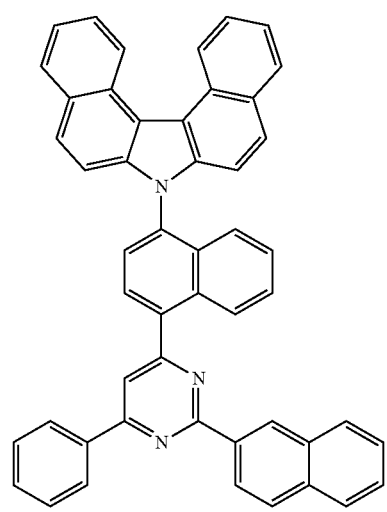

-continued
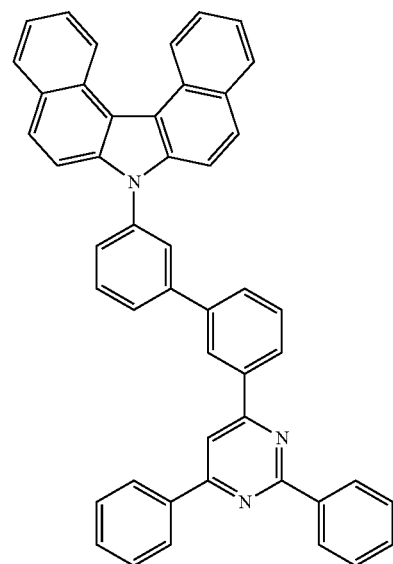
C-72
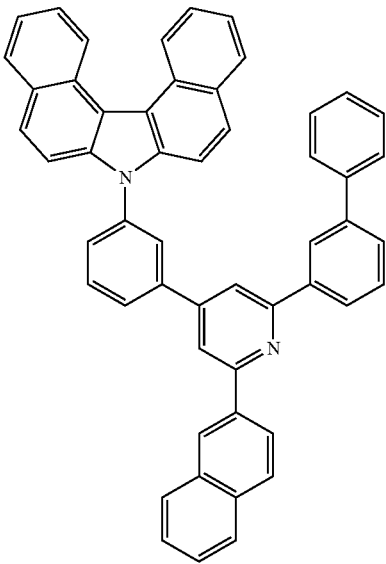
C-75
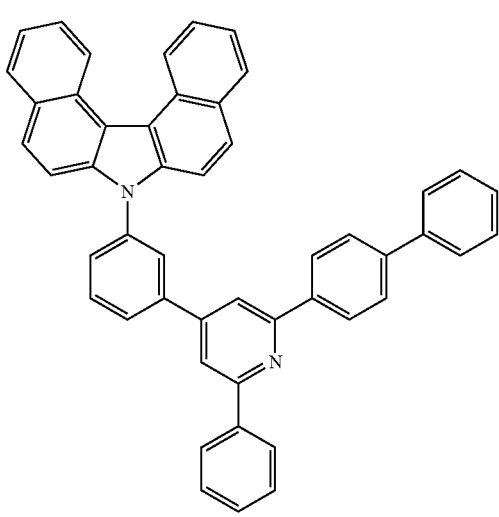
C-73
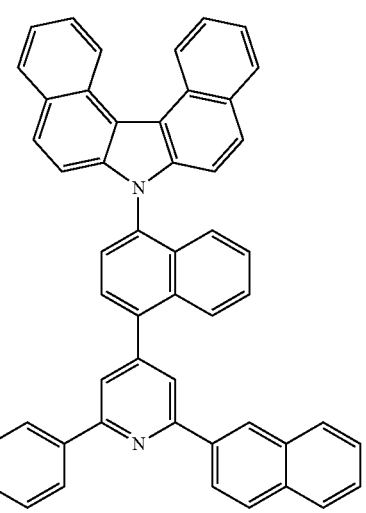
C-76
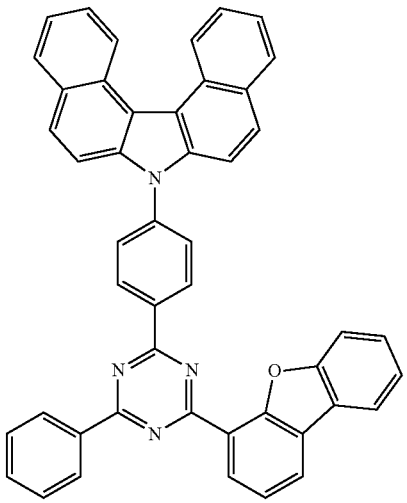
C-74
C-77

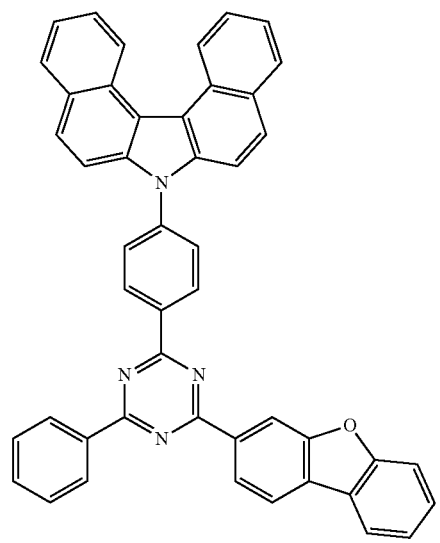
C-78
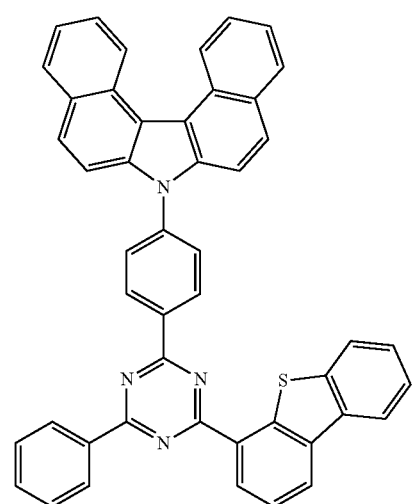
C-79
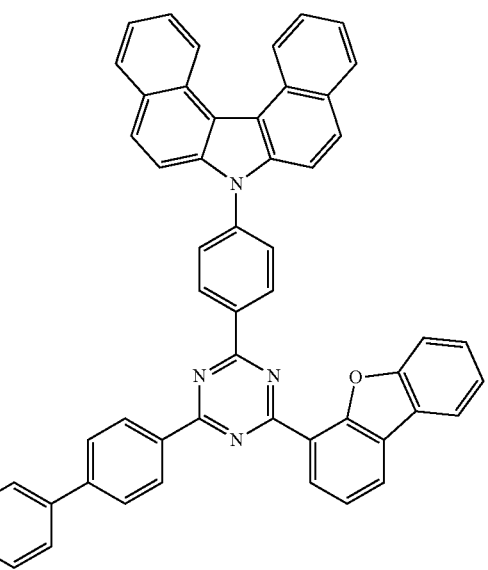
C-80
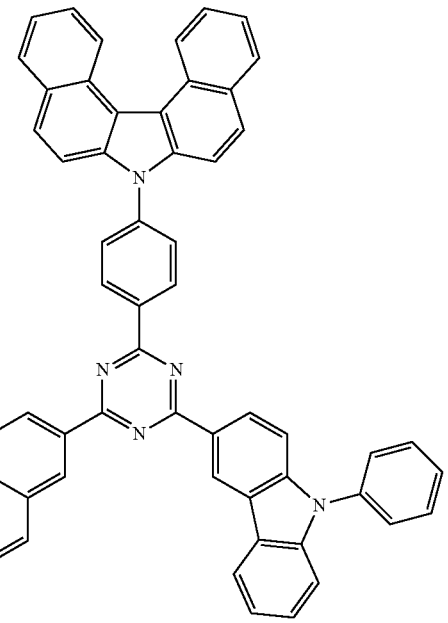
C-81
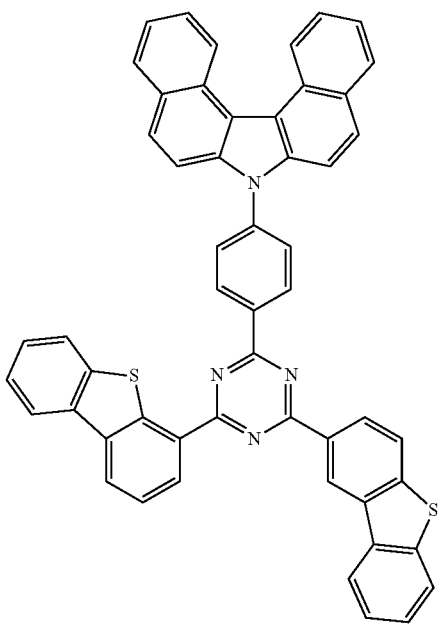
C-82

C-83
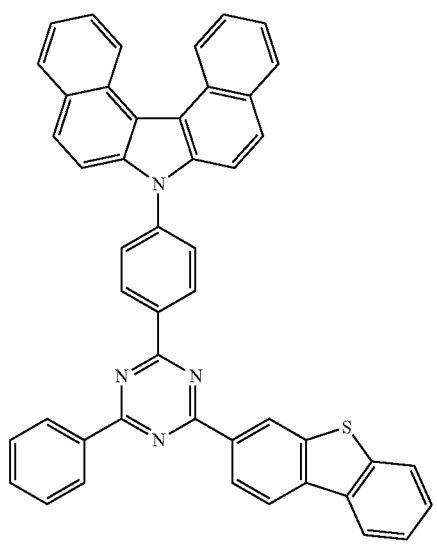
C-84
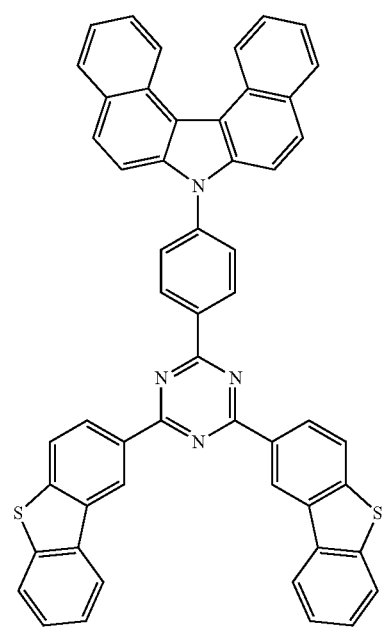
C-85
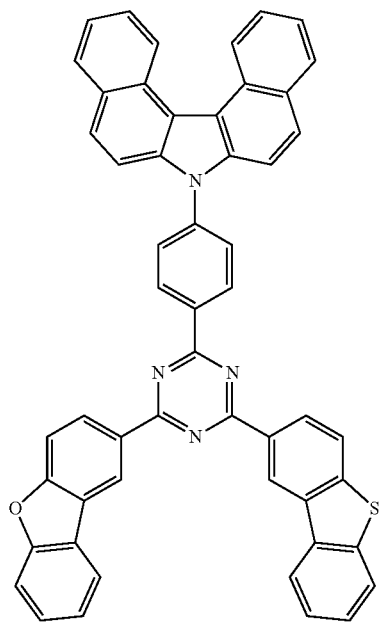
C-86
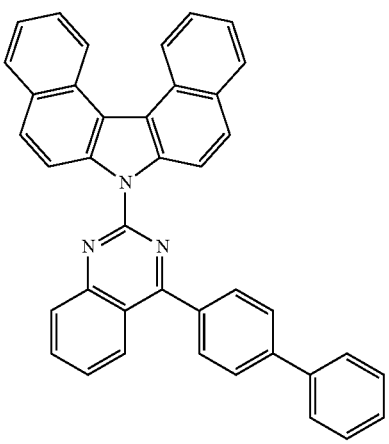
C-87
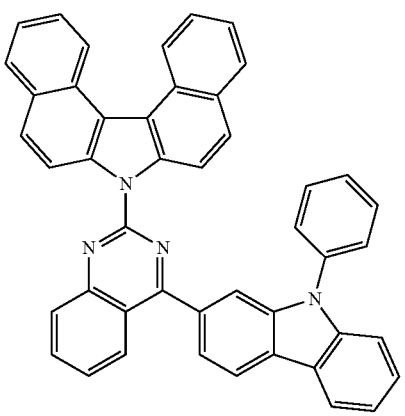

B-88
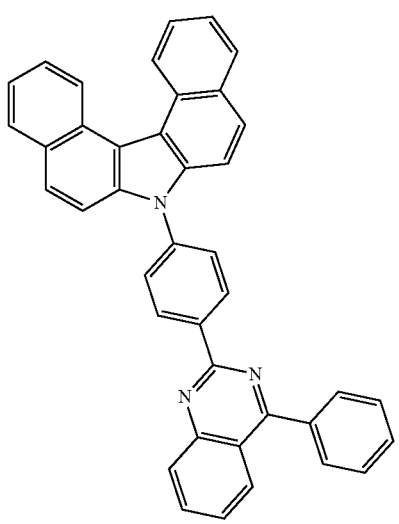
C-89
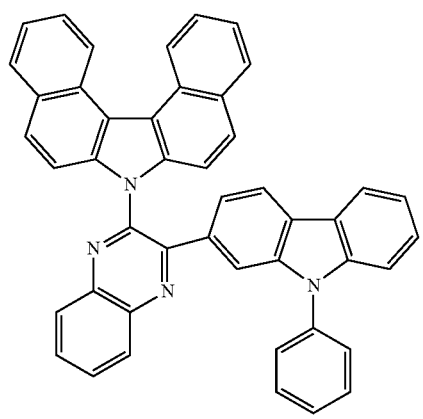
C-90
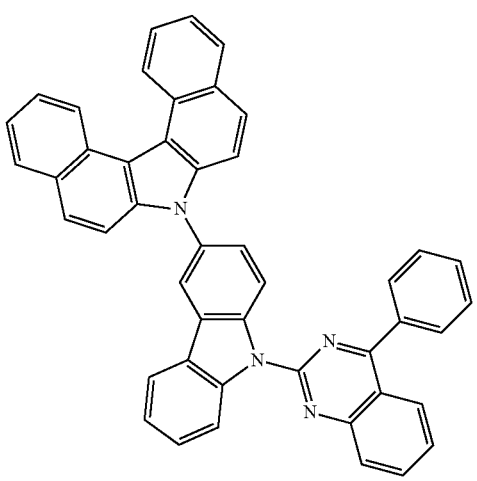
C-91
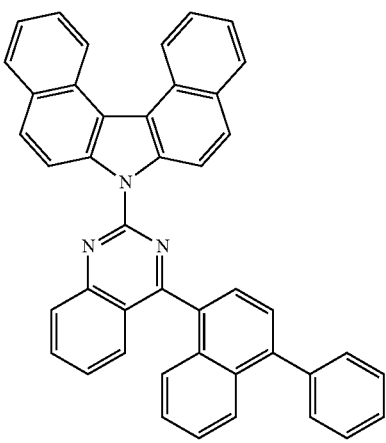
C-92
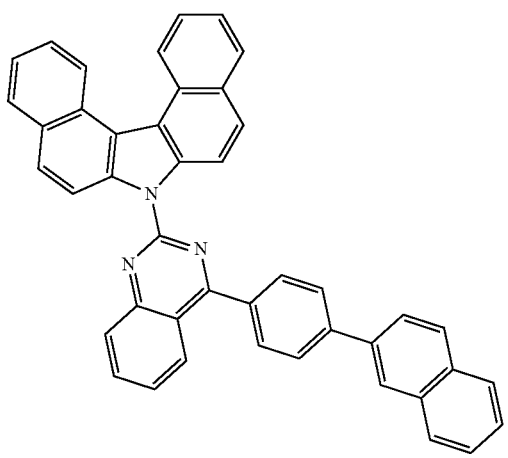
C-93
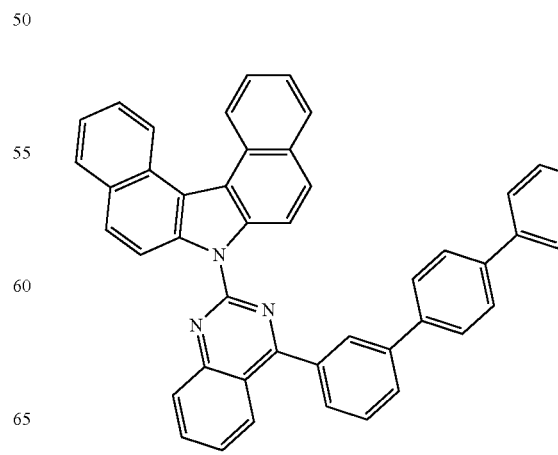

C-94
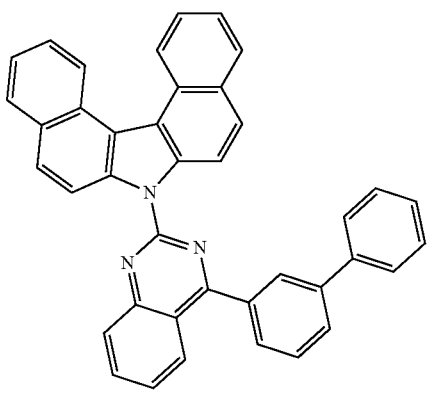
C-95
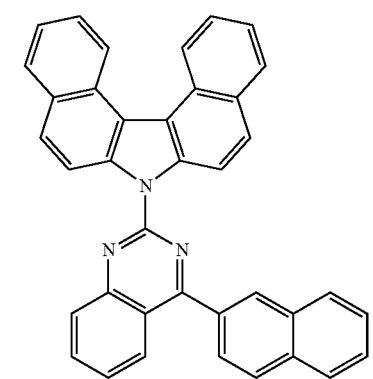
C-96
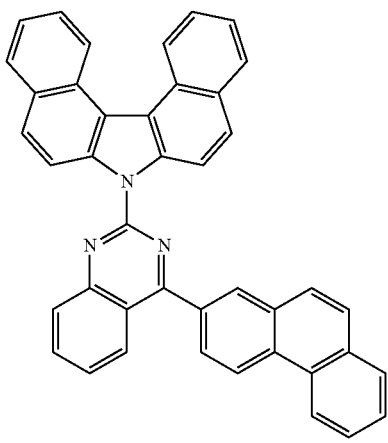
C-97
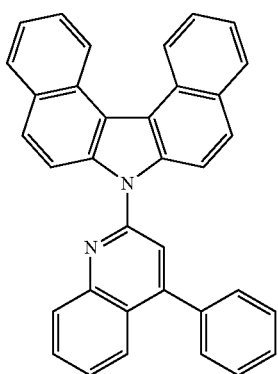
C-98
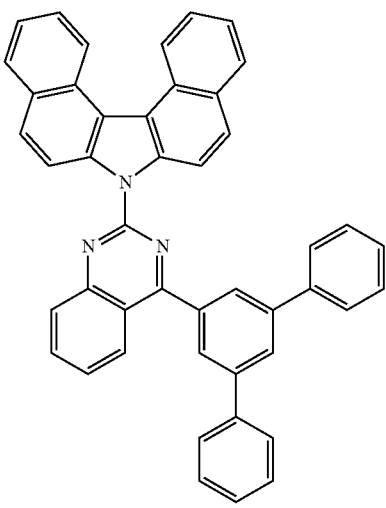
C-99
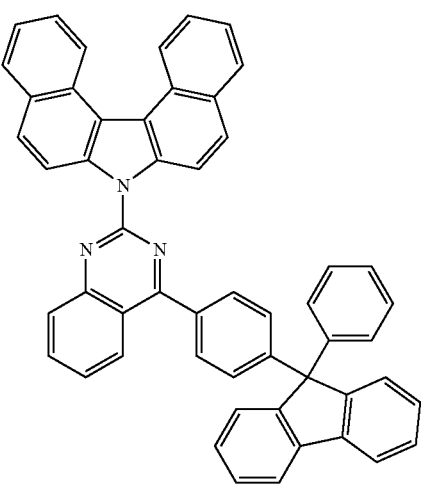
C-100
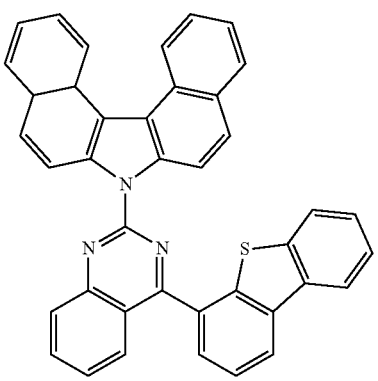

C-101
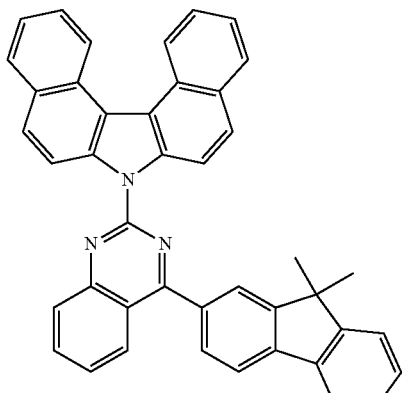
C-102
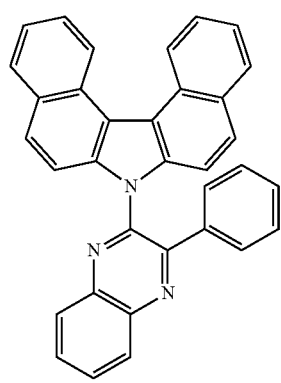
C-103
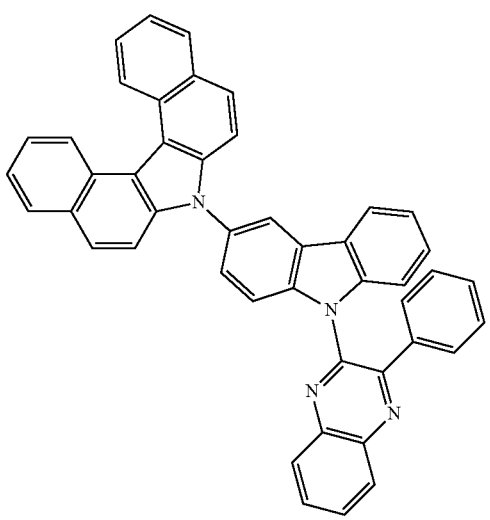
C-104
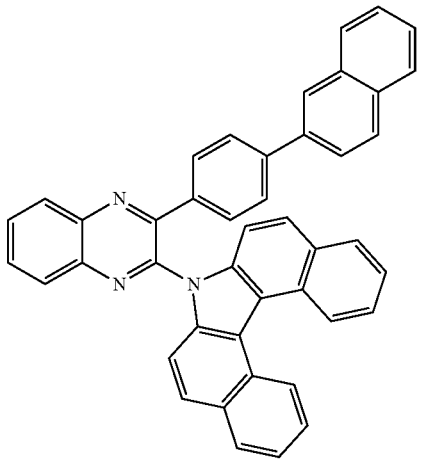
C-105
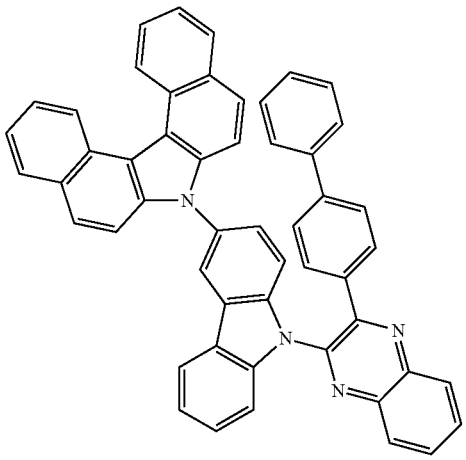
C-106
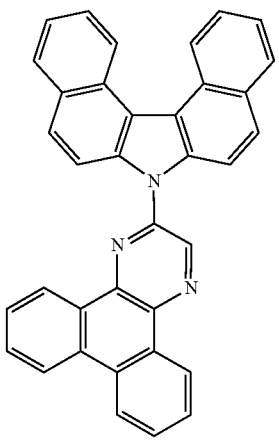

C-107
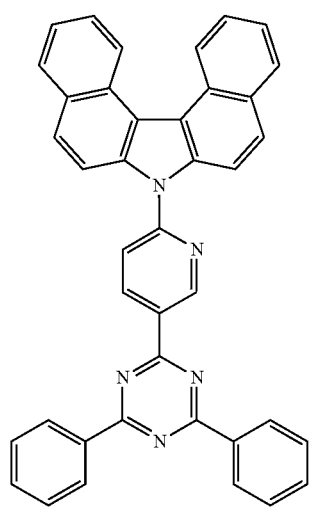
C-108
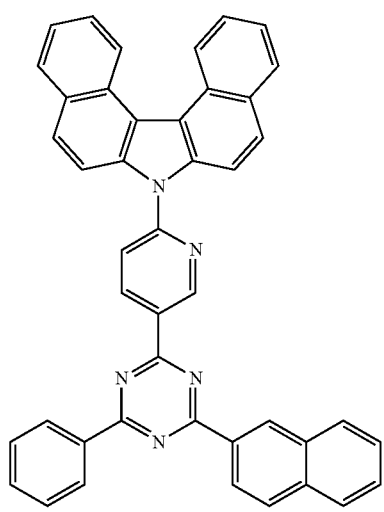
C-109
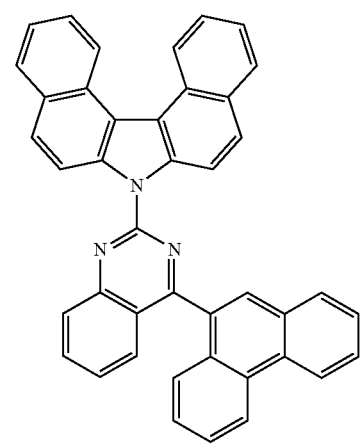
C-110
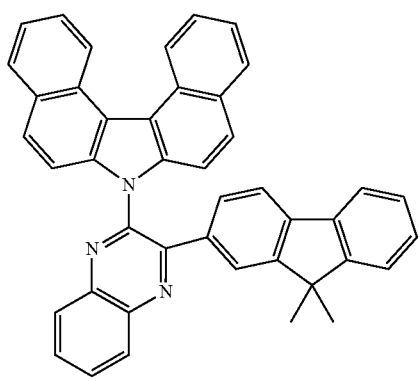
C-112
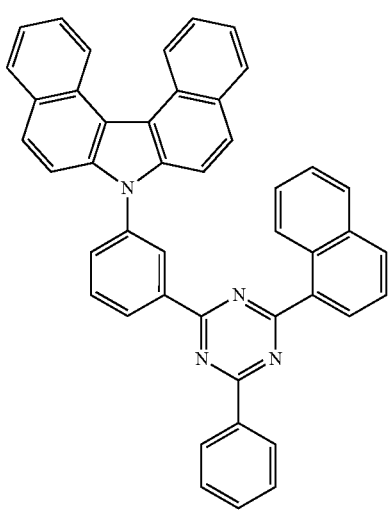
C-113
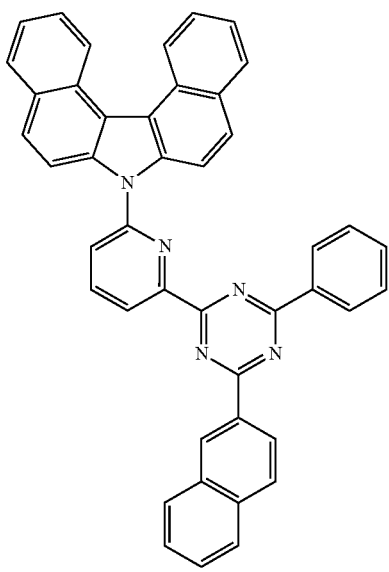

-continued
C-114
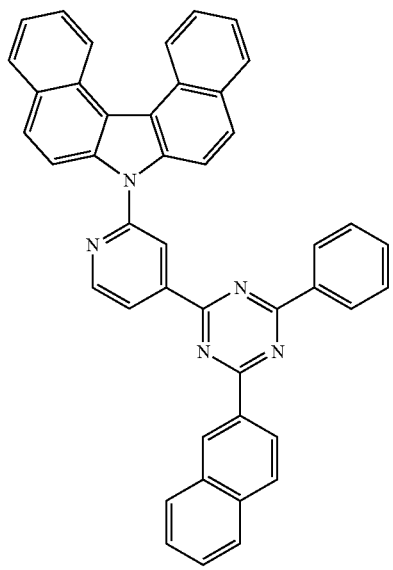
C-115
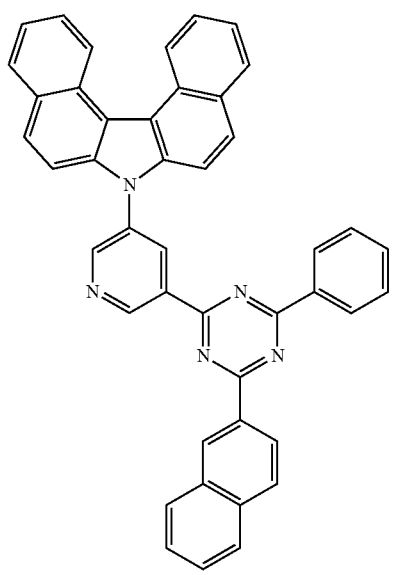
C-116
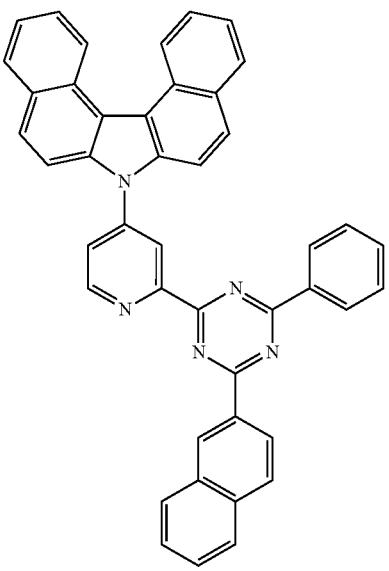
C-117
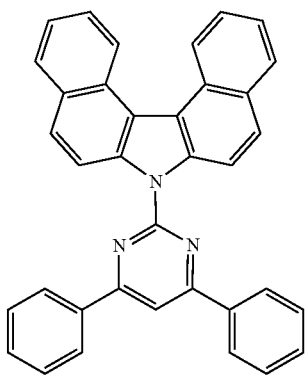
* * * * *